US009653161B2

(12) United States Patent
Yoshimoto et al.

(10) Patent No.: US 9,653,161 B2
(45) Date of Patent: *May 16, 2017

(54) TAMPER-RESISTANT NON-VOLATILE MEMORY DEVICE COMPRISING AN ARITHMETIC CIRCUIT THAT, IN OPERATION, CALCULATES A BINARY REFERENCE VALUE BASED ON AT LEAST A PART OF THE PIECES OF RESISTANCE VALUE INFORMATION, A READ CIRCUIT THAT, IN OPERATION, SELECTIVELY ASSIGNS, BASED ON THE BINARY REFERENCE VALUE, ONE OF TWO VALUES TO EACH OF THE PIECES OF RESISTANCE VALUE INFORMATION, AND A WRITE CIRCUIT THAT, IN OPERATION, PERFORMS A WRITE OPERATION CORRESPONDING TO ONE OF THE TWO VALUES AMONG MEMORY CELLS

(71) Applicant: Panasonic Intellectual Property Management Co., Ltd., Osaka (JP)

(72) Inventors: Yuhei Yoshimoto, Hyogo (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/938,755

(22) Filed: Nov. 11, 2015

(65) Prior Publication Data
US 2016/0148680 A1  May 26, 2016

(30) Foreign Application Priority Data

Nov. 21, 2014 (JP) ................................. 2014-236708

(51) Int. Cl.
G11C 11/00 (2006.01)
G11C 13/00 (2006.01)
G11C 16/20 (2006.01)

(52) U.S. Cl.
CPC ........ *G11C 13/004* (2013.01); *G11C 13/0007* (2013.01); *G11C 13/0059* (2013.01);
(Continued)

(58) Field of Classification Search
CPC ............ G11C 13/0069; G11C 13/0004; G11C 13/0007
(Continued)

(56) References Cited

U.S. PATENT DOCUMENTS

2012/0044777 A1  2/2012  Fujiwara et al.
2013/0129083 A1  5/2013  Fujino
(Continued)

FOREIGN PATENT DOCUMENTS

JP  2012-043517  3/2012
JP  2013-545340  12/2013
(Continued)

OTHER PUBLICATIONS

Ogasahara et al., U.S. Appl. No. 14/711,785, filed May 14, 2015.
(Continued)

*Primary Examiner* — Connie Yoha
(74) *Attorney, Agent, or Firm* — McDermott Will & Emery LLP

(57) ABSTRACT

A non-volatile memory device includes a memory cell array including memory cells, each having a resistance value reversibly transitioning among resistance value ranges, a read circuit that, in operation, obtains pieces of resistance value information each relating to the resistance value of one of the memory cells, an arithmetic circuit that, in operation, calculates a binary reference value based on at least a part of
(Continued)

the pieces of resistance value information, and a write circuit. In operation, the read circuit selectively assigns, based on the binary reference value, one of two values to each of the pieces of resistance value information. In operation, the write circuit performs a first write operation on a memory cell corresponding to one of the two values among the memory cells.

13 Claims, 34 Drawing Sheets

(52) U.S. Cl.
 CPC .......... *G11C 13/0069* (2013.01); *G11C 16/20* (2013.01); *G11C 2013/0054* (2013.01); *G11C 2013/0073* (2013.01); *G11C 2013/0083* (2013.01)

(58) Field of Classification Search
 USPC ........................................ 365/148, 158, 163
 See application file for complete search history.

(56) References Cited

U.S. PATENT DOCUMENTS

| 2013/0194886 | A1 | 8/2013 | Schrijen et al. | |
|---|---|---|---|---|
| 2014/0278160 | A1* | 9/2014 | Wei | G11C 29/50 702/58 |
| 2015/0213890 | A1* | 7/2015 | Katoh | G06F 21/31 365/148 |
| 2015/0220457 | A1 | 8/2015 | Katoh et al. | |
| 2015/0227738 | A1 | 8/2015 | Katoh | |
| 2016/0148664 | A1* | 5/2016 | Katoh | G11C 13/0059 365/148 |
| 2016/0148679 | A1* | 5/2016 | Yoshimoto | G11C 13/004 365/148 |

FOREIGN PATENT DOCUMENTS

| WO | 2012/014291 | 2/2012 |
|---|---|---|
| WO | 2014/119327 | 8/2014 |
| WO | 2014/132662 | 9/2014 |
| WO | 2014/132664 | 9/2014 |

OTHER PUBLICATIONS

Sanu K. Mathew et al., "A 0.19pJ/b PVT-Variation-Tolerant Hybrid Physically Unclonable Function Circuit for 100% Stable Secure Key Generation in 22nm CMOS" IEEE (ISSCC) Dig. of Tech. Papers, pp. 278-280, 2014.

"Development and Evaluation of Tamper-Resistant Dependable VLSI Systems" by Takeshi Fujino in "Dependable VLSI System Basic Technologies", CREST 2009 Research Theme, 2012 Annual Report.

Ritsumeikan University, National Institute of Advanced Industrial Science and Technology, Meijo University, Mitsubishi Electric, "Development and Evaluation of Dependable VLSI System for Tamper Resistance", Materials for Area Meeting, Jul. 2, 2011.

I. G. Baek et al., "Highly Scalable Non-volatile Resistive Memory using Simple Binary Oxide Driven by Asymmetric Unipolar Voltage Pulses" IEEE, IEDM pp. 587-590, 2004.

* cited by examiner

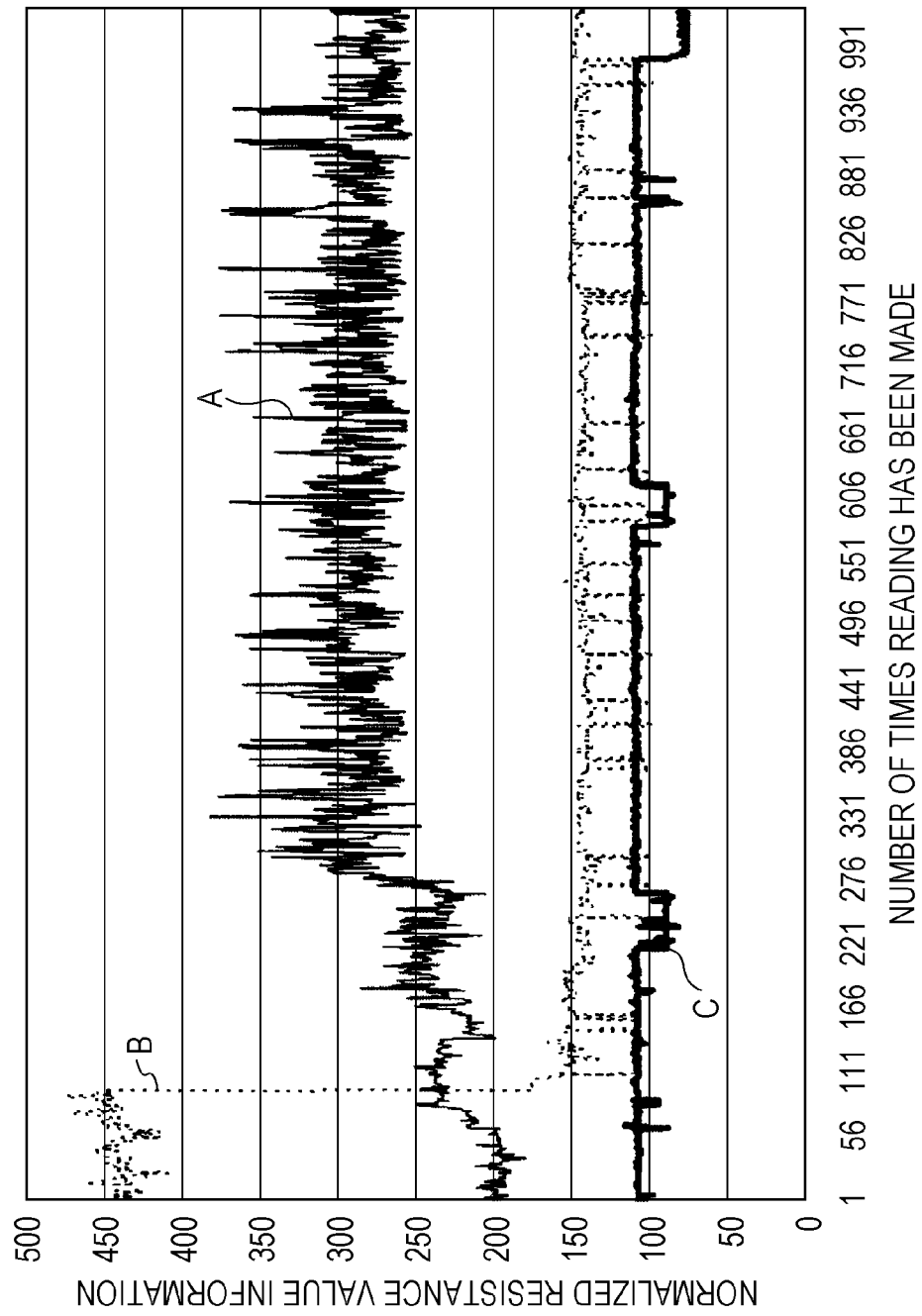

FIG. 15

| 1 | 1 | 1 | 1 | 0 | 0 | 1 | 1 | 1 | 0 | 1 | 1 | 1 | 1 | 1 | 1 |
|---|---|---|---|---|---|---|---|---|---|---|---|---|---|---|---|
| 1 | 1 | 0 | 1 | 0 | 0 | 1 | 1 | 1 | 0 | 1 | 1 | 0 | 0 | 0 | 0 |
| 0 | 0 | 1 | 0 | 0 | 1 | 0 | 0 | 1 | 0 | 1 | 0 | 1 | 1 | 1 | 0 |
| 1 | 1 | 0 | 1 | 0 | 0 | 0 | 0 | 1 | 1 | 0 | 0 | 1 | 0 | 0 | 1 |
| 1 | 0 | 0 | 0 | 0 | 0 | 1 | 1 | 0 | 1 | 1 | 1 | 1 | 1 | 1 | 1 |
| 0 | 0 | 0 | 1 | 1 | 0 | 0 | 0 | 1 | 1 | 0 | 1 | 1 | 1 | 0 | 1 |
| 0 | 0 | 1 | 1 | 0 | 1 | 1 | 1 | 1 | 1 | 0 | 0 | 0 | 1 | 0 | 0 |
| 1 | 1 | 1 | 0 | 0 | 1 | 1 | 1 | 0 | 0 | 1 | 1 | 1 | 1 | 1 | 0 |
| 0 | 1 | 1 | 0 | 0 | 0 | 1 | 1 | 1 | 1 | 0 | 1 | 1 | 1 | 1 | 1 |
| 1 | 1 | 1 | 1 | 1 | 0 | 0 | 1 | 1 | 0 | 0 | 0 | 1 | 1 | 1 | 1 |
| 0 | 0 | 0 | 1 | 0 | 0 | 1 | 1 | 0 | 0 | 0 | 1 | 0 | 1 | 1 | 0 |
| 1 | 0 | 0 | 0 | 1 | 1 | 1 | 0 | 1 | 0 | 1 | 0 | 0 | 1 | 1 | 1 |
| 1 | 0 | 0 | 0 | 1 | 0 | 1 | 1 | 1 | 1 | 1 | 1 | 0 | 0 | 1 | 1 |
| 1 | 1 | 1 | 1 | 1 | 0 | 0 | 0 | 1 | 1 | 0 | 1 | 1 | 1 | 1 | 1 |
| 1 | 1 | 1 | 0 | 0 | 1 | 0 | 0 | 1 | 0 | 0 | 0 | 1 | 1 | 1 | 1 |
| 1 | 0 | 1 | 0 | 0 | 0 | 1 | 1 | 0 | 0 | 0 | 1 | 1 | 0 | 1 | 0 |

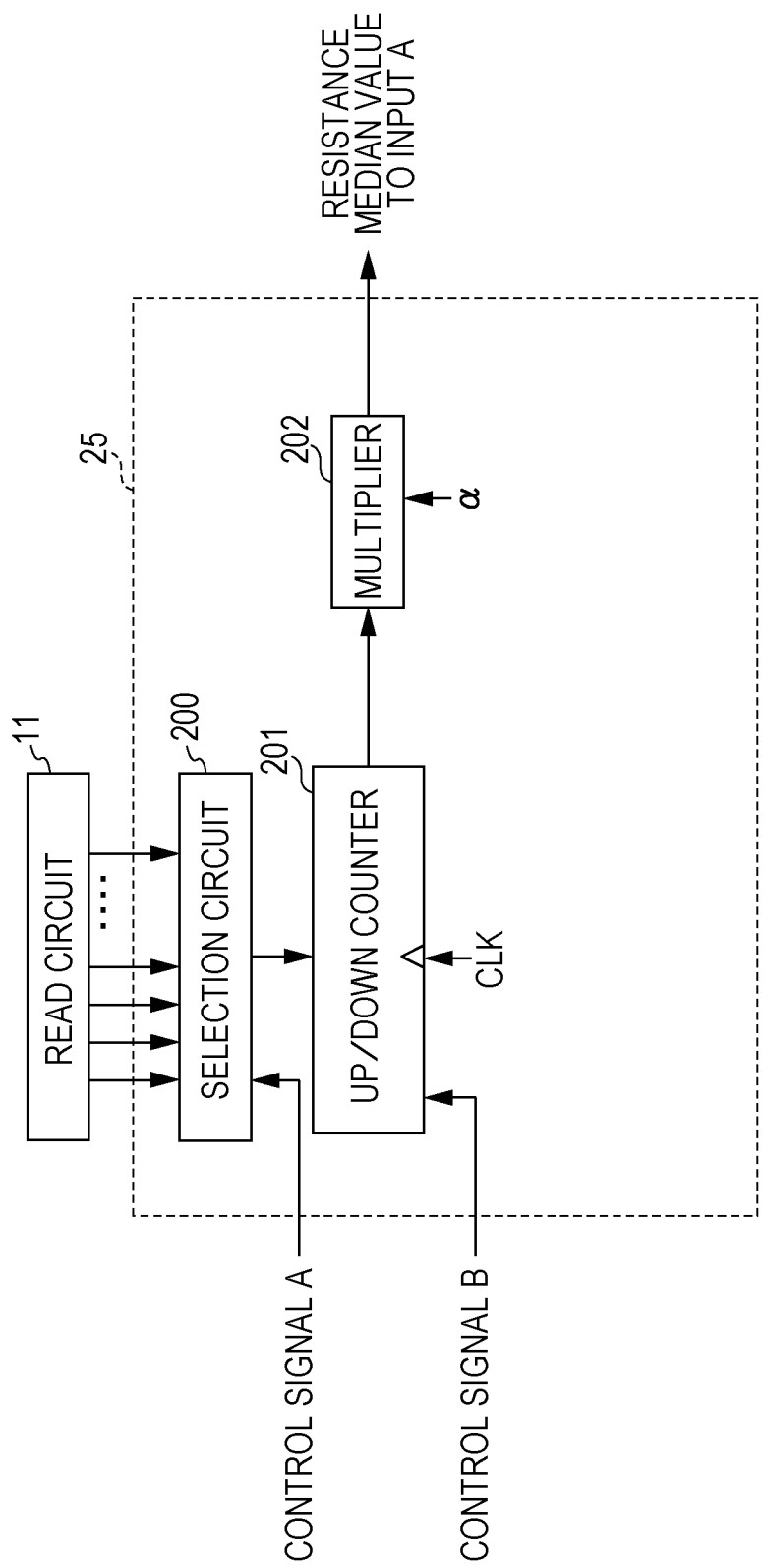

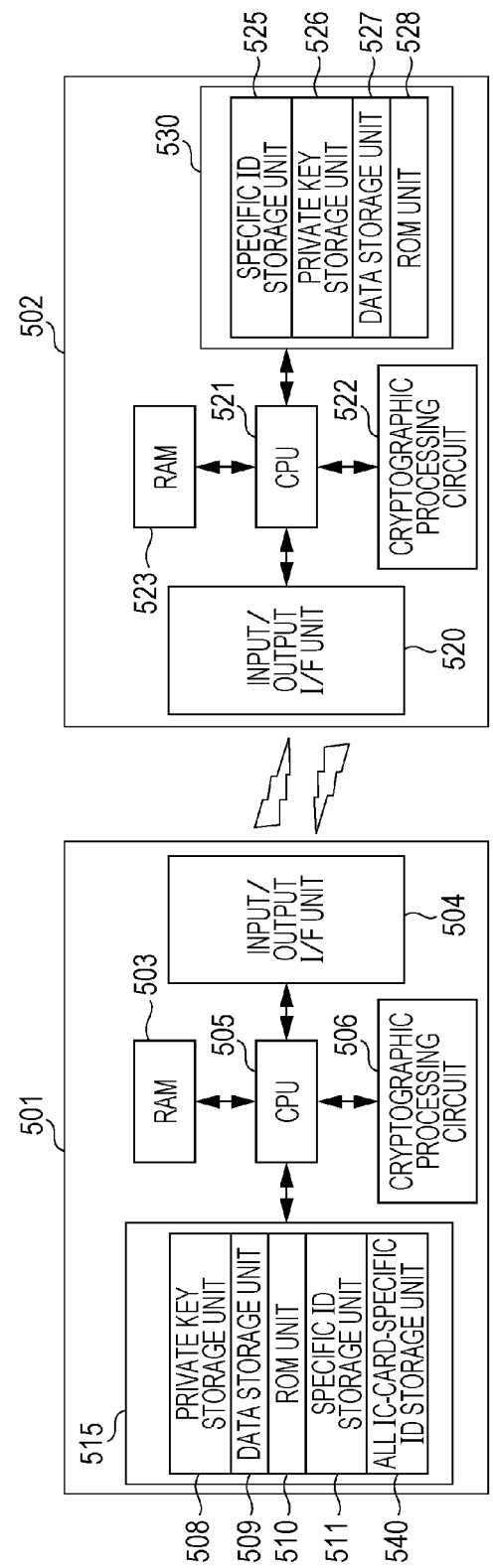

TAMPER-RESISTANT NON-VOLATILE MEMORY DEVICE COMPRISING AN ARITHMETIC CIRCUIT THAT, IN OPERATION, CALCULATES A BINARY REFERENCE VALUE BASED ON AT LEAST A PART OF THE PIECES OF RESISTANCE VALUE INFORMATION, A READ CIRCUIT THAT, IN OPERATION, SELECTIVELY ASSIGNS, BASED ON THE BINARY REFERENCE VALUE, ONE OF TWO VALUES TO EACH OF THE PIECES OF RESISTANCE VALUE INFORMATION, AND A WRITE CIRCUIT THAT, IN OPERATION, PERFORMS A WRITE OPERATION CORRESPONDING TO ONE OF THE TWO VALUES AMONG MEMORY CELLS

BACKGROUND

1. Technical Field

The present disclosure relates to a tamper-resistant non-volatile memory device including a plurality of non-volatile resistive memory cells.

2. Description of the Related Art

The market for electronic commerce services rendered via the Internet, such as electronic banking or electronic shopping, is rapidly expanding. Such services are paid for with electronic methods of payment like electronic money using integrated circuit (IC) cards and smartphone terminals whose use is also expanding. These services require high-level security technology for mutual authentication during communication and encryption of communication data all the time in order to make payment safe.

In terms of software technologies, due to the accumulation of encryption techniques based on program processing, such as high-level encryption algorithms, a sufficient level of security has been achieved. However, technological advances have lead to a rapid growth of concerns about the direct interception of inside information on circuitry from outside parties.

International Publication WO2012/014291 proposes a solution to such concerns. In general, security-enhanced ICs encrypt confidential information by using a built-in cryptographic circuit and use the encrypted information to prevent leakage of information. In this case, it is required that information on an internally stored encryption key (also referred to as a "private or secret key") not be leaked to the outside.

Typical standards for cryptographic circuits, such as Triple Data Encryption Standard (3DES) and Advanced Encryption Standard (AES), are widely used. These encryption standards employ sophisticated cryptographic algorithms that make it difficult to identify the encryption key within the realistic constraints of time even if pairs of plaintext (unencrypted data) and ciphertext constituting input and output are obtained and analyzed by making full use of top-speed computers, and the safety thereof has been confirmed. However, such standards, which are regarded as being safe in providing protection against hacking of encrypted data, have still involved a concern for vulnerability of the encryption key to direct hacking.

In an IC that adopts a classic technique, an encryption key is stored in an internal fuse read-only memory (ROM) or a non-volatile memory. The former configuration has experienced a problem that permits the state of the fuse element to be observed using X-ray projection or the like and the electrical conductivity of the fuse element to be analyzed, resulting in the stored key information being hacked or stolen. The latter configuration does not lead to analysis by using X-ray projection but has a problem in that the key information can be hacked by direct application of probes to both ends of a memory element of the non-volatile memory to electrically read the state of the element. To address this problem, security-enhanced ICs are manufactured using latest fine process technology so as to prevent direct application of probes to an internal circuit. That is, the manufacture of an IC using latest fine process technology with a finer process rule than the diameter of the leading edge of a probe addresses a threat of analysis with probing.

However, techniques called side-channel attacks, which have been attempting to break the countermeasure described above, can constitute threats. The side-channel attacks are techniques for, as described in International Publication WO2012/014291, identifying an encryption key by using side-channel information such as power consumption of a semiconductor device when each signal processing circuit is executed and radiated electromagnetic waves dependent on the power consumption. These techniques are threats because such techniques enable an attacker (or hacker) to hack key information without causing any physical damage to an IC when the IC is in actual operation.

Differential Power Analysis (DPA), which is a type of side-channel attack, was introduced by P. Kocher in 1999. The DPA technique uses the fact that there is a correlation between a signal value or signal transition frequency and power consumption during operation of an IC. Specifically, the DPA technique involves integrating the correlation described above multiple times to reduce noise and performing machine learning control to derive a fixed pattern, thereby identifying key information. The example disclosed in International Publication WO2012/014291 provides an example in which key information is identified through the operation of a cryptographic processing circuit. Key information stored in a non-volatile memory is read at the timing when the execution of cryptographic processing acts as a trigger. Based on the principle of DPA, if data read at timing similar to the timing described above is identified and obtained, the content of the data might be analyzed using DPA. In addition, if the internal specification of an IC leaks, a hacker will be able to understand the control method of the IC and, as described above, all of the data stored in the non-volatile memory, including cryptographic key information, will be hard-copied so that a duplication of the IC might be created.

In recent years, Physically Unclonable Function (PUF) technology has been proposed to address the problems described above. PUF technology is a technology for generating unique entity identification information different for each IC by exploiting manufacturing variations. In this specification, entity identification information generated using PUF technology is hereinafter referred to as "digital ID data". The digital ID data can be regarded as random-number data specific to each device, which is associated with variations in the physical properties of an IC. Since it is not possible to artificially control the physical properties of each IC, data whose physical duplication is not possible can be generated.

Even if it is possible to some extent to control variations in the physical properties of an IC, using random process variations caused during manufacture would make it easy to create unique digital ID data specific to each IC by using PUF technology. In actual use, however, specific entity identification information determined in advance is difficult to create on purpose. In a semiconductor process, manufacturing variations occur in terms of various physical properties. Examples of the manufacturing variations include the amount of doping in the semiconductor process, oxide thickness, channel length, the width and thickness of a metal wiring layer, parasitic resistance, and parasitic capacitance.

In the related art, specific examples of static random access memory (SRAM) PUF are disclosed in Japanese Unexamined Patent Application Publication (Translation of PCT Application) No. 2013-545340 and "A 0.19pJ/b PVT-Variation-Tolerant Hybrid Physically Unclonable Function Circuit for 100% Stable Secure Key Generation in 22 nm CMOS", K. Mathew, et al., ISSCC 2014 (hereinafter referred to as Non-Patent Literature 1). The disclosed examples use a phenomenon in which, in each memory cell in an SRAM, the tendency of whether digital data of the initial value when power to the SRAM is turned on is likely to be in state "1" or state "0" differs mainly due to the Vt variations (variations in operating voltage) across the transistor in the memory cell. This tendency is specific to each cell of an SRAM on each IC, and differs from one cell to another. That is, the initial value data at power-on of the SRAM is used as digital ID data.

Japanese Unexamined Patent Application Publication No. 2012-43517 discloses a modification of SRAM-PUF which uses a phenomenon in which defective bits of memory cells of an SRAM randomly occur. In addition, in International Publication WO2012/014291 and "The Design and Evaluation Methodology of Dependable VLSI for Tamper Resistance" by Takeshi Fujino in "Fundamental technology for dependable VLSI system", CREST 2009 Research Theme, 2012 Annual Report (hereinafter referred to as Non-Patent Literature 2), PUF technology called Arbiter PUF or Glitch PUF has been introduced. Arbiter PUF and Glitch PUF use random changes in the output of a combinational circuit with respect to the input by using a gate delay or a wiring delay. The gate delay or wiring delay, which changes due to manufacturing variations, constitutes an amount of delay specific to each IC. Thus, each IC outputs a substantially equal result with respect to the input, where the results of the individual ICs are different from each other, and can therefore generate digital ID data.

Accordingly, PUF technology enables digital ID data serving as a random number specific to each IC to be generated as unduplicatable data. The digital ID data is used as a device key for encrypting the private or secret key described above. A private or secret key encrypted with the device key (digital ID data) is stored in a non-volatile memory as an encrypted private or secret key. That is, the encrypted private or secret key recorded on the non-volatile memory can be decrypted into the original private or secret key data only with the device key. Thus, even if all the data in the non-volatile memory has been hard-copied by hacking, the device key (digital ID data) specific to each IC is not duplicatable, which prevents the encrypted private or secret key from being restored to the original form to make the private or secret key unavailable.

In addition, since the digital ID data generated using PUF technology is generated by using subtle manufacturing variations, environmental variations including temperature or power supply variations under which the digital ID data is generated, as well as, for example, deterioration over time, may cause changes in available physical properties, and may result in an error being caused in data obtained. Accordingly, as disclosed in Non-Patent Literature 1, parity data for error correction is computed based on digital ID data generated using PUF technology in the inspection step during manufacture. The parity data is separately stored in the non-volatile memory or the like. When the system uses digital ID data, the digital ID data, which is generated using PUF technology and contains an error, undergoes an error correction process using the parity data to obtain constantly the same ID data.

While the technology described above, which involves subjecting data containing errors to data correction, seems to be inefficient, such inefficiency becomes another important feature. Each time digital ID data is re-generated using PUF technology, random errors are generated in the data. Thus, even if the data is exposed to a hacking attack such as the side-channel attack described above, the data pattern remains unfixed and is difficult to analyze, thus achieving a significant improvement in security.

As described above, PUF technology is an important technology to increase security for secure cryptography and mutual authentication.

SUMMARY

In one general aspect, the techniques disclosed here feature a non-volatile memory device including a memory cell array including memory cells arranged in an array, each of the memory cells having a resistance value and having a property that the resistance value reversibly transitions among resistance value ranges in a non-volatile manner in a variable state in accordance with application of different electrical signals, a read circuit that, in operation, obtains pieces of resistance value information each relating to the resistance value of one of the memory cells, an arithmetic circuit that, in operation, calculates a binary reference value based on at least a part of the pieces of resistance value information, and a write circuit. In operation, the read circuit selectively assigns, based on the binary reference value, one of two values to each of the pieces of resistance value information, thereby generating pieces of digital data. In operation, the write circuit performs a first write operation on a memory cell corresponding to one of the two values among the memory cells.

A non-volatile memory device according to an exemplary embodiment of the present disclosure includes memory cells mountable on an IC and storing data. The memory cells can be used to generate digital data serving as entity identification information, and thus no area overhead occurs. The digital data is securely and stably generated and is very difficult to duplicate. Accordingly, it may be possible to provide a scheme based on PUF technology that has high resistance to side-channel attacks constituting recent serious threats.

With the use of the non-volatile memory device according to the embodiment of the present disclosure, the bit length of digital data used for the identification of an entity using a system on chip (SoC) or microcontroller having mounted thereon the non-volatile memory device may be easily increased. In addition, it may be possible to make it difficult to duplicate a chip without allowing a relationship to be inferred between the resistance values of the memory cells and the digital data, thereby enhancing security.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 is a diagram illustrating an example of resistance values continuously read from a memory cell whose resistance value is within the same variable resistance value range according to the embodiment of the present disclosure;

FIG. 15 is a diagram illustrating an example of the digital ID data;

FIG. 21 is a diagram illustrating an example configuration of a median value detection circuit in the non-volatile memory device according to the embodiment of the present disclosure;

FIG. 39 is a block diagram illustrating an example configuration of a communication system according to an example application of the present disclosure.

DETAILED DESCRIPTION

Figure 1:
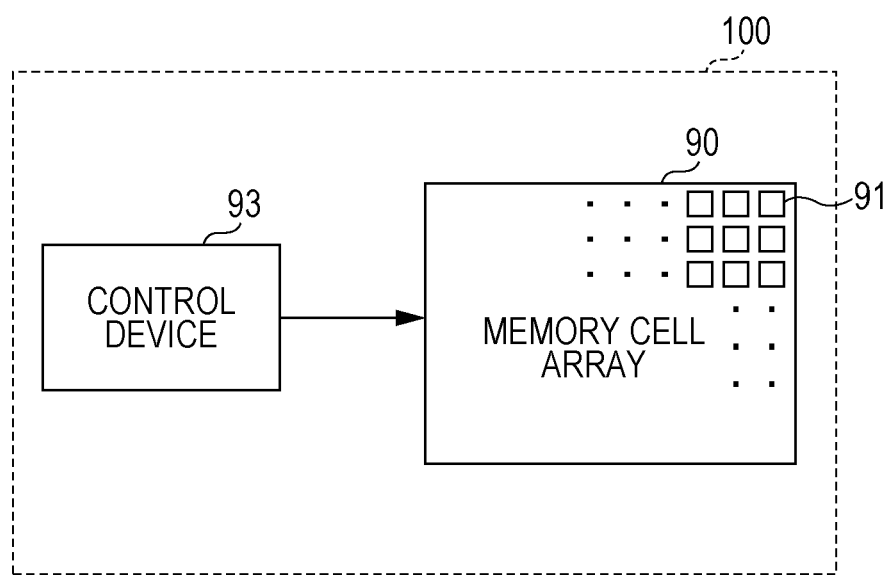
FIG. 1 is a block diagram illustrating an example of the schematic configuration of a non-volatile resistive memory device according to an embodiment of the present disclosure.

A non-volatile memory device and the like according to embodiments of the present disclosure will be described hereinafter with reference to the accompanying drawings. A non-volatile memory device according to an embodiment of the present disclosure includes a plurality of non-volatile resistive memory cells each for storing data by judging a resistance value using at least one or more thresholds.

For example, the non-volatile memory device has a function of generating entity identification information. The non-volatile memory device is configured to encrypt and decrypt data in accordance with the generated entity identification information, and may also perform mutual authentication. More specifically, the non-volatile memory device according to the embodiment of the present disclosure has a function of reading the content in a resistance variable memory element and generating specific random-number data unique to each chip for entity identification information which derives a digital identifier at least partially from the read content. Accordingly, electrical and physical duplication of data can be prevented.

The non-volatile memory device may be mounted on, for example, a card having an IC chip used for mobile electronic money. The IC chip further includes a logic circuit, a volatile memory device, and a microprocessor. These components are used to implement various information security functions including an encryption function, a digital signature, and a digital authentication function. These functions are executed using data cryptography with a private or secret key. Also in an IC card, as described above, it is desirable to securely keep a private or secret key so as not to create a duplicate of the private or secret key.

Studies Carried out by Inventors

Secure storage of the private or secret key is implemented using PUF technology. The private or secret key is encrypted using, as a device encryption key, random-number digital ID data that is entity identification information obtained using PUF technology, and is stored in the non-volatile memory. Since the digital ID data is a random number different for each IC, data encrypted using the digital ID data is also a data string specific to each IC. Even if an encrypted private or secret key is copied to another IC by hacking or the like, the digital ID data, which is not duplicatable, is not copied and therefore the original private or secret key is not used without authorization.

In a small device such as an IC card, it is also required to significantly reduce the size of a circuit for generating digital ID data, which epitomizes PUF technology. In particular, digital ID data based on PUF technology contains errors and thus requires an error correction circuit. Thus, if the number of errors is large, the circuit scale is also large. That is, there are demands for a reduction in data error rate to increase stability and for a reduction in circuit scale with reduced error correction performance requirements as much as possible. In addition, it is necessary for a typical IC card having no battery to execute various functions in a short period of time with power obtained by wireless power feeding during communication. That is, there is also a demand for both super low power consumption and high generation speed for the generation of digital ID data. Accordingly, the present inventors have studied several related art techniques as possible digital ID data generators to meet the demands.

Non-Patent Literature 2 provides various benchmarks of PUF technology in related art examples. In particular, focusing on the error rate of digital ID data, it is found that SRAM PUF and Glitch PUF show the deterioration of data error rate to reach 15% in the worst case if environmental changes are also taken into account. An error correction circuit in which a data error of 20% or more can be tolerated is required in view of manufacturing yield, and such requirements result in the circuit scale becoming a limiting factor for an IC. In addition, while, as in Non-Patent Literature 1, the latest study of SRAM PUF has reported a cell having a significantly low error rate, the memory cell has a size as large as 4.66 $\mu m^2$ although 22 nm process technology is adopted. Further use of a special SRAM cell for PUF may allow an element to be easily identified, and is now causing a problem related to tamper resistance.

The present inventors have summarized the features of PUF technology as follows. PUF technology is considered to have mainly the following three features.

Feature (1): Specific digital ID data (entity identification information) is obtained from an unduplicatable physical phenomenon.

Feature (2): A physical phenomenon can be obtained only by dynamic circuit control; a required physical phenomenon is not obtainable from static analysis such as direct reading with a probe.

Feature (3): The obtained digital ID data contains an error, and the true ID data can be obtained only using an error correction circuit.

The present inventors further have summarized principal performance requirements for digital ID data obtained using PUF technology as follows.

Performance (1): Random changes in error in digital ID data and difficulty in predicting the true ID data.

Performance (2): Ensuring that digital ID data obtained using PUF technology has high randomness and is specific data unique to each IC.

Performance (3): Small overhead of an additional circuit when PUF technology is adopted, and low power consumption involved in generating digital ID data.

Performance (4): Increased number of parallel processing operations performed by a generation circuit to generate individual data bits to increase resistance to side-channel attacks.

Performance (5): Low error rate of data and reduced circuit scale of an error correction circuit.

Performance (6): High generation speed with a few constraints on the timing of generating digital ID data.

Compared to the features and performance requirements described above, SRAM-PUF, which is well-established in the related art, has major constraints on Performance (6). In SRAM-PUF, digital ID data can be theoretically obtained only at power-on. Since an internal SRAM of an IC is used as a data cache, the data in the SRAM needs to be temporarily moved or discarded in order to generate ID data using PUF technology, leading to severe constraints on the operation of the system. To address this inconvenience, as disclosed in Non-Patent Literature 1, an additional PUF-dedicated cell is required to generate ID data at the desired timing, resulting in a significant reduction in the requirement of Performance (5) which may cause an increase in the overhead of the circuit.

In addition, SRAM-based PUF causes a tendency for data errors to occur in the same cell. That is, cells operating stably and cells operating unstably are fixed, and patterns of digital ID data containing errors may be limited. Thus, there is a problem in that the true digital ID data is easy to predict.

Also, Arbiter PUF can overcome the problems of constraints on the generation timing, circuit scale, generation speed, and so forth, but provides less uniqueness for ID data since the variations in wiring delay, gate delay, and the like are not large. Furthermore, as suggested in Non-Patent Literature 2, the data error rate is as high as 15%, and thus the increased scale of an error correction circuit becomes an issue.

Findings Made by Inventors

The present inventors have conducted intensive studies on novel digital ID data generation methods that can possibly overcome the foregoing issues and problems. As a result of such intensive studies, the present inventors have found a phenomenon that the resistance value written in a resistance variable element varies in a normal distribution, and have contemplated the stable generation of digital ID data from variations in resistance value.

A non-limiting and exemplary embodiment of the present disclosure provides a scheme based on PUF technology for generating digital ID data with excellent security.

A resistance variable memory element has a resistance value that changes at least between a first resistance value state and a second resistance value state lower than the first resistance value state by the application of an electrical pulse of a predetermined voltage, polarity, and width. Typically, digital data (for example, "0" and "1") is assigned to the first resistance value state and the second resistance value state, and is stored as information.

Here, the present inventors have focused on a cell group whose resistance values are in any one of three states, namely, the first resistance value state, the second resistance value state, and an initial state described below, and classified the cells included in the cell group into two sections in accordance with the resistance values of the cells. That is, each of the cells included in the cell group has been converted into a binary code (or digital data). The resistance value of each cell varies, and the variations in resistance value are used to convert each cell into digital data, thereby making it possible to provide a secure and stable digital ID data generation method over the related art, which is applicable to cryptography and the like. This is one of the findings made by the present inventors.

In addition, it is possible to share a large number of circuit elements for generating digital ID data with a typical circuit mounted as a non-volatile memory device. This can significantly reduce circuit scale, which will be increased in order to generate digital ID data, and make the non-volatile memory device significantly more compact.

Additionally, due to the structure of the memory array, the data readout of the non-volatile memory device is accomplished by reading a plurality of pieces of data using parallel processing, resulting in a significant increase in the speed of generation of digital ID data. Furthermore, the parallel processing allows radiated electromagnetic waves, the number of which corresponds to the total number of parallel processing operations, to be applied for side-channel attacks. Accordingly, the resistance to attacks may be increased.

The following is an overview of aspects of the present disclosure based on the findings of the present inventors.

(Item 1) A non-volatile memory device according to an aspect of the present disclosure includes a memory cell array including memory cells arranged in an array, each of the memory cells having a resistance value and having a property that the resistance value reversibly transitions among resistance value ranges in a non-volatile manner in a variable state in accordance with application of different electrical signals, a read circuit that, in operation, obtains pieces of resistance value information each relating to the resistance value of one of the memory cells, an arithmetic circuit that, in operation, calculates a binary reference value based on at least a part of the pieces of resistance value information, and a write circuit. In operation, the read circuit selectively assigns, based on the binary reference value, one of two values to each of the pieces of resistance value information, thereby generating pieces of digital data. In operation, the write circuit performs a first write operation on a memory cell corresponding to one of the two values among the memory cells.

(Item 2) For example, in the non-volatile memory device according to Item 1, the resistance value ranges may include a first resistance value range and a second resistance value range lower than the first resistance value range. In an initial state, the resistance value of each of the memory cells may be within an initial resistance value range different from the first resistance value range and the second resistance value range. Each of the memory cells may change from the initial state to the variable state by application of an electrical stress to each of the memory cells. In the variable state, the resistance value of each of the memory cells may transition from the second resistance value range to the first resistance value range by application of a voltage pulse having a first polarity to each of the memory cells, and the resistance value of each of the memory cells may transition from the first resistance value range to the second resistance value range by application of a voltage pulse having a second polarity to each of the memory cells. In the first write operation, the write circuit may alternately apply a first voltage pulse having the first polarity and a second voltage pulse having the second polarity to a memory cell corresponding to one of the two values among the memory cells.

(Item 3) For example, in the non-volatile memory device according to Item 2, the resistance values of one half or more of a number of memory cells corresponding to the pieces of digital data may be within the second resistance value range.

(Item 4) For example, in the non-volatile memory device according to any of Items 1 to 3, the arithmetic circuit, in operation, may calculate a median value of the pieces of resistance value information, which is obtained by the read circuit, as the binary reference value.

(Item 5) For example, in the non-volatile memory device according to Item 4, the write circuit, in operation, may perform the first write operation on a memory cell whose resistance value is lower than the median value among the memory cells.

(Item 6) For example, in the non-volatile memory device according to Item 2, the write circuit, in operation, may perform a second write operation on each of the memory cells that are in the initial state, the second write operation including alternately applying a third voltage pulse having the first polarity and a fourth voltage pulse having the second polarity. In operation, the read circuit may read resistance value information on each of the memory cells on which the second write operation has been performed, and determine, based on in accordance with the read resistance value information, whether or not the resistance value of each of the memory cells on which the second write operation has been performed is within the second resistance value range. In operation, the write circuit and the read circuit may repeatedly perform the second write operation and the reading of the resistance value information until it is determined that the resistance value of each of the memory cells on which the second write operation has been performed is within the second resistance value range.

(Item 7) For example, in the non-volatile memory device according to any of Items 1 to 6, the read circuit, in operation, may include a comparison circuit that compares the resistance value indicated by each of the pieces of resistance value information obtained by the read circuit with the binary reference value and that outputs binary data of 0 or 1 in accordance with a result of comparison.

(Item 8) For example, the non-volatile memory device according to any of Items 1 to 7 may further include a generation circuit that, in operation, generates mask data used to distinguish a memory cell on which the first write operation is performed among the memory cells from a memory cell on which the first write operation is not performed among the memory cells, in accordance with the pieces of digital data generated by the read circuit.

(Item 9) For example, in the non-volatile memory device according to Item 8, the write circuit, in operation, may perform, based on the mask data, the first write operation on a memory cell on which the first write operation is performed.

(Item 10) For example, the non-volatile memory device according to any of Items 1 to 9 may further include a control circuit. The first write operation may be an operation for applying a voltage pulse to a memory cell corresponding to one of the two values among the memory cells. In operation, the control circuit may modify at least one selected from the group consisting of the number of times the voltage pulse is applied, a voltage of the voltage pulse, and a pulse width of the voltage pulse in the first write operation.

(Item 11) For example, in the non-volatile memory device according to Item 10, the memory cells may be divided into a first group and a second group. The at least one selected from the group consisting of the number of times the voltage pulse is applied, the voltage of the voltage pulse, and the pulse width of the voltage pulse in the first write operation may be different between a memory cell belonging to the first group and a memory cell belonging to the second group among the memory cells.

(Item 12) For example, the non-volatile memory device according to Item 1 may further include a control circuit. In operation, the control circuit may accept an input of a control signal, and the read circuit may obtain the pieces of resistance value information in accordance with the control signal input to the control circuit.

(Item 13) An integrated circuit card according to an aspect of the present disclosure includes the non-volatile memory device according to Item 1, and an input/output interface unit to which a signal that controls an operation of the non-volatile memory device is input and from which information related to the pieces of digital data is output. The term "information related to the pieces of digital data" is used to include the pieces of digital data themselves.

In the present disclosure, all or a part of any of unit, device, part or portion, or any of functional blocks in the block diagrams illustrated in in FIGS. 1, 18, 21, 22, 24, 25, 27, and 39 and may be implemented as one or more of electronic circuits including, but not limited to, a semiconductor device, a semiconductor integrated circuit (IC) or an LSI (large scale integration). The LSI or IC can be integrated into one chip, or can be a combination of plural chips. For example, functional blocks other than a memory may be integrated into one chip. The name used here is LSI or IC, but it may also be called system LSI, VLSI (very large scale integration), or ULSI (ultra large scale integration) depending on the degree of integration. A Held Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the unit, device, part or portion are implemented by executing software. In such a case, the software is recorded on one or more non-transitory recording media such as a ROM, an optical disk, or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

Embodiments of the present disclosure based on the findings described above will now be described with reference to the accompanying drawings.

The following embodiments illustrate specific examples. Numerical values, shapes, materials, constituent elements, arranged positions and connection forms of the constituent elements, steps, the order of the steps, and so forth illustrated in the following embodiments are merely examples, and are not intended to limit the present disclosure. Among constituent elements described in the following embodiments, a constituent element that is not included in any of the independent claims which represent the most generic concept of the present disclosure is described as an optional constituent element. In the drawings, the descriptions of components given by the same numerals and symbols may be omitted. The drawings schematically illustrate the constituent elements for easy understanding, and the shapes, dimensional ratios, and so forth of the constituent elements may not be exact. In manufacturing methods, the order of the steps and the like may be optionally changed and other known steps may be added, as necessary.

First Embodiment

Figure 2:
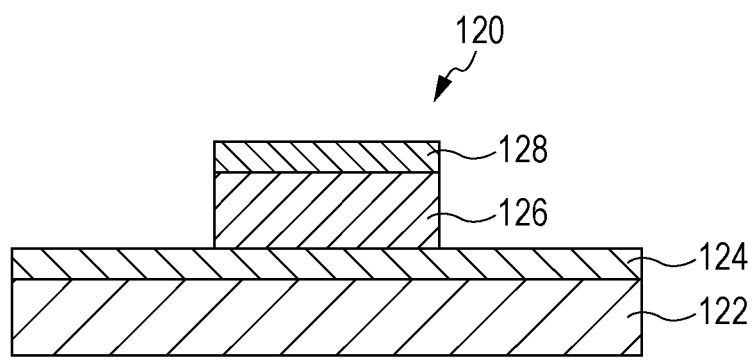
FIG. 2 is a cross-sectional view illustrating an example of the schematic configuration of a memory cell included in the non-volatile resistive memory device according to the embodiment of the present disclosure.

Overview of Non-Volatile Resistive Memory Device According to Embodiment of Present Disclosure FIG. 1 is a block diagram illustrating an example of the schematic configuration of a non-volatile resistive memory device 100 according to a first embodiment. FIG. 2 is a cross-sectional view illustrating an example of the schematic configuration of a memory cell included in the non-volatile resistive memory device 100 according to the first embodiment.

In the example illustrated in FIG. 1, the non-volatile resistive memory device 100 according to this embodiment at least includes a memory cell array 90 and a control device 93. The control device 93 may not necessarily be included in the non-volatile resistive memory device 100, and a control device located outside the non-volatile resistive memory device 100 may be connected to the non-volatile resistive memory device 100 and used to perform the following operation.

The memory cell array 90 has a configuration in which a plurality of memory cells 91 are arranged in an array.

The control device 93 obtains a plurality of pieces of resistance value information from a group of memory cells 91 having resistance values that are in the same resistance value state, and detects the median value of variations of the plurality of pieces of resistance value information. Further, the control device 93 determines which of the values 0 and 1 of digital data to assign to each of the memory cells in the group of memory cells 91 whose resistance values are in the same resistance value state, on the basis of the detected median value, and generates digital ID data. The term "same resistance value state" refers to a single resistance value range used to assign one state of digital information.

In general, when, for example, binary information that is a minimum unit of a digital quantity is to be to assigned to a physical quantity possessed by a memory cell in a non-volatile memory device, which value of the binary information to assign differs depending on whether the physical quantity belongs to a range greater than or equal to a predetermined threshold or a range less than the predetermined threshold. Recent non-volatile memory devices include an error correction circuit. An error correction process performed by the error correction circuit allows binary information obtained from a physical quantity of a certain memory cell to be correctly restored even if the physical quantity does not fall within a range expected in advance to assign binary information. This implies that the resistance values of some memory cells in a group of memory cells forming digital ID data may not necessarily be within the same resistance value range. By definition herein, it is assumed that the functions in the present disclosure can be achieved as long as the resistance values of memory cells, the number of which is greater than at least one half of the number of memory cells in a group of memory cells forming digital ID data, are in the same resistance value state.

Digital ID data, which is used as entity identification information of the non-volatile resistive memory device 100, is generated by using a plurality of non-volatile memory cells whose resistance values are within the same resistance value range. No user data is written to the plurality of non-volatile memory cells. That is, the resistance values are not rewritten. The respective resistance values of the non-volatile memory cells are fixed within a predetermined resistance value range. Each resistance value varies within the same resistance value range, and the variations in resistance value constitute information specific to the non-volatile resistive memory device 100. Resistance value ranges will be described in detail below with reference to FIG. 3.

The resistance value information is information having a correlation with a resistance value, and may be the resistance value itself or a value that increases or decreases in accordance with the resistance value. The value that increases or decreases in accordance with the resistance value may be, for example, as described below, a discharge time during which the charge accumulated in a capacitor connected in parallel to a memory cell is discharged via a selected memory cell or the charge time during which a certain constant current is caused to flow through a discharged capacitor to make the capacitor charged to a predetermined level. The discharge time or the charge time may be a count value or the like counted with a predetermined clock period. The capacitor is not limited to an element, and may be, for example, a parasitic capacitance of wiring or the like.

The resistance value information may be a value measured using a sense amplifier having a predetermined resolution. Alternatively, the resistance value information may be a value obtained by determining to which of a plurality of resistance value ranges separated by a threshold a value measured using a sense amplifier belongs. In this case, each of some resistance value ranges among the plurality of resistance value ranges may be divided into sub-ranges.

In the example illustrated in FIG. 2, each of the memory cells 91 includes a resistance variable element 120. The resistance variable element 120 includes an underlying layer 122, a first electrode 124, a resistance variable layer 126, and a second electrode 128. A selection element such as a transistor or a diode for selecting a specific memory cell, which is not illustrated in FIG. 2, may be connected to each of the memory cells 91.

Each of the memory cells 91 has a property capable of taking a variable state where the resistance value of the memory cell 91 reversibly transitions among a plurality of variable resistance value ranges by the application of a plurality of different electrical signals to the memory cell 91.

Figure 3:
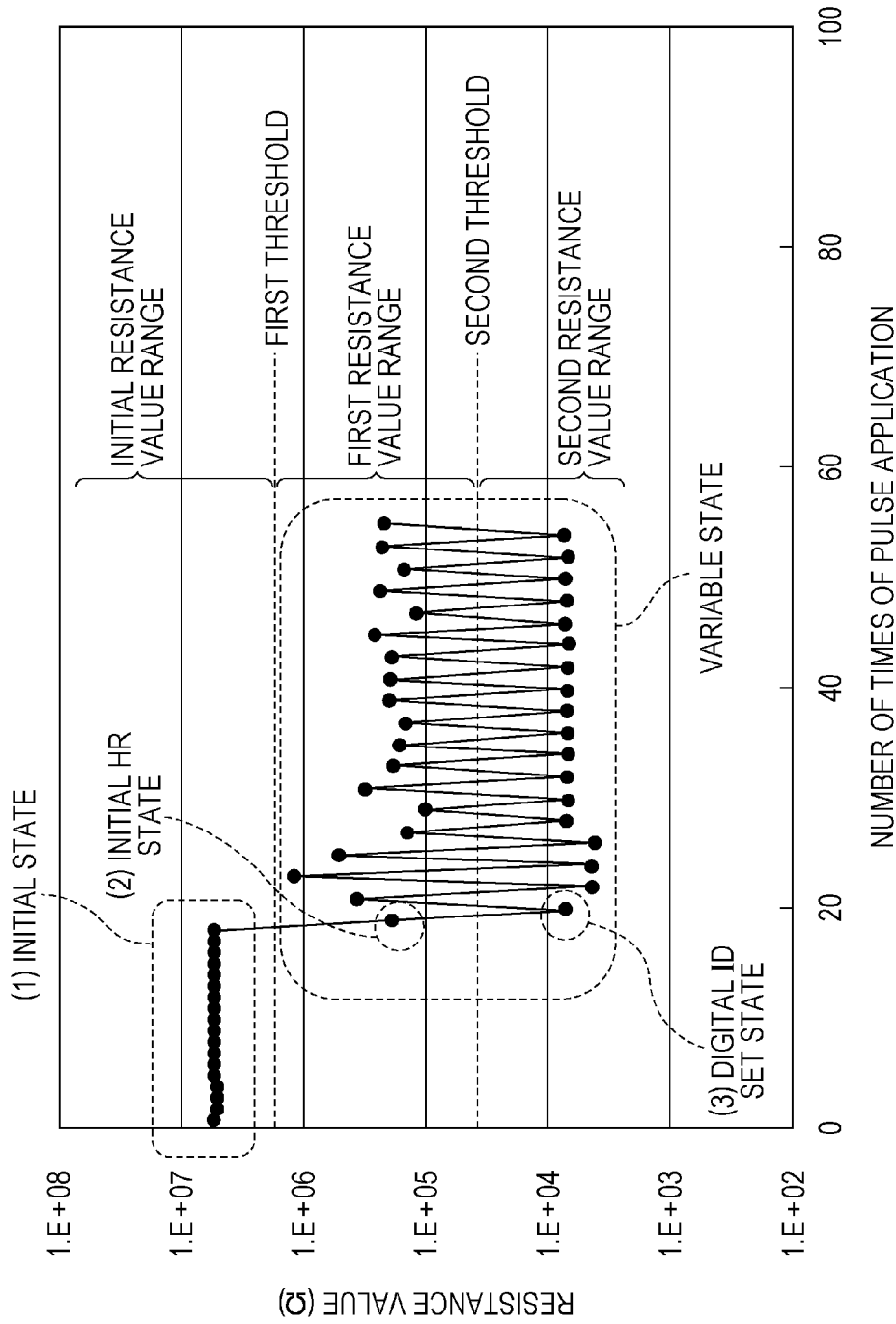
FIG. 3 is a graph illustrating an example of resistance value ranges for memory cells included in the non-volatile resistive memory device according to the embodiment of the present disclosure.

FIG. 3 is a graph illustrating an example of resistance value ranges for he memory cells 91 included in the non-volatile resistive memory device 100 according to the first embodiment. As illustrated by way of example in FIG. 3, each of the memory cells 91 may have at least two states, namely, a variable state and an initial state.

The initial state is a state where a resistance value of a memory cell is in an initial resistance value range that does not overlap any of the variable resistance value ranges. A memory cell in the initial state does not change to the variable state unless forming is performed. The forming is an operation that causes a memory cell to change to a state where the resistance value of the memory cell reversibly transitions among the plurality of variable resistance value ranges, by applying a predetermined electrical stress to the memory cell.

The electrical stress ("forming stress") applied for forming may be, for example, an electrical pulse having a predetermined voltage and time width, or a combination of a plurality of electrical pulses. The forming stress may be a cumulative stress. In this case, if a cumulative amount of stress applied to a memory cell 91 (FIG. 1) exceeds a predetermined value, the memory cell 91 transitions from the initial state to the variable state.

In this embodiment, it is assumed that each of the memory cells 91 has a property of not transitioning to a state where the resistance value of the memory cell 91 reversibly transitions among the plurality of variable resistance value ranges if forming is not performed after manufacture. That is, in the following description, it is assumed that, after manufacturing using a semiconductor process or the like, a resistance variable element is in the initial state before the application of a forming stress.

The property described above is an example and is not required. Each of the memory cells 91 may not necessarily be an element that may take the initial state, and may be, for example, a so-called forming-less element having only the variable state.

Configuration of Resistance Variable Element

In the example illustrated in FIG. 2, the resistance variable element 120, has a configuration in which the resistance variable layer 126 is interposed between the first electrode 124 and the second electrode 128. The resistance variable layer 126 may be made of, for example, a metal oxide, more specifically. a transition metal oxide, for example. The resistance variable element 120 of each of the memory cells 91, when in the variable state, has a property that the resistance value between the first electrode 124 and the second electrode 128 reversibly transitions among the plurality of variable resistance value ranges by the application of an electrical signal between the first electrode 124 and the second electrode 128.

The resistance variable layer 126 of the resistance variable element 120 of each of the memory cells 91, when in the initial state, may provide insulation between the first electrode 124 and the second electrode 128. The insulation may be specifically 2 MΩ or more. The resistance variable layer 126 of the resistance variable element 120 may include a layer made of an insulator. Specifically, the insulator may be a material having a resistivity of 30 Ω·m or more. The resistance variable layers 126 of the resistance variable elements 120 of the memory cells 91 are made of an insulator, allowing the resistance characteristics of the memory cells 91 that are in the initial state to be stably maintained.

Unlike the case of a resistance variable element in the variable state where the resistance value of the resistance variable element changes by the application of an electrical signal, the initial resistance value range can be adjusted to some extent in accordance with the material, size, shape, manufacture conditions, and the like of a resistance variable element. For example, in particular, in a case where the resistance variable layer 126 has a layered structure, the initial resistance value range can be adjusted, as desired, with the thickness of a high-oxygen-concentration layer and the oxygen concentration at which the resistance variable layer 126 is formed, but is not adjustable for each individual memory cell.

The initial state described above is more stable than the variable state where a resistance value transitions by the application of an electrical signal. Accordingly, the difference between the initial state and the variable state can be used to stably hold data.

The initial resistance value range may be, for example, a range of resistance values read and obtained when a voltage lower than that of any of the electrical signal and forming stress that allow a resistance value of an element in the variable state to change among the plurality of variable resistance value ranges is applied to an element in the initial state.

The forming stress is determined in accordance with the amplitude of a voltage applied to each of the memory cells 91, the width of the pulse, a cumulative application time period, and so forth, and the respective values may differ for each of the memory cells 91 in the memory cell array 90. The cumulative application time period is a total pulse width of electrical pulses applied until, for example, the resistance state changes from the initial state to the variable state. Thus, specific values of parameters that define the electrical stress minimally required as a forming stress are values such as a voltage of the electrical stress applied until the element for each target memory cell 91 changes to the variable state, the pulse width of the voltage, and the cumulative application time period of the voltage, each of the values having certain variations rather than being an absolute fixed value. Such variations in electrical stress for each element during forming could presumably contribute to subsequent variations in resistance value for each cell within a variable resistance value range, and are difficult to artificially control for each element.

The forming stress is generally higher than an electrical signal applied to cause the resistance value of a memory cell in the variable state to reversibly change among the plurality of variable resistance value ranges. Specifically, the forming stress may be assumed to be higher than an electrical signal applied to cause the resistance value of a memory cell in the variable state to change, in terms of at least any one of the absolute value of the voltage, the pulse width of the voltage, and the cumulative application time period of the voltage.

A resistance variable element, when in the variable state, whose resistance value changes by the application of electrical signals having the same polarity although they are different in terms of voltage, pulse width, and the like is referred to as a unipolar resistance variable element. More specifically, for example, when an electrical signal (electrical pulse) having a width of 1 μs is applied to a resistance variable element with a voltage of +2 V in the direction in which the current flows from the second electrode 128 to the first electrode 124, the resistance value of the resistance variable element changes to a predetermined high resistance level (also referred to as a "first resistance value range" or an "HR level"). Likewise, when an electrical signal having a width of 50 ns is applied to the resistance variable element with a voltage of +4 V in the direction in which the current flows from the second electrode 128 to the first electrode 124, the resistance value of the resistance variable element changes to a predetermined low resistance level (also referred to as a "second resistance value range" or an "LR level"). In this manner, a resistance variable element whose resistance value reversibly changes by the application of electrical signals having the same polarity is referred to as a unipolar resistance variable element.

In contrast, a resistance variable element, when in the variable state, whose resistance value changes by the application of electrical signals having different polarities is referred to as a bipolar resistance variable element. More specifically, when an electrical signal having a width of 50 ns is applied to a resistance variable element with a voltage of +2 V in the direction in which the current flows from the second electrode 128 to the first electrode 124, the resistance value of the resistance variable element changes to a predetermined high resistance level (also referred to as a "first resistance value range" or an "HR level"). Conversely, when an electrical signal having a width of 50 ns is applied to the resistance variable element with a voltage of +2 V in the direction in which the current flows from the first electrode 124 to the second electrode 128, the resistance value of the resistance variable element changes to a predetermined low resistance level (also referred to as a "second resistance value range" or an "LR level"). In this manner, a resistance variable element whose resistance value reversibly changes by the application of electrical signals having opposite polarities is referred to as a bipolar resistance variable element.

It is to be anticipated that, for example, in order to stabilize the operation of a bipolar resistance variable element, an electrical signal applied to the resistance variable element to cause the resistance variable element to change to the HR level (or to be set to high resistance) and an electrical signal applied to the resistance variable element to cause the resistance variable element to change to the LR level (or to be set to low resistance) may differ in pulse width or the absolute value of voltage as well as in polarity.

The resistance variable layer 126 may be made of a metal oxide. The resistance variable layer 126 may have a layer made of an oxygen-deficient metal oxide. The metal oxide of which the resistance variable layer 126 is made may be at least any one of a transition metal oxide and aluminum oxide, or may be at least any one of tantalum oxide, iron oxide, hafnium oxide, and zirconium oxide.

Examples of the material of the resistance variable layer of a unipolar resistance variable element may include titanium (Ti) oxide, nickel (Ni) oxide, and aluminum (Al) oxide. Examples of the material of the resistance variable layer of a bipolar resistance variable element may include tantalum (Ta) oxide, hafnium (Hf) oxide, aluminum (Al) oxide, and iron (Fe) oxide.

Even when the same oxide material is used, both a unipolar resistance variable element and a bipolar resistance variable element may be obtained depending on the combination of the oxide material and the electrode material, the layered structure of the oxide, and the like. With the use of tantalum oxide as a material of a resistance variable layer, a resistance variable element exhibits good characteristics, which will be particularly described in detail by way of example in this embodiment.

Examples of the material of the first electrode 124 and the second electrode 128 may include iridium (Ir), platinum (Pt), tungsten (W), copper (Cu), aluminum (Al), titanium nitride (TiN), tantalum nitride (TaN), and titanium aluminum nitride (TiAlN).

In the example illustrated in FIG. 2, the area of the first electrode 124 is larger than that of the second electrode 128. However, this is not meant to be limiting. For example, the first electrode 124 may have an optimum shape, as desired, in accordance with the semiconductor process, such that the first electrode 124 is used as part of wiring. The underlying layer 122 may also be removed or modified as desired in accordance with the semiconductor process.

The resistance variable layer 126 may be formed by stacking at least two layers, namely, a first resistance variable layer to be connected to the first electrode 124 and a second resistance variable layer to be connected to the second electrode 128.

The first resistance variable layer may be made of an oxygen-deficient first metal oxide, and the second resistance variable layer may be made of a second metal oxide having a lower degree of oxygen deficiency than the first metal oxide. The second resistance variable layer may be a layer made of an insulator. The second resistance variable layer has formed therein a very small local region whose degree of oxygen deficiency reversibly changes in accordance with the application of an electrical pulse. The local region is considered to include a filament constituted by oxygen defect sites. The local region may be a conduction path that extends through the second resistance variable layer. The insulator may be made of a metal oxide, and the conduction path may be made of an oxygen-deficient metal oxide having a lower oxygen content percentage than the insulator.

The degree of oxygen deficiency is the ratio of the deficient amount of oxygen in a metal oxide to the amount of oxygen forming an oxide having the stoichiometric composition of the metal oxide (if the metal oxide has a plurality of stoichiometric compositions, the stoichiometric composition having the highest resistance value among the plurality of stoichiometric compositions). A metal oxide having a stoichiometric composition is more stable and has a higher resistance value than a metal oxide having any other composition.

For example, in the case of tantalum (Ta), the metal oxide having the stoichiometric composition based on the definition described above is $Ta_2O_5$, and can be expressed as $TaO_{2.5}$. The degree of oxygen deficiency of $TaO_{2.5}$ is 0%, and the degree of oxygen deficiency of $TaO_{1.5}$ is given by $(2.5-1.5)/2.5=40\%$. In the case of an oxygen-enriched metal oxide, the degree of oxygen deficiency is a negative value. As used herein, the degree of oxygen deficiency includes positive values, 0, and negative values, unless otherwise stated.

An oxide with a low degree of oxygen deficiency is closer to an oxide having the stoichiometric composition, and thus has a high resistance value; an oxide with a high degree of oxygen deficiency is closer to a metal contained in the oxide, and thus has a low resistance value.

The oxygen content percentage is the ratio of oxygen atoms to the total number of atoms. For example, the oxygen content percentage of $Ta_2O_5$ is the ratio of oxygen atoms to the total number of atoms (O/(Ta+O)), and is given by 71.4 atm %. Accordingly, the oxygen content percentage of an oxygen-deficient tantalum oxide is higher than 0 and lower than 71.4 atm %. For example, if the metal contained in the first metal oxide and the metal contained in the second metal oxide are of the same type, the oxygen content percentage has a correspondence relationship with the degree of oxygen deficiency. That is, if the oxygen content percentage of the second metal oxide is higher than the oxygen content percentage of the first metal oxide, the degree of oxygen deficiency of the second metal oxide is lower than the degree of oxygen deficiency of the first metal oxide.

The metal making up the resistance variable layer may be a metal other than tantalum. The metal making up the resistance variable layer may be at least any one of a transition metal and aluminum (Al). Examples of the transition metal may include tantalum (Ta), titanium (Ti), hafnium (Hf), zirconium (Zr), niobium (Nb), tungsten (W), nickel (Ni), and iron (Fe). Since the transition metal may take multiple oxidation states, different resistance states can be implemented by oxidation-reduction reactions.

For example, hafnium oxide may be used for the resistance variable layer 126. In this case, if the composition of the first metal oxide is $HfO_x$, where x is greater than or equal to 0.9 and less than or equal to 1.6, and if the composition of the second metal oxide is $HfO_y$, where y is greater than x, the resistance value of the resistance variable layer 126 can be stably and quickly changed. In this case, the second metal oxide may have a film thickness of 3 to 4 nm.

Alternatively, zirconium oxide may be used for the resistance variable layer 126. In this case, if the composition of the first metal oxide is $ZrO_x$, where x is greater than or equal to 0.9 and less than or equal to 1.4, and if the composition of the second metal oxide is $ZrO_y$, where y is greater than x, the resistance value of the resistance variable layer 126 can be stably and quickly changed. In this case, the second metal oxide may have a film thickness of 1 to 5 nm.

A first metal contained in the first metal oxide and a second metal contained in the second metal oxide may be different metals. In this case, the second metal oxide may have a lower degree of oxygen deficiency, or a higher resistance, than the first metal oxide. With the configuration described above, during a change in resistance, a greater portion of a voltage applied between the first electrode 124 and the second electrode 128 is distributed to the second metal oxide than the first metal oxide, allowing an oxidation-reduction reaction to be more likely to occur in the second metal oxide.

Alternatively, the first metal contained in the first metal oxide making up the first resistance variable layer and the second metal contained in the second metal oxide making up the second resistance variable layer may be of different materials. In this case, the second metal may have a lower standard electrode potential than the first metal. The standard electrode potential has characteristics ire which the higher the value the standard electrode potential of a metal has, the less likely the metal is to undergo oxidation. Accordingly, an oxidation-reduction reaction is more likely to occur in the second metal oxide with a relatively low standard electrode potential. The phenomenon of a change in resistance is considered to arise due to a change in the resistance value (degree of oxygen deficiency) of the second metal oxide having a high resistance, which is induced by a change in a filament (conduction path) in response to the occurrence of an oxidation-reduction reaction in the very small local region formed in the second metal oxide.

For example, oxygen-deficient tantalum oxide ($TaO_x$) may be used for the first metal oxide, and titanium oxide ($TiO_2$) may be used for the second metal oxide. This provides a stable resistance change operation. Titanium (with a standard electrode potential of −1.63 eV) is a material having a lower standard electrode potential than tantalum (with a standard electrode potential of −0.6 eV). In this manner, an oxide of metal having a lower standard electrode potential than the first metal oxide is used for the second metal oxide, allowing an oxidation-reduction reaction to be more likely to occur in the second metal oxide. In another possible combination of the first metal oxide and the second metal oxide, aluminum oxide ($Al_2O_3$) may be used for the second metal oxide making up a high-resistance layer. For example, oxygen-deficient tantalum oxide ($TaO_x$) may be used for the first metal oxide, and aluminum oxide ($Al_2O_3$) may be used for the second metal oxide.

The resistance change phenomenon in the resistance variable layer 126 having a layered structure is considered to be produced in the following manner. An oxidation-reduction reaction occurs in the very small local region formed in the second metal oxide having a high resistance, which induces a change in a filament (conduction path) in the local region, resulting in a change in the resistance value of the second metal oxide.

That is, when a positive voltage with reference to the voltage across the first electrode 124 is applied to the second electrode 128 to be connected to the second metal oxide, oxygen ions in the resistance variable layer 126 are attracted toward the second metal oxide. This causes an oxidation reaction to occur in the very small local region formed in the second metal oxide, resulting in a reduction in the degree of oxygen deficiency. As a result, a filament in the local region is less likely to be formed, causing an increase in resistance value.

Conversely, when a negative voltage with respect to the voltage across the first electrode 124 is applied to the second electrode 128 to be connected to the second metal oxide, oxygen ions in the second metal oxide are moved toward the first metal oxide. This causes a reduction reaction to occur in the very small local region formed in the second metal oxide, resulting in an increase in degree of oxygen deficiency. As a result, a filament in the local region is more likely to be formed, causing a reduction in resistance value.

The second electrode 128 connected to the second metal oxide having a lower degree of oxygen deficiency is made of, for example, a material having a higher standard electrode potential than the metal contained in the second metal oxide, such as platinum (Pt), iridium (Ir), or palladium (Pd), and the material of the first electrode 124. The first electrode 124 connected to the first metal oxide having a higher degree of oxygen deficiency may be made of a material having a lower standard electrode potential than the metal contained in the first metal oxide, such as tungsten (W), nickel (Ni), tantalum (Ta), titanium (Ti), aluminum (Al), tantalum nitride (TaN), or titanium nitride (TiN). The standard electrode potential has characteristics in which the higher the value the standard electrode potential of a metal has, the less likely the metal is to undergo oxidation.

That is, the standard electrode potential V2 of the second electrode 128, the standard electrode potential Vr2 of the metal contained in the second metal oxide, the standard electrode potential Vr1 of the metal contained in the first metal oxide, and the standard electrode potential V1 of the first electrode 124 may satisfy the relationships of Vr2<V2 and V1<V2, or may satisfy the relationships of V2>Vr2 and Vr1≥V1.

With the configuration described above, an oxidation-reduction reaction selectively occurs in the second metal oxide in the vicinity of the interface between the second electrode 128 and the second metal oxide, making the resistance change phenomenon stable.

More desirably, the resistance variable layer 126 at least has a layered structure in which a first resistance variable layer having a composition expressed by $TaO_x$ (where 0≤x<2.5) and a second resistance variable layer having a composition expressed by $TaO_y$ (where x<y<2.5) are stacked. It is to be anticipated that the resistance variable layer 126 may further include other layers, for example, a third resistance variable layer made of a metal oxide other than tantalum oxide, as necessary.

Here, $TaO_x$ may satisfy 0.8≤x<1.9, and $TaO_y$ may satisfy 2.1≤y<2.5. The second resistance variable layer composed of tantalum (hereinafter referred to as the "second tantalum-containing layer") may have a thickness greater than or equal to 1 nm and less than or equal to 8 nm. By stacking layers having different degrees of oxygen deficiency, the directions in which resistance changes occur in a bipolar resistance variable element are determined. For example, the second resistance variable layer is arranged near the second electrode 128, and the first resistance variable layer is arranged near the first electrode 124. In this configuration, the resistance variable element is set to high resistance by the application of a voltage in a direction in which the current flows from the second electrode 128 to the first electrode 124, and is set to low resistance by the application of a voltage in the opposite direction. It is to be anticipated that in a configuration in which the second resistance variable layer is in contact with the first electrode 124 and the first resistance variable layer is in contact with the second electrode 128, the relationships between the directions in which resistance changes occur and the directions in which voltage is applied are reversed.

Characteristics of Resistance Variable Element in Variable State

Figure 4:
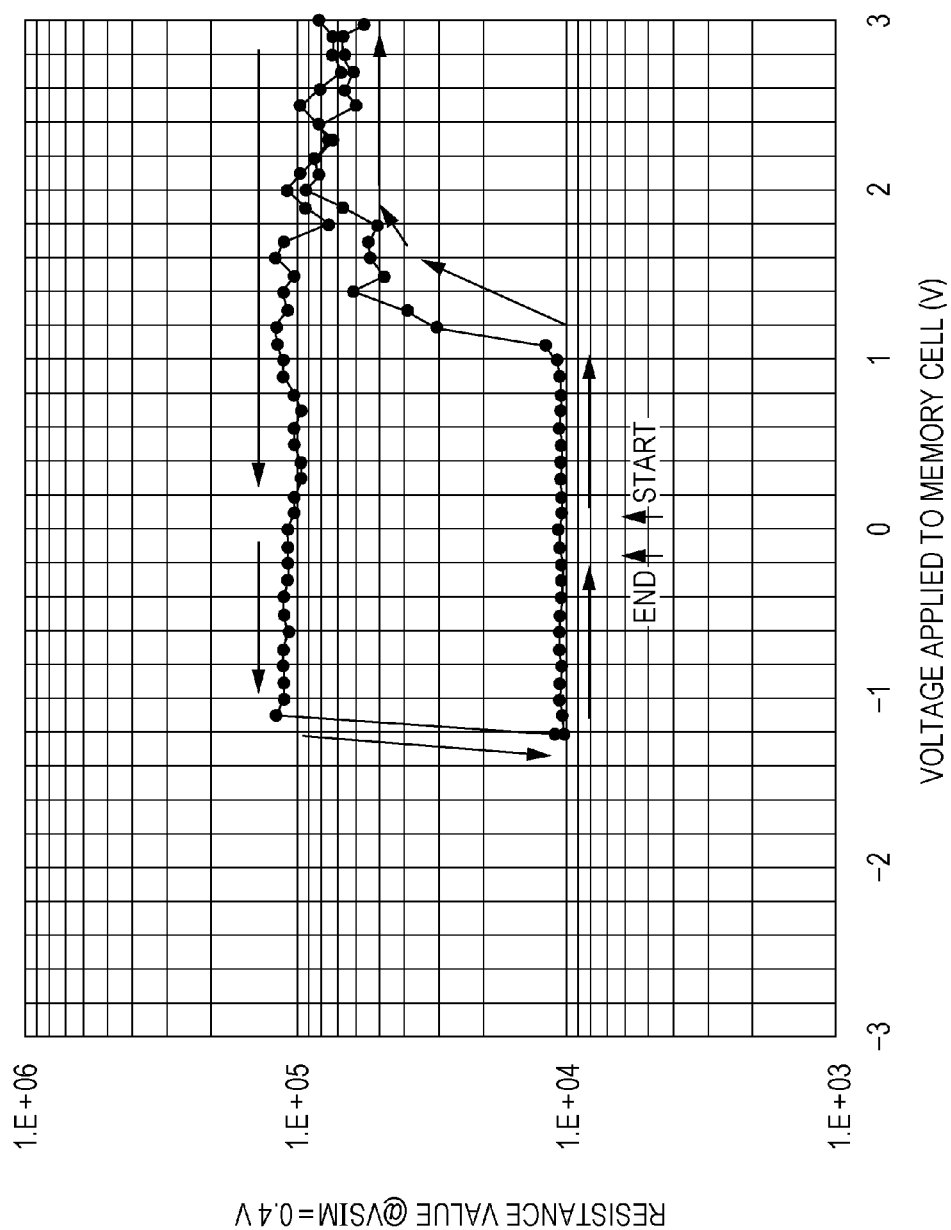
FIG. 4 is a diagram illustrating an example of the characteristics of a bipolar resistance variable element in a variable state.

FIG. 4 is a diagram illustrating an example of the characteristics of a bipolar resistance variable element in the variable state. The element configuration illustrated in FIG. 4 is as follows. The first electrode 124 is made of TaN, and the second electrode 128 is made of Ir. The resistance variable layer 126 at least has a layered structure in which a first tantalum-containing layer having a composition expressed by $TaO_x$ (where 0<x<2.5) and a second tantalum-containing layer having a composition expressed by $TaO_y$ (where x<y) are stacked. The first tantalum-containing layer is in contact with the first electrode 124, and the second tantalum-containing layer is in contact with the second electrode 128. The resistance variable layer 126 is manufactured so that $TaO_x$ satisfies 0.8≤x≤1.9 and $TaO_y$ satisfies 2.1≤y≤2.5. The second tantalum-containing layer has a thickness less than or equal to 8 nm, and the resistance variable layer 126 has an entire thickness less than or equal to 50 nm. The area of a portion where the first tantalum-containing layer is in contact with the first electrode 124 and the area of a portion where the second tantalum-containing layer is in contact with the second electrode 128 are equal to those of the resistance variable element 120 used for the measurements illustrated in FIG. 3.

In FIG. 4, the horizontal axis represents the voltage of an electrical signal to be applied, and the vertical axis represents the resistance value of the resistance variable element 120 (the resistance value is calculated from a current obtained when a read voltage VR is applied) after the application of an electrical signal. As revealed in FIG. 4, as the voltage level gradually increases in the positive polarity direction from the start position illustrated in FIG. 4, the resistance value gradually increases when the applied voltage exceeds +1.1 V, and reaches approximately 100 kΩ when the applied voltage is +2.0 V; as the voltage level gradually decreases in the negative polarity direction, the resistance value is reduced to approximately 10 kΩ when the applied voltage becomes below −1.1 V, and is then returned to the start position. In this case, the resistance variable layer 126 is configured such that the second resistance variable layer is arranged near the second electrode 128 and the first resistance variable layer is arranged near the first electrode 124. The application of an electrical signal in a direction in which the current flows from the second electrode 128 to the first electrode 124 is defined as positive-polarity application. In the positive-polarity application, the resistance value of the resistance variable element 120 changes to the HR level. The application of an electrical signal in the opposite direction, or in the direction in which the current flows from the first electrode 124 to the second electrode 128, is defined as negative-polarity application. In the negative-polarity application, the resistance value of the resistance variable element 120 changes to the LR level. The voltage level that causes a change from LR to HR is referred to as a high-resistance voltage (VH), and the voltage level that causes a change from HR to LR is referred to as a low-resistance voltage (VL). It is revealed in FIG. 4 that if the absolute value (|VH|) of the high-resistance voltage (VH) and the absolute value (|VL|) of the low-resistance voltage (VL) are each equal to approximately 2.0 V, the resistance value of the resistance variable element 120 can be sufficiently shifted reversibly between a low-resistance state and a high-resistance state by using a common power supply voltage.

Figure 5:
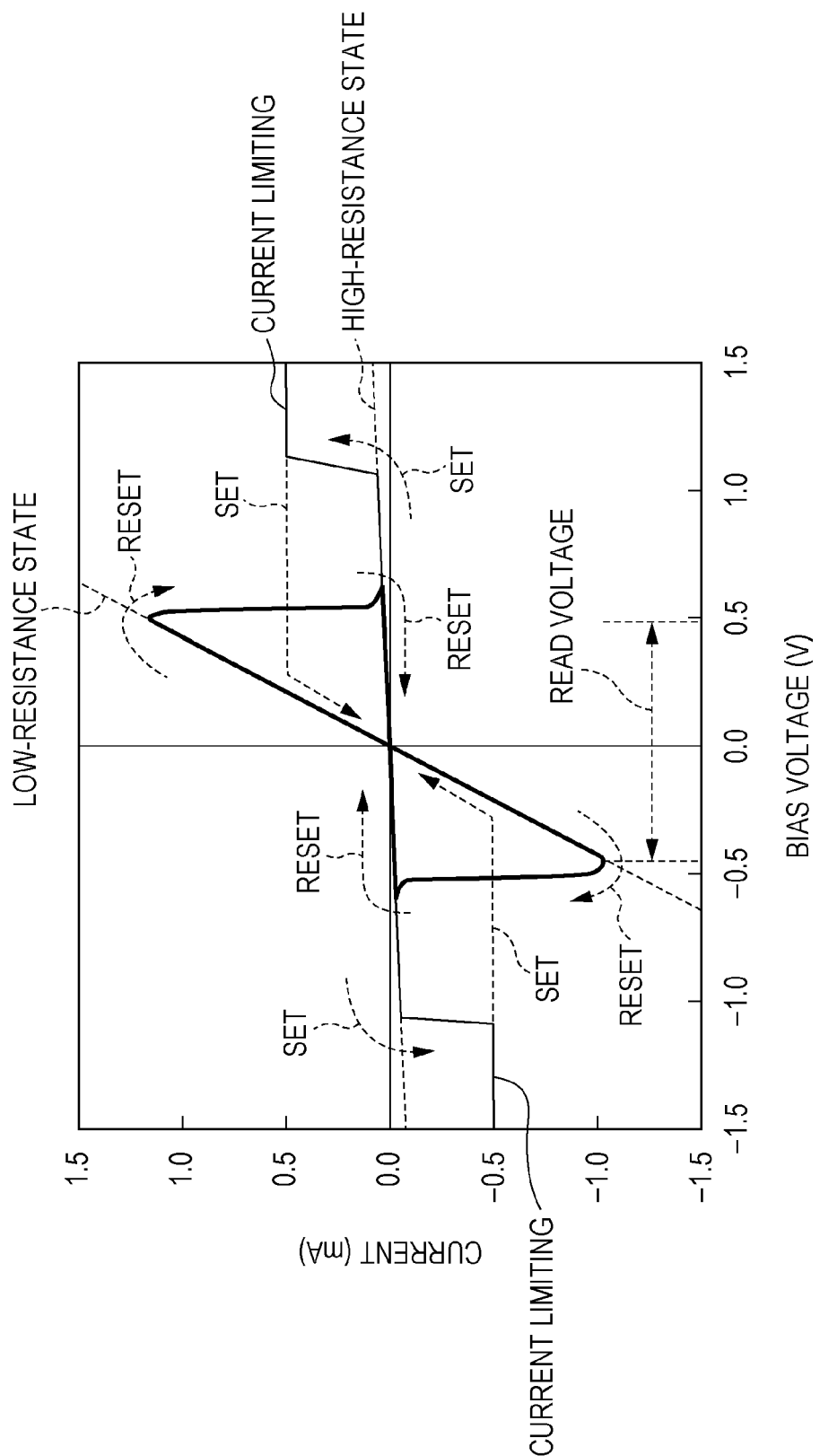
FIG. 5 is a schematic diagram illustrating an example of the characteristics of a unipolar resistance variable element in the variable state, which is disclosed in the related art.

FIG. 5 is a schematic diagram illustrating an example of the characteristics of a unipolar resistance variable element in the variable state, which are disclosed in International Electron Devices Meeting (IEDM) Technical Digest, 13-15 Dec. 2004, p. 587. As disclosed in this article, as known in the art, a resistance variable element having a resistance variable layer made of NiO, TiO$_2$, HfO$_2$, or ZrO$_2$ exhibits unipolar characteristics. In addition, the resistance variable layer made of one of the transition metal oxides described above is an insulator immediately after manufacturing, and transitions to the variable state due to the formation of a conduction path in the process in which a forming stress is applied.

Depending on a combination of the material of a resistance variable layer and the materials of electrodes, the material of impurities with which the material of the resistance variable layer is doped, and so forth, a unipolar element whose resistance varies symmetrically on both the positive voltage side and the negative voltage side is obtained. FIG. 5 illustrates the characteristics of such an element, by way of example.

In the example illustrated in FIG. 5, when the absolute value of a bias voltage exceeds 0.5 V, the element enters a reset state. That is, the resistance value of the element is shifted to the HR level. When the absolute value of the bias voltage exceeds 1.0 V, the element enters a set state. That is, the resistance value of the element is shifted to the LR level. The application of electrical signals having the same polarity and different voltages allows the element to reversibly transition between two resistance states. A unipolar resistance variable element having the characteristics illustrated in FIG. 5 may be controlled to set the resistance value to high resistance by the application of an electrical signal having a positive voltage greater than or equal to +0.5 V and less than +1 V and to set the resistance value to low resistance by the application of an electrical signal having a negative voltage less than or equal to −1 V (whose absolute value is greater than or equal to 1 V). Accordingly, the unipolar resistance variable element can be used as a bipolar resistance variable element. In this embodiment, either of a bipolar resistance variable element and a unipolar resistance variable element may be used.

The resistance variable element may be used as a multi-valued memory whose resistance value reversibly transitions among three or more variable resistance value ranges depending on a combination of the voltage (absolute value) of an electrical signal to be applied, the voltage width, and the number of times of application of an electrical signal. For example, an element including a resistance variable layer made of tantalum oxide exhibits good characteristics and is applicable to a multi-valued memory.

A change in the resistance of the resistance variable element (resistive RAM (ReRAM) element) described above occurs due to the generation of a conduction path, which electrically connects the second electrode 128 and the first electrode 124 to each other, in the resistance variable layer 126. This has been observed by cross-section analysis. The conduction path has a diameter less than or equal to 30 to 10 nm, which has been found to be even smaller than the width of wiring manufactured by state-of-the-art fine semiconductor process. That is, the characteristics of a resistance variable element described above can be obtained such that even in a case where the resistance variable element is manufactured by ultra-fine semiconductor process, which is regarded as reaching the limits of lithography processing, similar, stable resistance change characteristics can also be maintained.

In addition, the process for forming a resistance variable layer of a resistance variable element (ReRAM element) does not involve high-temperature processing over several hundreds of degrees centigrade. Thus, a heating process will not deteriorate the characteristics of a complementary metal-oxide-semiconductor (CMOS) transistor. That is, due to the excellent compatibility with the semiconductor process over a memory element including a floating-gate transistor, such as a flash memory, a resistance variable element has a feature that the reliability of resistance changes is not reduced even with the advent of increasingly finer manufacturing process technologies. Accordingly, even in a case where, for example, a logic circuit such as a controller and a resistance variable element are formed on the same chip, the resistance variable element can be formed with reduced influence on the characteristics of the logic circuit. In addition, the use of a common process for the resistance variable element and the logic circuit can reduce the manufacturing cost.

The term "variable state" refers to a state where a resistance value can reversibly transition among a plurality of variable resistance value ranges by the application of a plurality of different electrical signals.

The plurality of memory cells 91 of the memory cell array 90 may include a memory cell in the variable state and a memory cell in the initial state. In the memory cell array 90, data may be recorded by utilizing the difference as to whether each of the memory cells 91 is in the initial state or the variable state.

In the memory cell array 90, data may be recorded on each of the memory cells 91 by using any one of first type data, second type data, and third type data described below. The memory cell array 90 may include a memory cell 91 on which the third type data is recorded and a memory cell 91 on which either or both of the first type data and the second type data are recorded.

The initial resistance value range and the variable resistance value ranges may be set so that the resistance value of each of the memory cells 91 is within the initial resistance value range but is not within any of the variable resistance value ranges immediately after manufacturing. The initial resistance value range and the variable resistance value ranges may be set so that the resistance value of each of the memory cells 91 is within any of the variable resistance value ranges but is not within the initial resistance value range after the resistance value has changed to the variable state. It is well established that a memory cell including non-volatile resistive storage elements may have the characteristics described above. The memory cells 91 each having the characteristics described above can be manufactured using various known materials.

Each of the memory cells 91, when in the initial state, includes a state of being subjected to some electrical stress other than the forming stress that is an electrical stress causing the memory cell 91 to change to the variable state. Each of the memory cells 91, when in the initial state, includes a state where the resistance value of the memory cell 91 has changed within the initial resistance value range from the resistance value immediately after manufacturing by being subjected to, for example, some electrical stress other than the forming stress.

The control device 93 may be configured to be capable of reading recorded data by determining whether a selected memory cell 91 is in the initial state or the variable state.

The element configuration in the example illustrated in FIG. 3 is as follows. The first electrode 124 is made of TaN (tantalum nitride), the second electrode 128 is made of Ir (iridium), and the resistance variable layer 126 is made of tantalum oxide. The resistance variable layer 126 has an entire thickness less than or equal to 50 nm, and has a layered structure of two layers having different oxygen concentrations. A layer that is in contact with the first electrode 124 is a layer having a low oxygen concentration, and has a composition expressed by $TaO_x$, where $0<x<2.5$. A layer that is in contact with the second electrode 128 is a high-oxygen-concentration layer, and has a composition expressed by $TaO_y$, where $y \geq 2.1$, with a thickness of approximately 5.5 nm. The area of the surface of the resistance variable layer 126 that is in contact with the first electrode 124 and the area of the surface of the resistance variable layer 126 that is in contact with the second electrode 128 are each less than or equal to 0.25 $\mu m^2$.

Next, a specific description will be given of a change in the state of a memory cell. In the following, an "HR state" and an "LR state" are used. The term "HR state" refers to a state of a memory cell to which an HR pulse (or a high-resistance pulse) has been applied. The term "LR state" refers to a state of a memory cell to which an LR pulse (or a low-resistance pulse) has been applied.

As a forming stress, pulses each having a voltage of +3.5 V and a pulse width of 5 µs are cumulatively applied. The cumulative application of suitable pulses to each memory cell shifts the memory cell from an initial state (1) to an initial HR state (2) in FIG. 3. After the shift to the initial HR state, a low-resistance pulse (a pulse for causing the resistance value of the element to change from the first resistance value range to the second resistance value range: a second electrical signal) having a voltage of −2.4 V and a pulse width of 50 ns is applied. Accordingly, the memory cell is shifted to a digital ID set state (3). A pulse having a voltage of +1.8 V and a pulse width of 50 ns, which is a high-resistance pulse (a pulse for causing the resistance value of the element to change from the second resistance value range to the first resistance value range: a first electrical signal), is further applied to the memory cell in the digital ID set state, causing the resistance value of the memory cell to change to the first resistance value range. Subsequently, the memory cell is in the variable state. That is, when used for the digital ID data disclosed herein, the memory cell is maintained in the digital ID set state (3) in FIG. 3 and is used. In an example disclosed herein, the state (3) in FIG. 3 is used as the state of digital ID data, by way of example. Since variations in resistance value caused by manufacturing variations which are not duplicatable occur also in the initial state (1), such variations may be used by applying a method described below.

The step of pulse application is not limited to the procedure described above. For example, the digital ID set state (3) may be as follows. After a memory element has entered the variable state, the first electrical signal and the second electrical signal are alternately applied repeatedly a plurality of times to cause a transition between the HR state and the LR state a plurality of times and the step finally ends in the LR state. The last set state may be used as the digital ID set state (3).

The characteristics of variations in resistance value in the digital ID set state (3) in FIG. 3 will be described with reference to FIG. 6.

Figure 6:
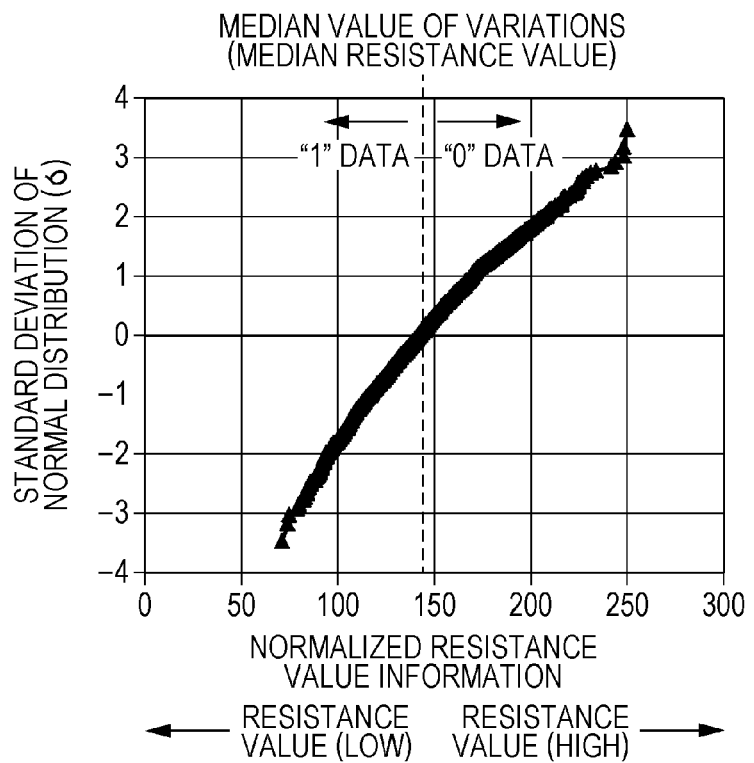
FIG. 6 is a diagram plotting the relationship between normalized resistance value information for a digital ID set state and the standard deviation of a normal distribution of variations in the resistance value of a memory cell in the digital ID set state.

FIG. 6 is a diagram plotting the relationship between normalized resistance value information for the digital ID set state (3) and the standard deviation of a normal distribution of variations in the resistance value of a memory cell in the digital ID set state (3).

As illustrated in FIG. 6, a normal distribution of the resistance value of a memory cell is substantially linear with respect to resistance value information. This shows a distribution phenomenon in which variations in the distribution are random. As illustrated in FIG. 6, resistance value information (also referred to as a median resistance value or a binary reference value) on the median value of the distribution of variations is detected. Then, each resistance value is compared in magnitude with the median resistance value, and is assigned digital data 1 or digital data 0. With the use of the randomness of resistance value variations, unique and random digital ID data can be created for each non-volatile memory device.

Figure 7:
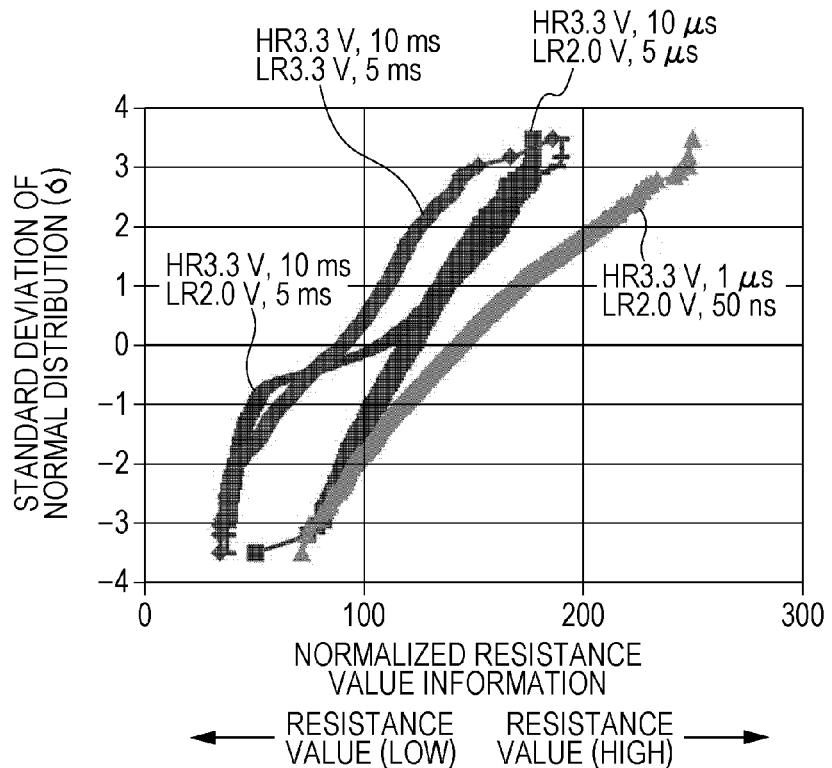
FIG. 7 is a diagram illustrating the distribution of variations in resistance value when the resistance value is shifted to the digital ID set state in various voltage pulse conditions.

The reason that the digital ID data disclosed herein is unduplicatable will be described with reference to FIG. 7. FIG. 7 illustrates the distribution of variations in resistance value when the resistance value is shifted to the digital ID set state (3) described above in various voltage pulse conditions. The voltage pulse conditions include a high-energy pulse condition with a voltage of 3.3 V, which is the upper limit of the breakdown voltage of a transistor, and a pulse width of 10 ms, which is approximately 100000 times the normal pulse width, and a weak pulse condition with a voltage of 2 V. Variations in resistance value were obtained under such voltage pulse conditions. In general, if a clear window is present between the distributions of written resistance values under the application condition of weak pulse energy and the application condition of strong pulse energy, it is possible to write the desired data by using the two application conditions. As revealed from FIG. 7, although there is a slight imbalance between the distributions and a slight difference between maximum values or difference between minimum values, the median value of each of the distributions generally overlaps the median value of another of the distributions. That is, it is found that a variation phenomenon has been obtained in which duplication of data, or artificially writing the desired data individually under different writing conditions with reference to the median value, is not theoretically possible.

As illustrated in FIG. 7, in a group of memory cells whose resistance values are within the same resistance value range, low resistance values and high resistance values are distributed. The reason for this may be as follows. Besides process variations and shape variations of the resistance variable elements, for example, memory cells on which forming has been completed randomly occur.

As described above, defect sites in a metal oxide are located at random for each memory cell, and a filament is formed so as to link the defect sites to each other by forming. Thus, even if a fixed electrical stress is applied to a plurality of memory cells in the initial state, memory cells on which forming has been completed occur statistically in a distributed manner. The present inventors have confirmed such occurrences by experiment beforehand. Accordingly, even if a uniform stress is applied to a plurality of memory cells, filaments are stochastically formed, and the periods of time during which the resistance values change to the initial HR state (2) described above differ from one element to another. Accordingly, the number or density of defect sites in a metal oxide contained in a resistance variable element varies for each element. Variations in the density and number of defect sites are specific to each element, and the magnitudes of resistance values resulting from the variations are also specific to each element.

Figure 8:
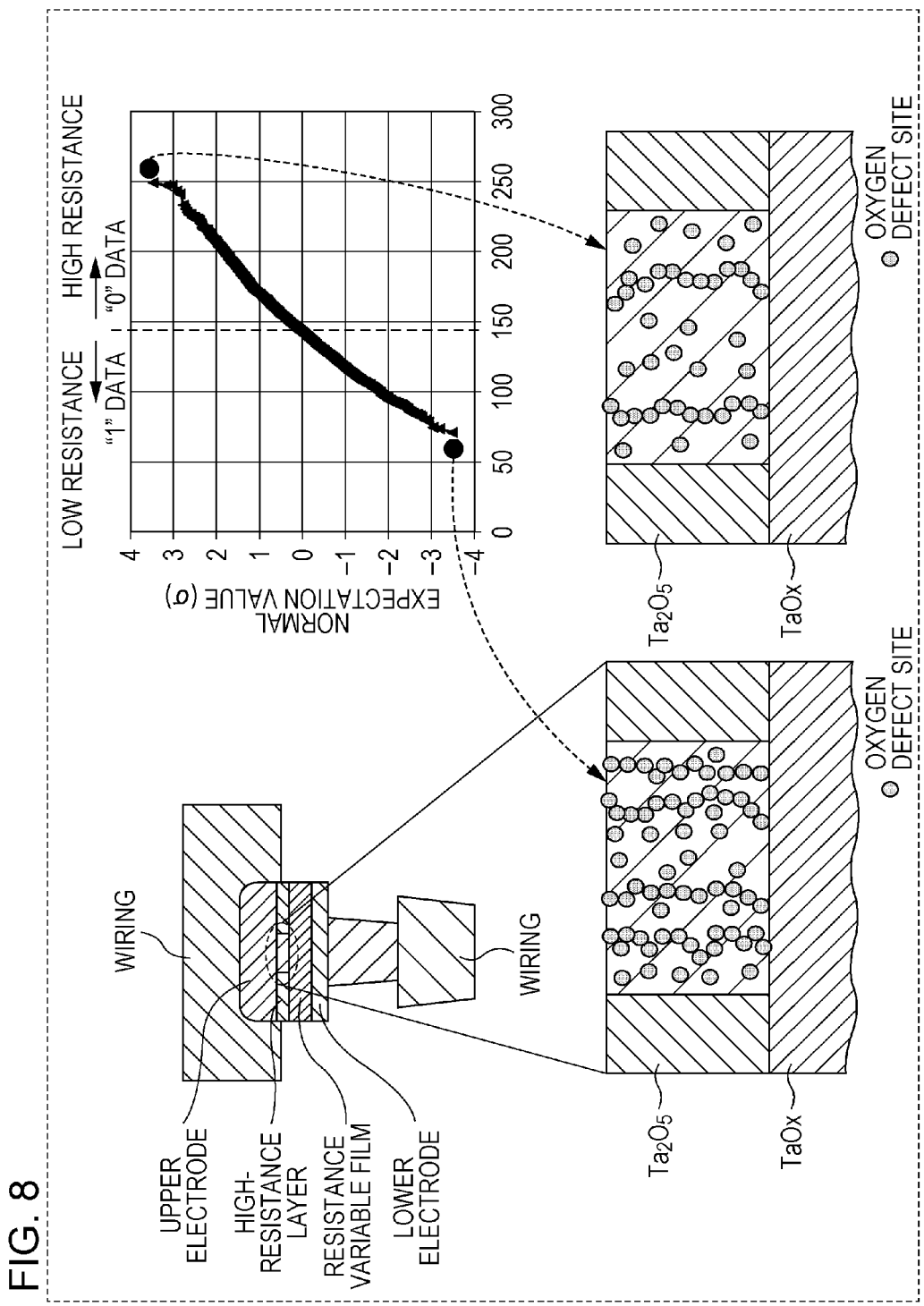
FIG. 8 is a diagram depicting that the number of filaments generated differs for each resistance variable element.

FIG. 8 depicts that the number of filaments generated differs for each resistance variable element. Due to the initial pulse application (forming), the locations and density of oxygen defect sites are random for each element. In addition, an element in which a relatively large number of defects have occurred has a low resistance value, whereas an element in which a relatively small number of defects have occurred has a high resistance value. As a result, variations occur. Such variations are uncontrollable.

As illustrated in FIG. 8, a resistance variable element in which a large number of oxygen defect sites have been formed and a filament path is likely to be formed has a low resistance value. In a resistance variable element including a portion which has a low density of oxygen defect sites, in contrast, a filament path is less likely to be formed, and thus the resistance variable element has a high resistance value. The resistance value of each resistance variable element varies, and such variations are artificially uncontrollable. A similar mechanism could be presumably used for a material which allows a filament path to be formed by linking oxygen defect sites or the like to each other.

In the memory cell structure illustrated in FIG. 2, when a positive voltage with reference to the voltage across the first electrode 124 is applied to the second electrode 128, such a voltage is defined to have a positive polarity.

In another example, the first electrode 124 and the second electrode 128 may be made of platinum (Pt), and the resistance variable layer 126 may be made of hafnium oxide. The thickness of the resistance variable layer 126 may be 30 nm, and an element region may circular with a diameter of 3 μm. In a case where the resistance variable layer 126 is made of $HfO_{1.6}$, the initial resistance value is approximately several megohms (MΩ), and the high resistance value range is approximately 1000 to 3000Ω, while the low resistance value range is approximately 100 to 300Ω. In this case, as a forming stress, for example, pulses each having a voltage of 2 to 3 V and a pulse width of 100 ns are cumulatively applied. A low-resistance pulse has a voltage of +1.0 V and a pulse width of 100 ns, and a high-resistance pulse has a voltage of −1.3 V and a pulse width of 100 ns.

Thresholds

In the example illustrated in FIG. 3, the lower limit of the initial resistance value range is greater than or equal to the upper limits of all the variable resistance value ranges. Specifically, the lower limit of the initial resistance value range may be greater than or equal to the upper limit of a variable resistance value range having the highest resistance value among the plurality of variable resistance value ranges. More specifically, the lower limit of the initial resistance value range may be equal to the upper limit of the first resistance value range having the highest resistance value among the two variable resistance value ranges.

In the example illustrated in FIG. 3, a first threshold is a value less than or equal to the lower limit of the initial resistance value range and greater than or equal to the upper limit of a variable resistance value range having the highest resistance value among the plurality of variable resistance value ranges. Specifically, the first threshold may be a value equal to the lower limit of the initial resistance value range and equal to the upper limit of a variable resistance value range having the highest resistance value among the plurality of variable resistance value ranges. More specifically, the first threshold may be equal to the upper limit of the first resistance value range having the highest resistance value among the two variable resistance value ranges. A resistance value equal to the first threshold may be included in the initial resistance value range, or may be included in a variable resistance value range having the highest resistance value among the plurality of variable resistance value ranges.

In the example illustrated in FIG. 3, a second threshold is a value less than or equal to the lower limit of the variable resistance value range having the highest resistance value among the plurality of variable resistance value ranges and greater than or equal to the upper limit of a variable resistance value range having the lowest resistance value among the plurality of variable resistance value ranges. Specifically, the second threshold may be a value less than or equal to the lower limit of the first resistance value range having the highest resistance value among the two variable resistance value ranges and greater than or equal to the upper limit of the second resistance value range having the lowest resistance value among the two variable resistance value ranges. More specifically, the second threshold may be equal to the lower limit of the first resistance value range or the upper limit of the second resistance value range. The first resistance value range and the second resistance value range may be adjacent to each other. That is, the value at the lower one of two end points defining the first resistance value range may be equal to the value at the higher one of two end points defining the second resistance value range. A resistance value equal to the second threshold may be included in a resistance value range including a higher resistance value than the second threshold among the plurality of variable resistance value ranges, or may be included in a resistance value range including a lower resistance value than the second threshold among the plurality of variable resistance value ranges.

Depending on the configuration of the memory cells 91, the resistance values of the memory cells 91 may be lower than any of the variable resistance value ranges immediately after manufacturing. That is, the initial resistance value range may be lower than the variable resistance value ranges. Specifically, these characteristics are implemented when, for example, each of the memory cells 91 includes a resistance variable element having a resistance variable layer made of an iron oxide.

More specifically, iron oxides, namely, $Fe_3O_4$, FeO, and $Fe_2O_3$, have resistivities in descending order, where the resistivity of $Fe_3O_4$ is the highest. For example, the following element structure may be used. The first electrode 124 is made of Pt (platinum), the second electrode 128 is made of Pt (platinum), the resistance variable layer 126 is made of $Fe_3O_4$, and the resistance variable layer 126 has an entire thickness less than or equal to 50 nm.

If the area of the surface of the resistance variable layer 126 that is in contact with the first electrode 124 and the area of the surface of the resistance variable layer 126 that is in contact with the second electrode 128 are each less than or equal to 0.25 $\mu m^2$, the initial resistance value is as low as approximately 200Ω. Applying a pulse having the same polarity as that of the first electrical signal and having a voltage whose absolute value is 3.5 V to a memory cell 91 in the initial state with a pulse width of 10 μs a predetermined number of times allows the memory cell to be shifted to a state (high-resistance state of 2 KΩ to 8 KΩ) with a resistance value higher than the initial resistance value. The reason for this may be as follows. The oxidation of the contact interface between the second electrode 128 and the resistance variable layer 126 progresses and a resistance layer of $Fe_2O_3$ in the insulating state is formed.

Thereafter, the application of the second electrical signal having a voltage whose absolute value is 2.4 V enables the memory cell 91, which is in the high-resistance state, to be shifted to the second resistance value range of 300Ω to 500Ω, and the application of the first electrical signal having a polarity different from that of the second electrical signal and having a voltage whose absolute value is 2.4 V enables the memory cell 91, which is in the high-resistance state, to be shifted to the first resistance value range of 2 KΩ to 8 KΩ. In this case, it is easy and preferable to use variations in initial resistance as digital ID data.

The control device 93 may be configured to be capable of reading recorded data by selectively executing a first read mode or a second read mode. The first read mode is a mode of determining whether or not the resistance value of a selected memory cell 91 is higher than the first threshold. The second read mode is a mode of determining whether or not the resistance value of a selected memory cell 91 is higher than the second threshold. Each of the first threshold and the second threshold may not necessarily be a fixed value but may be configured to be made variable as desired.

The data recorded on the non-volatile memory device 100 according to this embodiment may include either or both of the first type data and the second type data. The first type data may be recorded by utilizing the difference as to whether or not the resistance value of each of the memory cells 91 is within the initial resistance value range. The second type data may be recorded by utilizing the difference as to whether or not the resistance value of each of the memory cells 91 is within at least one variable resistance value range without utilizing the difference as to whether or not the resistance value of each of the memory cells 91 is within the initial resistance value range. In this embodiment, third type data for generating digital ID data by using variations in the resistance value of a memory cell whose resistance value is within any of the resistance value ranges described above is further included.

In this case, the memory cell array 90 may have a first write address area and a second write address area. The first write address area may have recorded therein either or both of the first type data and the second type data, and the second write address area may store a memory cell in a resistance value state on which the digital ID data is based. The first write address area and the second write address area may not necessarily be separate physical areas. For example, the memory cells 91 may be distributed into the first write address area and the second write address area for each address according to a predetermined rule. This makes it difficult to identify the physical location of digital ID data, and improves tamper resistance.

The step of applying a forming stress to a plurality of memory cells constituting the memory cell array 90 may be performed selectively as desired. Accordingly, the proportion of the capacity and the arrangement of the first write address area and the second write address area may be modified and selected as desired.

FIG. 9 illustrates an example of resistance values continuously read from a memory cell whose resistance value is within the same variable resistance value range according to the first embodiment. The term "a resistance value is within at least one variable resistance value range" refers to that a memory cell is in an identical resistance state. That is, a two-valued memory cell is in the low-resistance state but not in the high-resistance state, for example. In this case, this is equivalent to that the memory cell is in the digital ID set state (3) in FIG. 3.

It was observed that an element reversibly transitioned between the high-resistance state and the low-resistance state by the alternate application of the high-resistance pulse and the low-resistance pulse. Thereafter, the high-resistance pulse was applied to the element, which was in the low-resistance state, once to bring the element into the high-resistance state. Then, the read operation was executed consecutively 1000 times without the application of the low-resistance pulse or the high-resistance pulse to read the respective pieces of resistance value information. The read operation was performed at intervals of 5 μs.

In FIG. 9, the horizontal axis represents the number of times the read operation has been performed, and the vertical axis represents normalized resistance value information. In FIG. 9, fluctuations of the resistance values of three elements having the same configuration are illustrated. As used here, the resistance value information is obtained by a read circuit based on a discharge scheme described below. A larger value of the resistance value information indicates a higher resistance value, and a smaller value of the resistance value information indicates a lower resistance value. It is found in FIG. 9 that, when an element in an identical resistance state is repeatedly read, the resistance value of the element randomly increases and decreases.

As used herein, a change in resistance value or a fluctuation in resistance value is a phenomenon in which a resistance value read from the same memory cell in a state where an electrical pulse for causing the resistance state to change is not applied, or in an identical resistance state, changes with time.

Figure 10A:
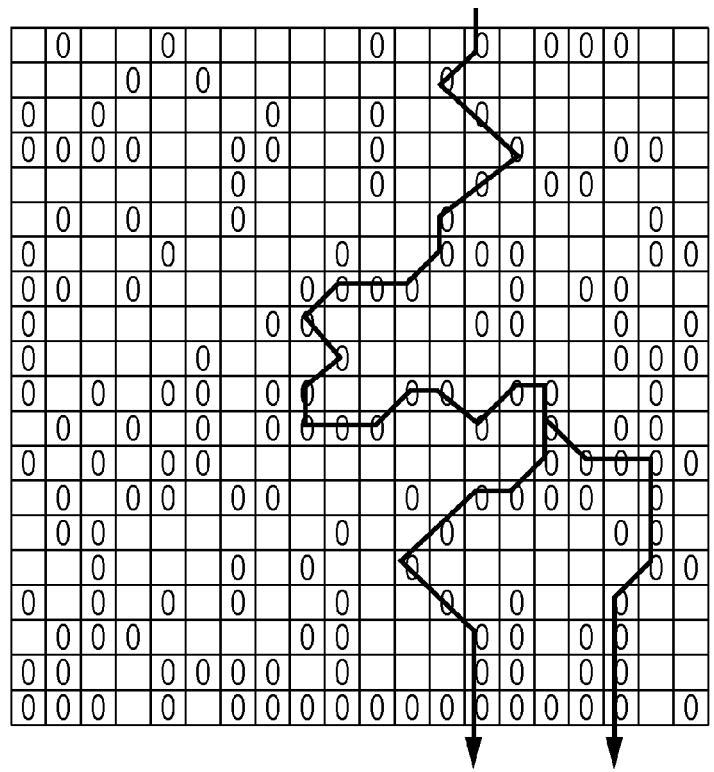
FIG. 10A is a diagram illustrating an example of a result of simulating the formation of filaments in a resistance variable layer (for example, a local region) during forming by using a percolation model.
Figure 10B:
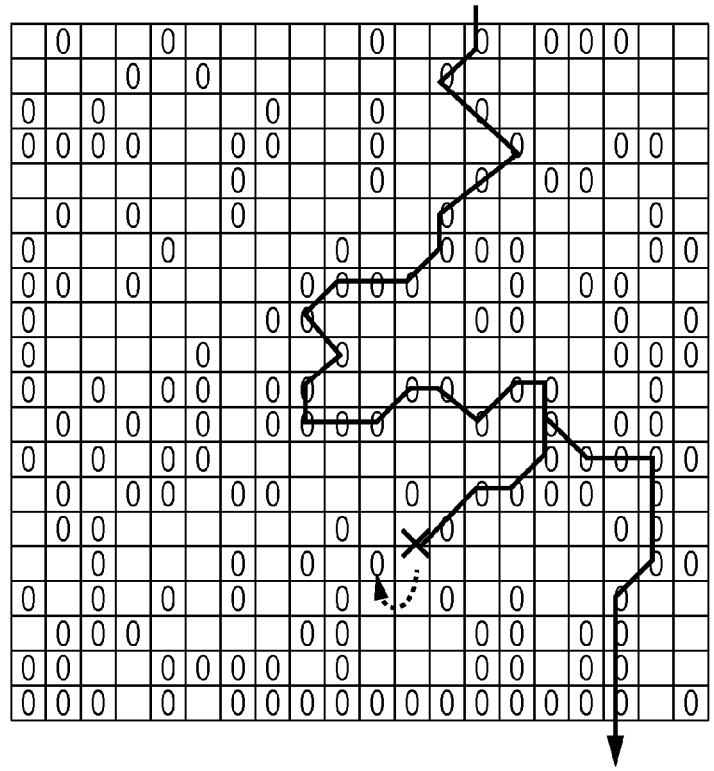
FIG. 10B is a diagram illustrating an example of a result of simulating the formation of filaments in a resistance variable layer (for example, a local region) during forming by using a percolation model.

FIG. 10A and FIG. 10B are diagrams illustrating examples of a result of simulating the formation of filaments in a resistance variable layer (for example, a local region) during forming by using a percolation model.

The percolation model is a model based on the theory that when the density of defect sites or the like randomly distributed in a resistance variable layer exceeds a certain threshold, the defect sites or the like are more likely to be linked to each other. The term "defect", as used herein, refers to the deficiency of oxygen in a metal oxide, for example, and the density of defect sites also corresponds to the degree of oxygen deficiency. That is, as the degree of oxygen deficiency increases, the density of defect sites also increases.

In the simulation illustrated in FIG. 10A and FIG. 10B, oxygen ion sites in the resistance variable layer were approximately assumed as lattice-shaped sectioned areas (sites). Based on this assumption, filaments formed by defect sites which were stochastically generated were determined by simulation. In FIG. 10A and FIG. 10B, sites containing "0" represent defect sites formed in the resistance variable layer. On the other hand, vacant sites represent sites occupied by oxygen ions, and are high-resistance areas which are free of conduction paths. An arrow indicates a cluster of defect sites (an aggregation of defect sites connected to each other within a single site in one of the vertical, horizontal, and diagonal directions). The cluster of defect sites corresponds to a filament formed in the resistance variable layer when a voltage is applied in the vertical direction in FIG. 10A and FIG. 10B, that is, a path along which a current flows.

As illustrated in FIG. 10A, a filament which allows a current to flow between the top and bottom surfaces of the resistance variable layer is constituted by a cluster of defect sites that connects randomly distributed defect sites from the upper end to the lower end. Based on this percolation model, the number and shape of filaments are stochastically determined. The distribution of the numbers and shapes of filaments constitutes variations in the resistance value in the resistance variable layer.

The application of a high-resistance pulse described above causes oxygen ions to be introduced into a filament, and the oxygen ions are coupled to defect sites, thereby disconnecting some filament paths. Accordingly, a shift to the high-resistance state occurs. Conversely, the application of a low-resistance pulse causes the oxygen ions to be released, and defect sites are generated. This causes a filament path to be reproduced, and a shift to the low-resistance state occurs. If there is a sufficient difference in the number of filament paths between the resistance states, the difference in resistance value increases and the margin for judgment of the resistance value increases.

A description will now be given of the mechanism of the phenomenon of fluctuation of the resistance value of an element in an identical resistance state in the manner illustrated in FIG. 9.

The shape, number, and thickness of filament paths that determine the resistance value in each resistance state are not stable in time. That is, a defect site is generated by oxygen ions exiting from an oxygen site, or a defect site disappears In response to the supply of oxygen ions to a defect site, resulting in a subtle change in the shape, number, and thickness of filament paths. This is observed as a temporal fluctuation of the resistance value. FIG. 10B illustrates an example in which one of the filament paths illustrated in FIG. 10A is disconnected merely by the replacement of one defect site with an adjacent site. In this case, the resistance value slightly increases. Conversely, a new filament path may be generated by the replacement of a defect site with an adjacent site although not illustrated in FIGS. 10A and 10B. In this case, the resistance value slightly decreases. The phenomenon of fluctuation of a resistance value illustrated in FIG. 9 is considered to be produced by such a mechanism. In practice, multiple filament paths, such as those illustrated in FIGS. 10A and 10B, are used, and the total number of filament paths does not significantly change although it slightly increases or decreases. That is, in the phenomenon of fluctuation of a resistance value, a significant change in the filament paths which would cause the resistance state of a memory cell to change to another resistance state is considered not to occur.

The phenomenon of fluctuation of a resistance value using the mechanism described above may apply to any resistance variable element whose resistance value changes due to the movement of oxygen ions in an oxide. Specifically, a memory cell having the property described above may be, for example, an element formed by stacking a first electrode, a metal oxide, and a second electrode in this order. Alternatively, for example, an element formed by stacking a first electrode, a transition metal oxide, and a second electrode in this order may be used.

In a manner described above, memory cells used for a resistive memory device have the phenomenon that the resistance values written therein slightly fluctuate. The digital ID data obtained by identifying 1 or 0 of digital data from the relationship in magnitude between a resistance value and the median resistance value illustrated in FIG. 6 contains error data caused by the fluctuation of the resistance value. Since the area in the vicinity of the median resistance value is located in the "center" of the distribution of variations in the resistance value, the number of memory cells whose resistance values are distributed around the median resistance value is the largest. As described above, the resistance values of the memory cells whose resistance values are located around the median resistance value randomly fluctuate, resulting in a large number of erroneous bits occurring randomly.

The present inventors have found a problem in that a resistance value written in a memory cell may not contribute to the stable generation of digital ID data because, depending on the length of the period of time during which the memory cell is left untreated (hereinafter referred to as the "left-untreated time") and temperature environment, as well as the power supply environment and the like of a non-volatile resistive memory device, the optimal median resistance value changes, thus making the error rate unstable. This problem will be described with reference to FIG. 11.

Figure 11:
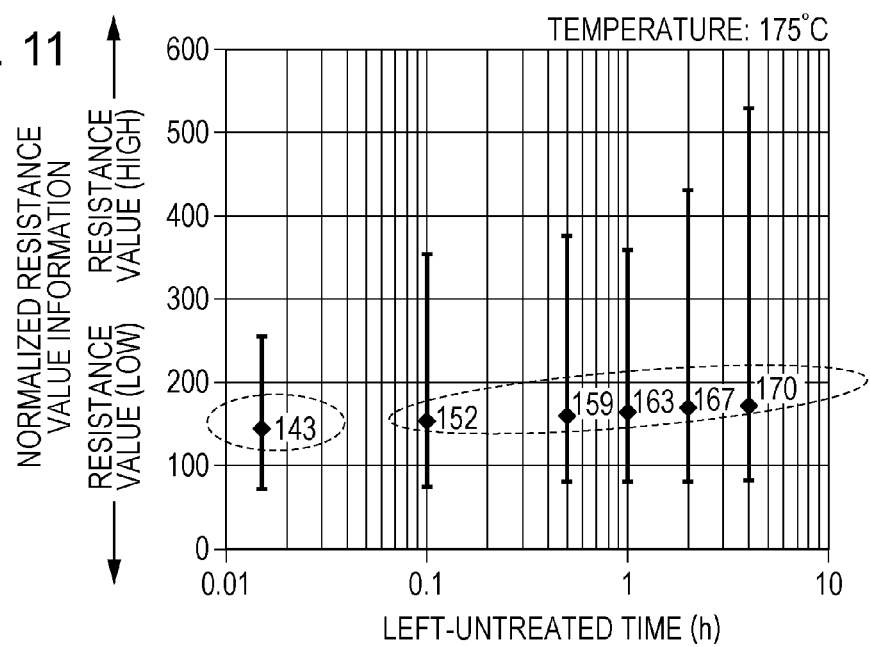
FIG. 11 is a diagram illustrating variation ranges and resistance median values when the resistance values of memory cells with a predetermined number of bits, which are written in the digital ID set state illustrated in FIG. 3, are read at intervals of a left-untreated time.

FIG. 11 illustrates variation ranges and resistance median values when the resistance values of memory cells with a predetermined number of bits, which are written in the digital ID set state illustrated in FIG. 3, are read at intervals of the left-untreated time.

It is assumed that 1 Kbits were used for measurement and the memory cells were left untreated at a temperature of 175° C. in order to accelerate the deterioration with respect to the left-untreated time. As revealed from FIG. 11, the variation range expands as the left-untreated time increases. It is also revealed that, as surrounded by broken lines, the resistance median value gradually increases. That is, it is found that, as the left-untreated time increases, the distribution of resistance values is shifted to the high-resistance side.

Figure 12:
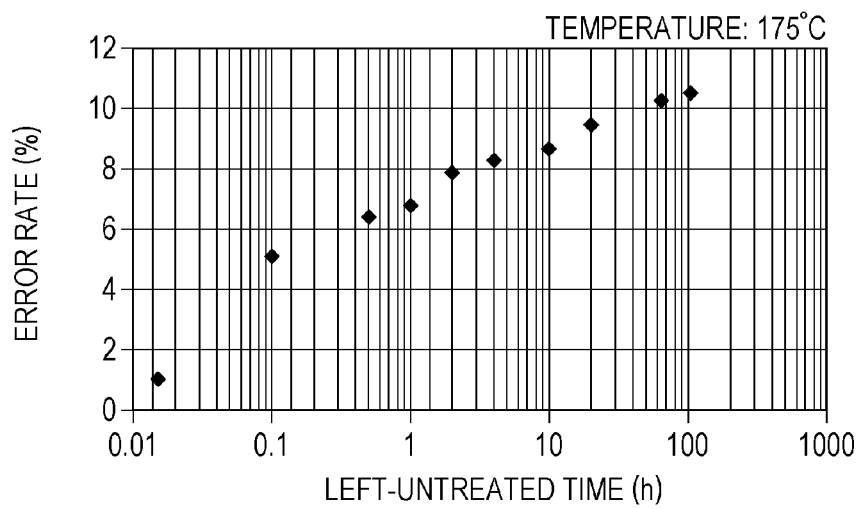
FIG. 12 is a diagram illustrating the relationship between the error rate and the left-untreated time when written digital ID data is extracted using the initial resistance median value illustrated in FIG. 11.

FIG. 12 illustrates the relationship between the error rate and the left-untreated time when written digital ID data is extracted using the initial resistance median value (i.e., 143) illustrated in FIG. 11. The error rate is the proportion of extracted data different from the initial ID data. As revealed from FIG. 12, the optimal resistance median value shifts with increasing left-untreated time, resulting ire a rapid increase in error rate. This phenomenon significantly changes depending not only on the left-untreated time but also on the change in ambient temperature or the change in the power supply voltage of a non-volatile resistive memory device.

Figure 13:
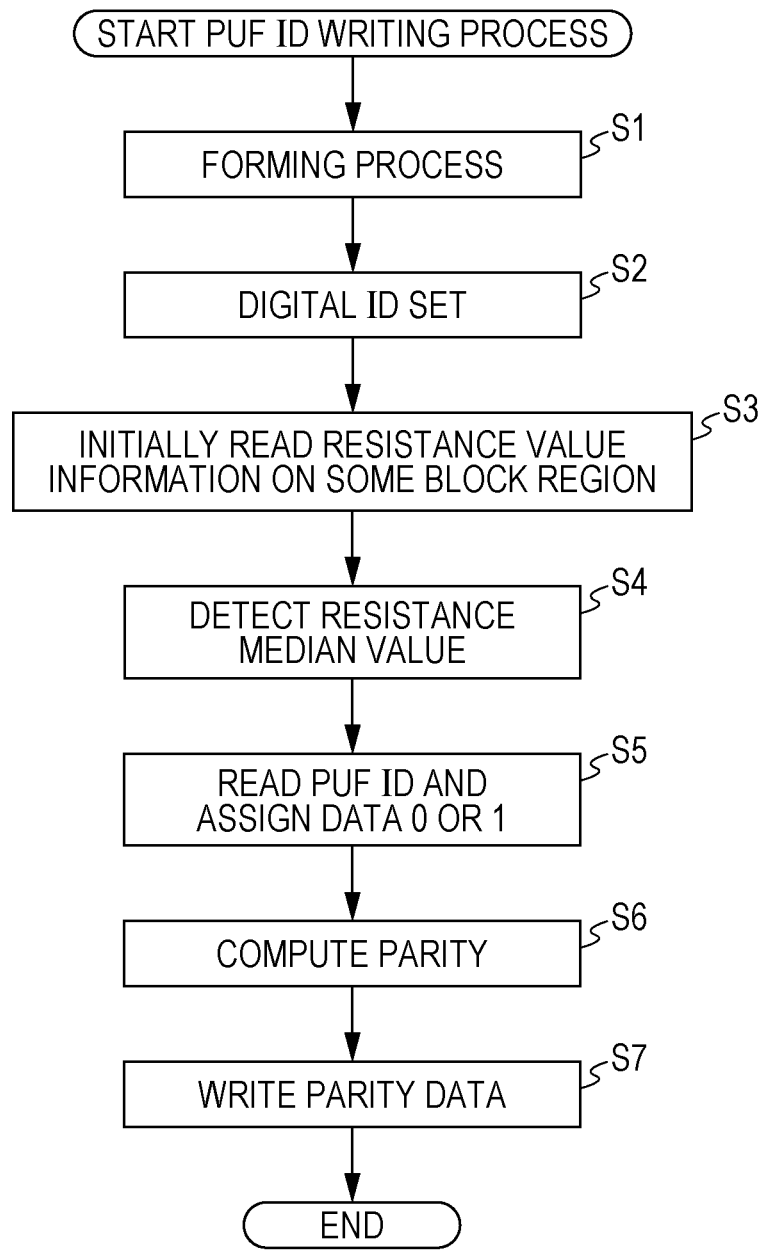
FIG. 13 is a flowchart illustrating an example of a process for generating digital ID data and writing the digital ID data to the non-volatile memory device.
Figure 14:
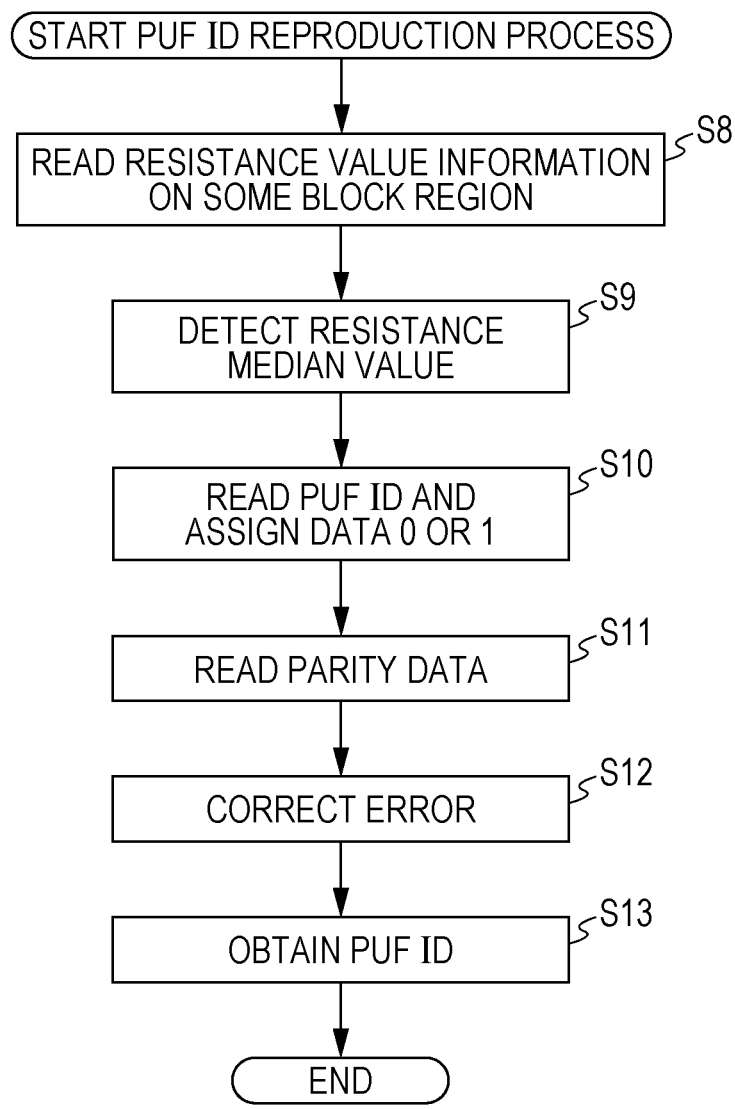
FIG. 14 is a flowchart illustrating an example of a process for reproducing the digital ID data.

Accordingly, the inventors have devised processes illustrated in FIG. 13 and FIG. 14.

FIG. 13 illustrates a specific example of a process for generating digital ID data and writing the digital ID data to the non-volatile memory device 100. The illustrated process is executed, for example, in the inspection step before the non-volatile memory device 100 is shipped from the factory.

FIG. 14 illustrates a specific example of a process for reproducing the digital ID data. The illustrated process is executed, for example, each time the non-volatile memory device 100 is used in the market after the non-volatile memory device 100 has been shipped from the factory.

As described previously, since generated digital ID data contains error data, error correction is necessary to constantly obtain the true correct ID data. Accordingly, as in FIG. 13 and FIG. 14, the process for the inspection step before shipment of the non-volatile memory device 100 and the process for field use in which the non-volatile memory device 100 is used in the market are different.

During inspection before shipment, as illustrated in the drawings, each memory cell of a non-volatile memory device is not in the variable state but in the initial state where the resistance value of the memory cell is close to an insulation resistance value. In the process illustrated in FIG. 13, in step S1, the forming process for applying a forming stress, as described in conjunction with FIG. 3, is executed, and each memory cell is shifted to the initial HR state (2) illustrated in FIG. 3. Then, in step S2, a low-resistance pulse is applied to each memory cell to set the memory cell to the digital ID set state (3) in FIG. 3. Then, in step S3, pieces of resistance value information on a plurality of memory cells in the digital ID set state are read. In step S4, the median value of the distribution of variations in resistance value is computed from the read pieces of resistance value information, and is held. In step S5, pieces of resistance value information are read again from the memory cells in the digital ID set state (3), and digital ID data is generated from the relationships between the values indicated by the read pieces of resistance value information and the held median value described above.

FIG. 15 illustrates an example of the digital ID data. As described above, the value indicated by resistance value information on each memory cell in the digital ID set state is compared with a threshold, that is, the median value of the distribution of variations in resistance value. If the value indicated by the resistance value information is smaller than the median value, data "1" is assigned to the corresponding memory cell. If the value indicated by the resistance value information is larger than the median value, data "0" is assigned to the corresponding memory cell. Accordingly, digital ID data capable of uniquely identifying the non-volatile memory device 100, which utilizes the artificially uncontrollable resistance values of the memory cells, can be obtained.

Referring back to FIG. 13, in step S6, parity data used to correct a data error is computed based on the digital ID data. In step S7, the parity data is recorded on a different memory cell.

Now, referring to FIG. 14, when the non-volatile memory device 100 is used in a field, as in steps S3 and S4 in the process during inspection, in step S8, pieces of resistance value information on a plurality of memory cells in the digital ID set state are read, and in step S9, the median value of the distribution of variations in resistance value is computed from the read pieces of resistance value information, and is held. Further, in step S10, pieces of resistance value information are read again from the memory cells in the digital ID set state (3), and digital ID data is generated from the relationships between the read pieces of resistance value information and the held median value described above. In step S11, the parity data stored in advance during inspection is read. Then, in step S12, error data in the digital ID data obtained in S10 is corrected by using the parity data. As a result, in step S13, constantly the same, true digital ID data is obtained.

Figure 16:
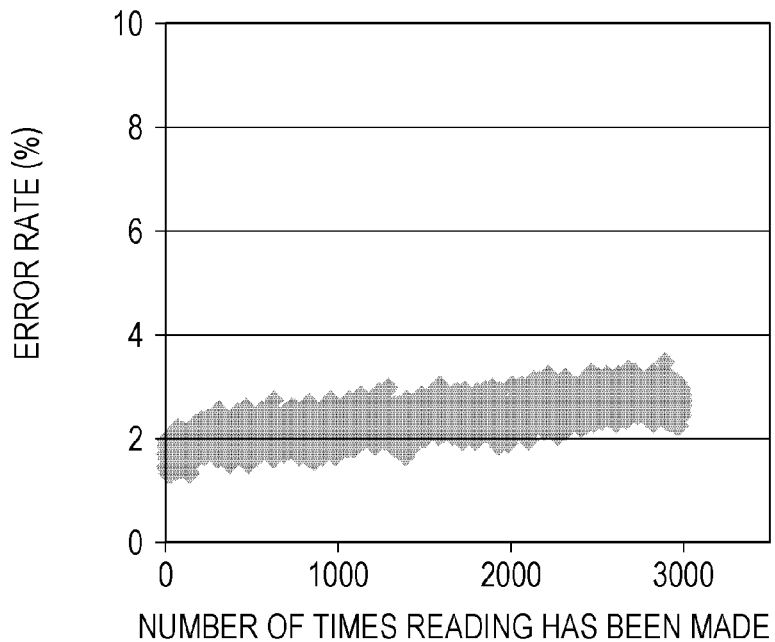
FIG. 16 is a diagram illustrating a shift in the data error rate before error correction.

FIG. 16 illustrates a shift in the data error rate before error correction. This shift is a shift in data error rate before error correction in a case where an optimal resistance median value was detected and digital ID data was generated by using the detected resistance median value in the process for field use illustrated in FIG. 14. The digital ID data before the error correction, described previously, is referred to as raw digital ID data. In FIG. 16, the horizontal axis represents the number of times digital ID data was read, and the vertical axis represents the error rate of read digital ID data. As revealed from FIG. 16, the increase in error rate is reduced and good results with an error rate of 2% to 3% are obtained.

Figure 17:
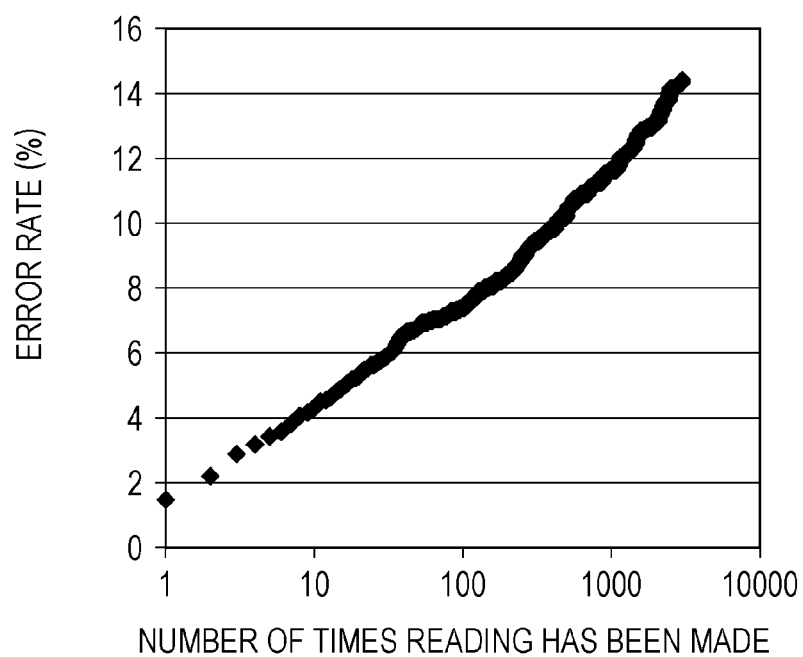
FIG. 17 is a diagram illustrating the relationship between the number of times reading has been made and the cumulative error rate.

Further features of the present disclosure include cumulative error rate. FIG. 17 illustrates the relationship between the number of times reading has been made and the cumulative error rate. The cumulative error rate is obtained as follows. Raw digital ID data is read a plurality of times, new different bits which are erroneous are sequentially added to obtain the cumulative number of erroneous bits, and an error rate is determined from the cumulative number of erroneous bits. While the error rate for each read of raw digital ID data is as low as 2 to 3% in FIG. 16, different bits are added one after another. Thus, the cumulative error rate increases in accordance with the number of times raw digital ID data has been read. In FIG. 17, it is found that 14% of bits became erroneous when digital ID data was generated 2500 times. That is, each time raw digital ID data is read, an error occurs in a different bit, and it is understood that ID data before error correction changes from moment to moment. This feature prevents, in case of machine learning attacks described above, results of learning from being fixed to thwart analysis of the true digital ID data, and may thus have excellent resistance to hacking.

Next, a specific example configuration for implementing a scheme according to an embodiment of the present disclosure will be described.

Figure 18:
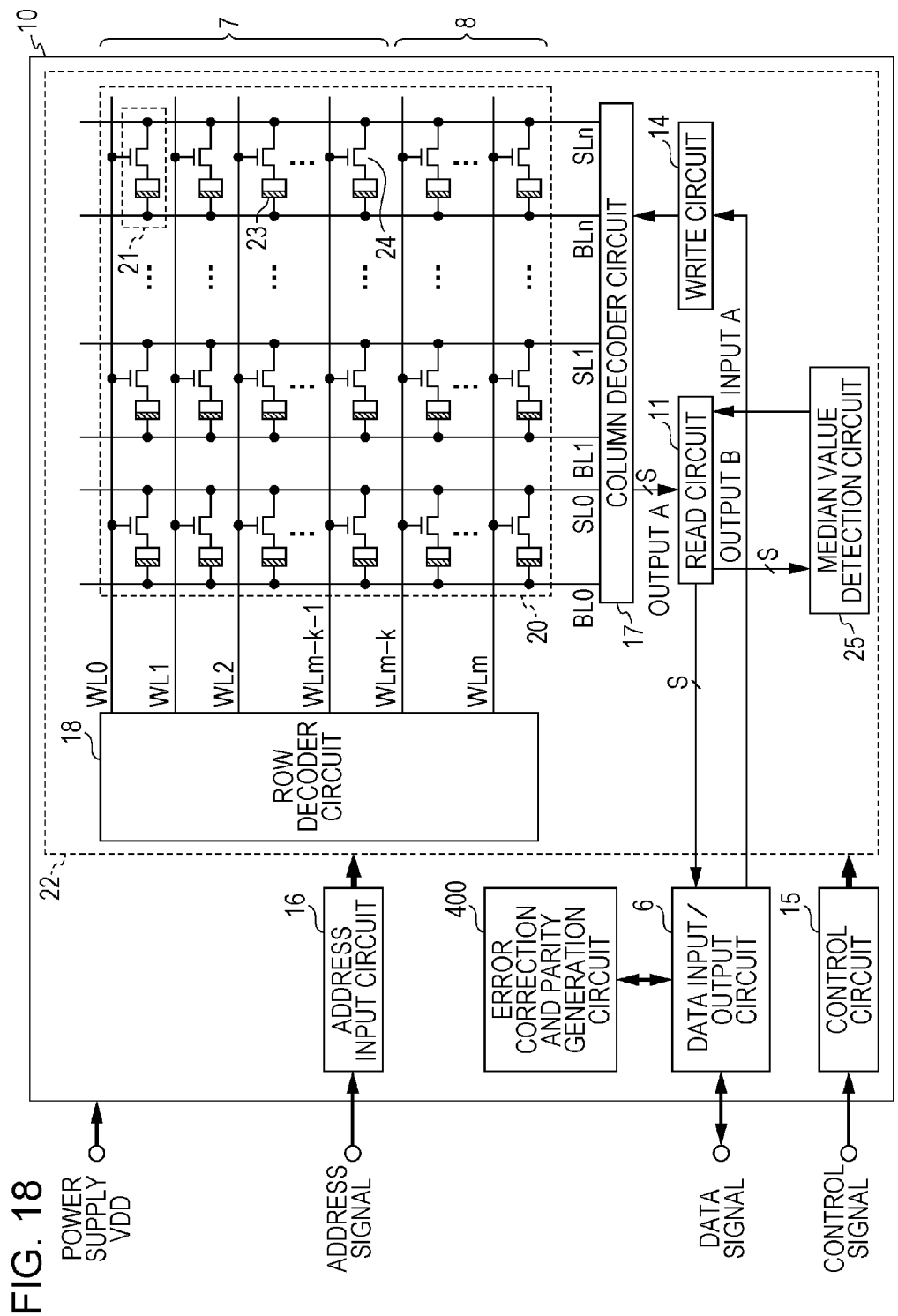
FIG. 18 is a block diagram illustrating a specific example configuration of a non-volatile memory device according to an embodiment of the present disclosure.

FIG. 18 is a block diagram illustrating a specific example configuration of a non-volatile memory device according to an embodiment of the present disclosure. The configuration illustrated in FIG. 18 is merely an example, and a specific configuration of the non-volatile memory device 100 according to the first embodiment is not limited to the configuration illustrated in FIG. 18.

As illustrated in FIG. 18, a non-volatile memory device 10 according to an embodiment includes a memory main body 22 on a semiconductor substrate. The non-volatile memory device 10 further includes a data input/output circuit 6, a control circuit 15, an address input circuit 16, and an error correction and parity generation circuit 400.

The memory main body 22 includes a read circuit 11, a write circuit 14, a column decoder circuit 17, a row decoder circuit 18, a memory cell array 20, and a median value detection circuit 25.

The write circuit 14 applies a predetermined voltage for each operation to a selected memory cell 21 to write data.

The read circuit 11 senses a change in the current flowing through bit lines by using a read scheme described below, and obtains resistance value information on the selected memory cell 21 as a digital count value.

The row decoder circuit 18 selects a word line WL from among m+1 word lines WL connected to the memory cell array 20.

The column decoder circuit 17 selects S bit lines BL from among n+1 bit lines BL and corresponding S source lines SL from among n+1 source lines SL, where S is the number of parallel reads. The column decoder circuit 17 connects the selected S bit lines BL and S source lines SL to the write circuit 14 and the read circuit 11.

The S bit lines BL and the S source lines SL are capable of operating in accordance with the number of rows and/or the number of columns to be read and/or written in parallel.

The read circuit 11 of the non-volatile memory device 10 has output terminals A and B and an input terminal A. The read circuit 11 receives a threshold via the input terminal A. The threshold is used by the read circuit 11 to binarize a signal obtained from the column decoder circuit 17 as data 0 or data 1.

Further, the read circuit 11 outputs a signal obtained from the column decoder circuit 17 to the median value detection circuit 25 via the output terminal B. The signal is used by the median value detection circuit 25 to calculate a median value necessary for generating digital ID data.

Further, the read circuit 11 outputs data 0 or data 1 that represents user data and data 0 or data 1 that represents digital ID data via the output terminal A. The threshold used to generate the user data may be different from the threshold used to generate the digital ID data.

As described above with reference to FIG. 13, in order to generate parity data for error correction in accordance with the digital ID data in the inspection step, the data input/output circuit 6 receives the digital ID data output from the output terminal A of the read circuit 11, and sends the digital data to the error correction and parity generation circuit 400.

The error correction and parity generation circuit 400 computes parity data for error correction in accordance with the digital ID data, and returns the computation result to the data input/output circuit 6.

The error correction and parity generation circuit 400 may be functionally separated into a circuit element that performs error correction and a circuit element that generates a parity. In this embodiment, the error correction and parity generation circuit 400 is described as a single circuit. Alternatively, the error correction and parity generation circuit 400 may be disposed as two separate circuits, namely, an error correction circuit and a parity generation circuit.

The data input/output circuit 6 outputs the parity data to the write circuit 14, and the write circuit 14 writes the parity data to a redundant memory cell in accordance with the digital ID data. The operations described above are controlled via the control circuit 15.

The operation of the median value detection circuit 25 will now be described in more detail. The read circuit 11 compares the digital count value of the resistance value information with a threshold to be input to the input terminal A, and outputs an error signal of 1 or −1 from the output terminal B. A number of error signals equal to the number (S) of channels to be read in parallel are output simultaneously from the output terminal B. The S error signals are input to the median value detection circuit 25.

The median value detection circuit 25 is an arithmetic circuit, and may be implemented using, for example, a semiconductor integrated circuit. The median value detection circuit 25 outputs a resistance median value calculated through feedback control so that the error signals are reduced to the input terminal A of the read circuit 11.

In general, a user writes data to a non-volatile memory device by inputting an address signal, a data signal, and a control signal to the non-volatile memory device from outside. Accordingly, the address input circuit 16 that receives an address signal input from outside and the control circuit 15 that controls the operation of the memory main body 22 in accordance with a control signal input from outside perform control to select an address to be written and to apply a write pulse. The data input/output circuit 6 receives a data signal (external data) input from outside, generates writing data in accordance with the external data, and sends the writing data to the write circuit 14. The write circuit 14 writes the writing data to the memory cell corresponding to the selected address.

The writing data is data to which parity data for error correction has been added by the data input/output circuit 6. A process related to the parity data will now be described.

In order to generate writing data, the data input/output circuit 6 sends the obtained external data to the error correction and parity generation circuit 400 illustrated in FIG. 18. The error correction and parity generation circuit 400 computes parity data for error correction in accordance with the input external data, and returns the parity data to the data input/output circuit 6. The data input/output circuit 6 sends writing data obtained by combining the external data and the parity data for error correction to the write circuit 14, and the writing data is written to the selected memory cell 21 in accordance with the writing data. In this case, the parity data is written to a redundant memory cell which is determined in advance in accordance with address information designated from outside.

Further, in order to read user data written to the non-volatile memory device 10, the address input circuit 16 that receives an address signal and the control circuit 15 that controls the operation of the memory main body 22 in accordance with a control signal input from outside are used. Specifically, the control circuit 15 controls the read circuit 11 to select an address to be read in accordance with an address signal input to the address input circuit 16 and to read the selected memory cell 21. The control circuit 15 further controls the read circuit 11 to also sequentially select and read predetermined redundant memory cells to read parity data corresponding to addresses input from outside. The read circuit 11 outputs, from the output terminal A, digital data obtained as a result of 1/0 judgment in accordance with the threshold input to the input terminal A. User data corresponding to the address signal and parity data corresponding to the user data are sent to the error correction and parity generation circuit 400 via the data input/output circuit 6. Digital ID data is returned to the data input/output circuit 6 after being corrected if any data error is contained and is further output outside the non-volatile memory device 10.

In this case, the threshold input to the input terminal A of the read circuit 11 is not a value obtained from the median value detection circuit 25, but includes values corresponding to the first threshold and the second threshold illustrated in FIG. 3. In FIG. 18, a switching circuit for switching the threshold to be input to the input terminal A between the median value output from the median value detection circuit 25 and values corresponding to the first threshold and the second threshold illustrated in FIG. 3 is not illustrated. The values corresponding to the first threshold and the second threshold are stored in, for example, a register (not illustrated). In a case where the first threshold and the second threshold are used for reading, a judgment level (reference voltage VREF) of a sense amplifier described below or a bad potential may be modified.

A description will now be given of an example of correcting an error of digital ID data by using parity data. The following description is in the context of how the respective constituent elements operate. Note that the operations of these constituent elements are controlled in accordance with instructions given by the control circuit 15.

First, the read circuit 11 and the median value detection circuit 25 generate digital ID data in advance in the inspection step before shipment from the factory. The error correction and parity generation circuit 400 generates parity data based on the digital ID data. The generated parity data is recorded on, for example, a non-volatile memory cell at a predetermined address as user data.

Next, the operation of the non-volatile memory device 10 for field use will be described. Since parity data is recorded as user data during inspection in advance, the first threshold and the second threshold illustrated in FIG. 3 are used for judgment. That is, the read circuit 11 reads digital ID data through the process described above, and outputs the digital ID data to the data input/output circuit 6. Thereafter, the read circuit 11 switches the thresholds to predetermined values, reads parity data stored in a redundant memory cell in accordance with the digital ID data, and outputs the parity data to the data input/output circuit 6. The data input/output circuit 6 transmits the digital ID data and the parity data to the error correction and parity generation circuit 400. The error correction and parity generation circuit 400 returns data whose error has been corrected to the data input/output circuit 6. The data input/output circuit 6 outputs the error-corrected data to outside the non-volatile memory device 10.

In the example described above, errors in both user data and digital ID data are corrected using the error correction and parity generation circuit 400, by way of example. For example, an error correction and parity generation circuit for correcting an error of digital ID data may be located outside the non-volatile memory device 10. This configuration is advantageous to improve security against threats such as hacking in a communication path with an external device outside the non-volatile memory device 10 since digital ID data to be sent to outside the non-volatile memory device 10 contains a data error.

As illustrated in FIG. 18, the memory main body 22 has a user data area 7 and a PUF data area 8. The user data area 7 is a storage area where any data regarding a user (user data) is stored. The user data is written and read by the selection of an address in the user data area 7. The PUF data area 8 is a storage area to which a forming stress is applied to derive entity identification information which is used as digital ID data. As a result, memory cells in the PUF data area 8 take resistance values in the same resistance value state. The digital ID data is data derived by using the fluctuation of the resistance value of each respective memory cell.

The user data area 7 and the PUF data area 8 may not necessarily be separated in units of word lines in the manner illustrated in FIG. 18, and may be formed in any sectioned areas of the memory cell array 20. The more complicated the rule for physical division into areas, the higher the resistance to attacks such as hacking can be.

The memory cell array 20 includes a plurality of word lines WL0, WL1, WL2, . . . , WLm-k-1, WLm-k, . . . , and WLm (hereinafter referred to as the "word lines WL0 to WLm"), a plurality of bit lines BL0, BL1, . . . , and BLn (hereinafter referred to as the "bit lines BL0 to BLn"), and a plurality of source lines SL0, SL1, SL2, . . . , and SLn (hereinafter referred to as the "source lines SL0 to SLn"). The word lines WL0 to WLm are grouped into the word lines WL0, WL1, WL2, . . . , and WLm-k-1 in the user data area 7 and the word lines WLm-k, . . . , and WLm in the PUF data area 8 in units of word lines, and are formed to extend in parallel to each other. The bit lines BL0 to BLn intersect the word lines WL0 to WLm, and are formed in parallel to each other. The source lines SL0 to SLn intersect the word lines WL0 to WLm, and are formed in parallel to each other and also formed in parallel to the bit lines BL0 to BLn. Memory cells 21 are respectively disposed at intersections of the word lines WL0 to WLm and the plurality bit lines BL0 to BLn.

Each of the memory cells 21 includes a resistance variable element 23 and a transistor 24. Each of the word lines WL0 to WLm is connected to gate terminals of the transistors 24 of the corresponding memory cells 21. Each of the bit lines BL0 to BLn is connected to second electrodes of the resistance variable elements 23 of the corresponding memory cells 21. First electrodes of the resistance variable elements 23 are respectively connected to second main terminals of the transistors 24. Each of the source lines SL0 to SLn is connected to first main terminals of the transistors 24 of the corresponding memory cells 21.

The resistance variable elements 23 operate as non-volatile memory elements in the memory cells 21. The non-volatile memory device 10 is a 1T1R non-volatile resistive memory device in which each of the memory cells 21 is constituted by one transistor 24 and one resistance variable element 23. The selection element of each of the memory cells 21 is not limited to the transistor 24. For example, each of the memory cells 21 may include a two-terminal element such as a diode instead.

The control circuit 15 selects either the bit lines BL0 to BLn or the source lines SL0 to SLn for the column decoder circuit 17 in accordance with a control signal, and causes the selected lines to be connected to the write circuit 14 for writing or to the read circuit 11 for reading. Thereafter, the control circuit 15 causes the write circuit 14 or the read circuit 11 to operate.

Each of the resistance variable elements 23 can have a configuration similar to that of the resistance variable element 120 described above according to the first embodiment, and is not described in detail herein.

In the example illustrated in FIG. 18, n-channel MOS (NMOS) transistors are used as selection transistors of the memory cell array 20. This is not meant to be limiting, and p-channel MOS (PMOS) transistors may be used instead.

Figure 19:
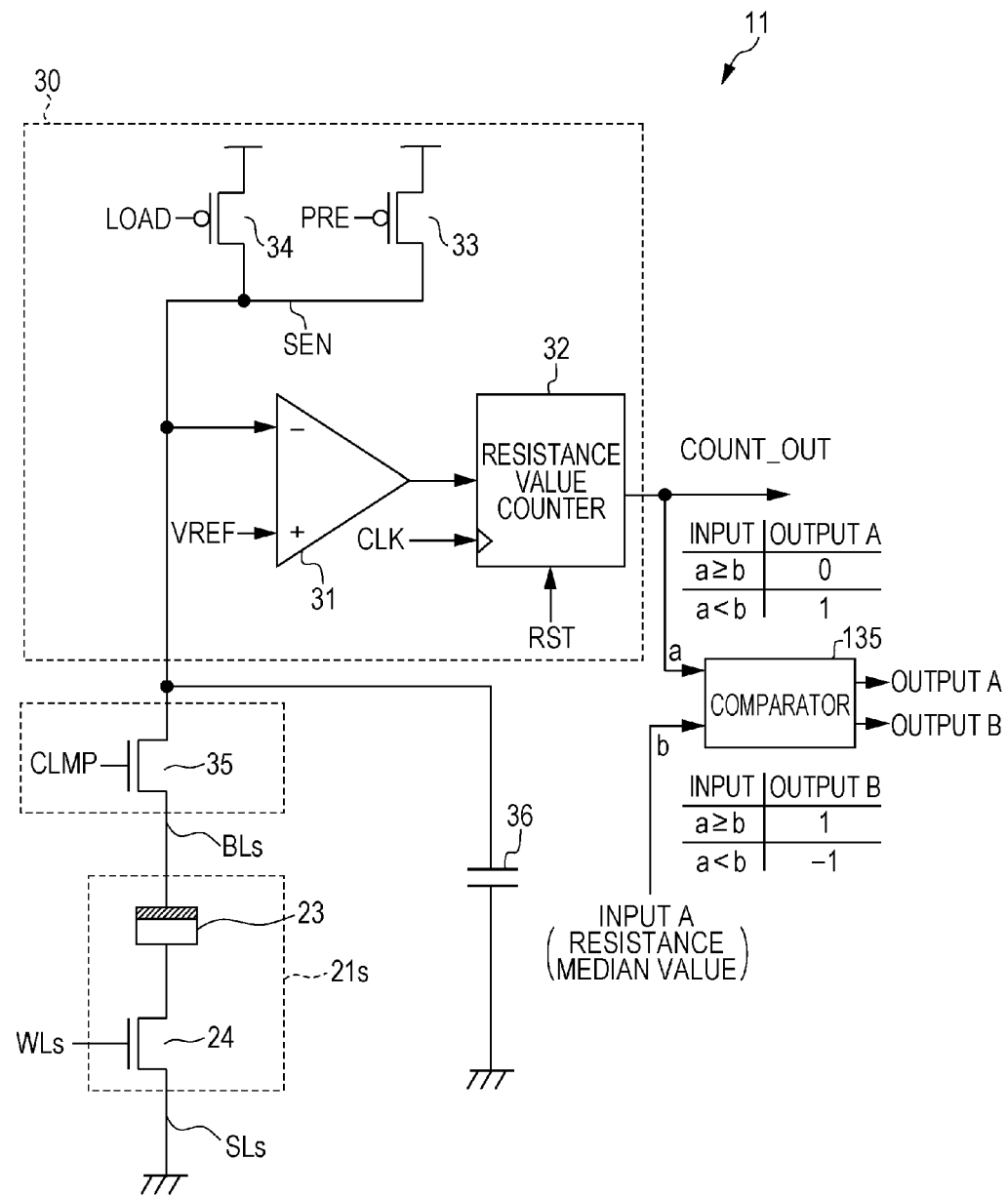
FIG. 19 is a circuit diagram illustrating an example configuration of a read circuit in the non-volatile memory device according to the embodiment of the present disclosure.

FIG. 19 is a circuit diagram illustrating an example configuration of the read circuit 11 in the non-volatile memory device 10 according to this embodiment.

The read circuit 11 includes a sense amplifier circuit 30 based on a discharge scheme. The sense amplifier circuit 30 includes a comparator 31, a resistance value counter 32, a precharge PMOS transistor 33, and a load current PMOS transistor (hereinafter referred to as the "load PMOS transistor") 34.

The resistance value counter 32 is connected to the output of the comparator 31. The count value of the resistance value counter 32 is initialized when a reset signal RST is set to a low level, and then the resistance value counter 32 starts counting in accordance with a clock signal CLK. The clock signal CLK is a signal output from the control circuit 15, and is a signal used as a reference to convert the discharge time changing with the resistance values of the resistance variable elements 23 into a count value. The clock signal CLK is, for example, a rectangular wave signal having a certain frequency. The count value of the resistance value counter 32 is increased by 1 at each rising edge of the clock signal CLK. When the potential of a node SEN is below VREF, the resistance value counter 32 stops counting up and the current count value is maintained in an output terminal COUNT_OUT. At this time, a threshold is input from the input terminal A. A comparator 135 compares the value in the output terminal COUNT_OUT with the threshold input from the input terminal A. If the value in the output terminal COUNT_OUT is greater than or equal to the threshold, the comparator 135 outputs 0 from the output terminal A. If the value in the output terminal COUNT_OUT is less than the threshold, the comparator 135 outputs 1 from the output terminal A. Further, if the value in the output terminal COUNT_OUT is greater than or equal to the threshold, the comparator 135 outputs 1 from the output terminal B. If the value in the output terminal COUNT_OUT is less than the threshold, the comparator 135 outputs −1 from the output terminal B. The precharge PMOS transistor 33 has a gate terminal to which a precharge control signal PRE is input, a source terminal to which VDD is input, and a drain terminal to which the node SEN is connected.

The load PMOS transistor 34 has a gate terminal to which a load control signal LOAD is input, a source terminal to which VDD is input, and a drain terminal to which the node SEN is connected.

The read circuit 11 further includes a clamp circuit constituted by an NMOS transistor (hereinafter referred to as the "clamp NMOS transistor") 35 for applying a clamp voltage. The clamp NMOS transistor 35 has a gate terminal to which a clamp control signal CLMP is input, a source terminal, and a drain terminal. The node SEN is connected to one of the source terminal and the drain terminal of the clamp NMOS transistor 35, and a selected memory cell 21s is connected to the other terminal via the column decoder circuit 17. In FIG. 19, the column decoder circuit 17 is not illustrated.

The operation of outputting a count value (an example of a resistance count value) from the read circuit 11 will now be described specifically with reference to the configuration diagram (FIG. 19) of he read circuit 11 and timing charts illustrated in FIG. 20A and FIG. 20B.

Figure 20A:
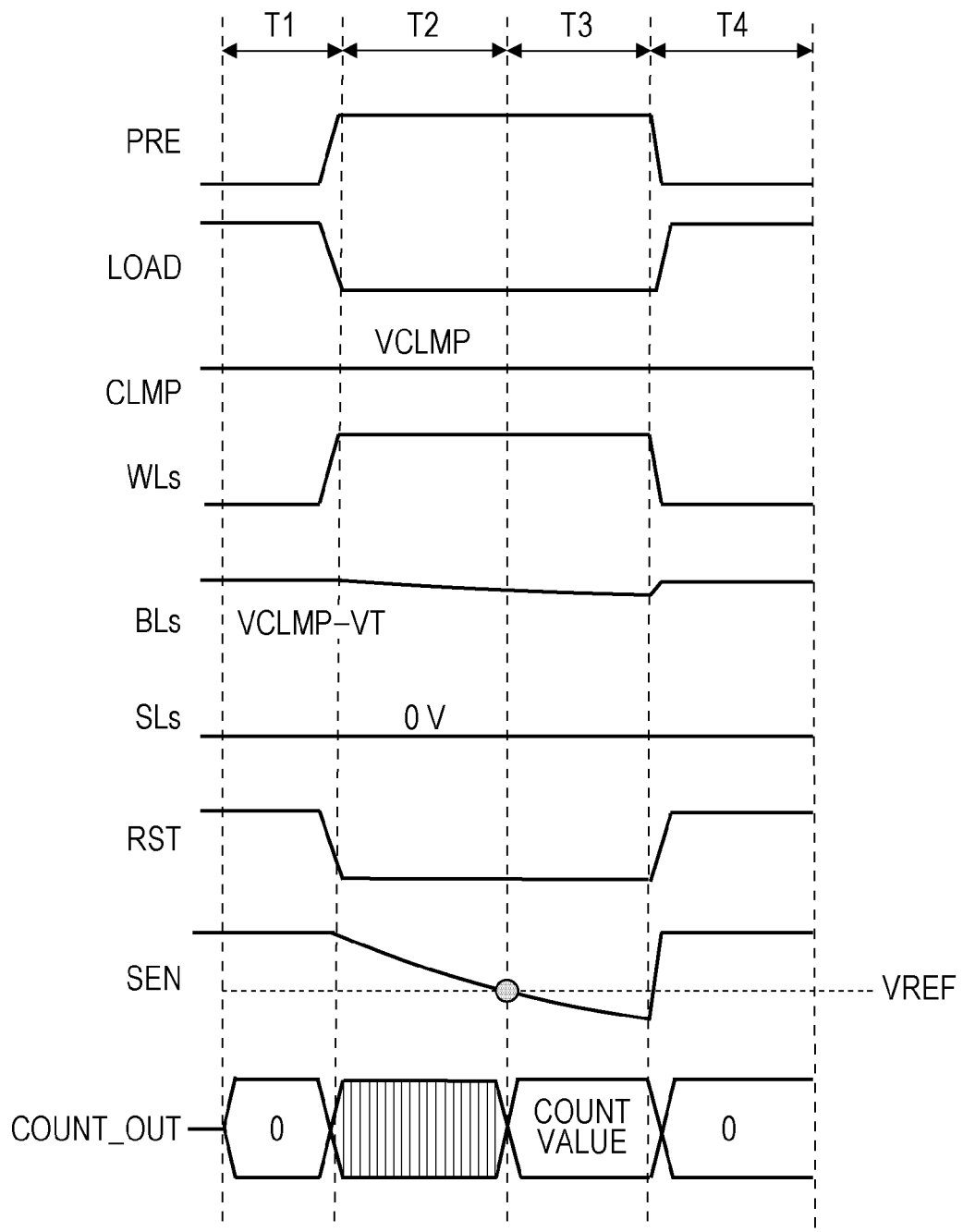
FIG. 20A is a timing chart for reading a selected memory cell by using a discharge scheme.

FIG. 20A is a timing chart for reading a selected memory cell 21s by using a discharge scheme.

In a precharge time T1, the control signal PRE is in the low level, and the precharge PMOS transistor 33 is in the on state. On the other hand, the control signal LOAD is in the high level, and the bad PMOS transistor 34 is in the off state. The potential of a selected word line WLs is in the low level, and the transistor 24 is in the off state.

By applying a voltage VCLMP to the gate terminal of the damp NMOS transistor 35 in the damp circuit, the potential of a selected bit line BLs is precharged to a potential obtained by subtracting VT (a threshold of the damp NMOS transistor 35) from VCLMP. A selected source line SLs is fixed to OND. The node SEN is precharged to VDD. Since a control signal RST of the resistance value counter 32 connected to the output of the comparator 31 is in the high level, a fixed value of 0 is output from the output terminal COUNT_OUT of the resistance value counter 32.

In a sensing period T2, the control signal PRE is set to the high level, thereby bringing the precharge PMOS transistor 33 into the off state, and the control signal LOAD is set to the low level, thereby bringing the load PMOS transistor 34 into the on state. Further, the potential of the selected word line WLs is set to the high level, thereby bringing the NMOS transistor 24 into the on state.

Then, a voltage is applied to the selected source line SLs from the selected bit line BLs via the selected memory cell 21s, and discharging is started accordingly. The control signal RST of the resistance value counter 32 is set to the low level at the same time as the start of discharging, and counting is started accordingly. Then, the comparator 31 compares the potential of the node SEN with a reference voltage VREF for each count, and the count value is continuously increased until the potential of the node SEN falls below the reference voltage VREF. The higher the resistance value of the resistance variable dement 23 in the read operation, the longer the discharge time and the larger the count value.

It is also possible to adjust the discharge time by adjusting the capacitance of a capacitor 36. If the capacitance of the capacitor 36 is high, the discharge time of the node SEN is long, resulting in a large count value. If the capacitance of the capacitor 36 is low, the discharge time of the node SEN is short, resulting in a small count value. The use of the capacitor 36 is effective for improving detection accuracy at the low resistance level for a short discharge time, for example. Since the interval of counting is determined by the clock signal CLK, the operating frequency of the clock signal CLK represents the resolution for the resistance count value. For low resistance values, the discharge time may exceed the resolution for the count value, and such resistance values may be indistinguishable from one another. Accordingly, adding a capacity load to the node SEN for delay enables adjustment to discharge characteristics of a level that intentionally provides detection with the resolution. In the case of the discharge scheme, theoretically, the higher the resistance, the longer the discharge time, resulting in the discharging curve having a gentle slope. The resolution for resistance value information with respect to the counter value is improved. That is, the discharge scheme is a scheme that enables high-accuracy resistance value information to be obtained on the high-resistance side.

In a latch period T3, after discharging has been started, the count value of the resistance value counter 32 when the potential of the node SEN falls below the reference voltage VREF is latched. The latched count value is output to the output terminal COUNT_OUT, and is stored in a mask data correction circuit so as to be handled as a count value indicating information on the resistance value of the resistance variable element 23.

In a reset period T4, when a data output is completed, the potential of the selected word line WLs is set to the low level, and the transistor 24 of the selected memory cell 21s is turned off. Then, the read operation ends.

Figure 20B:
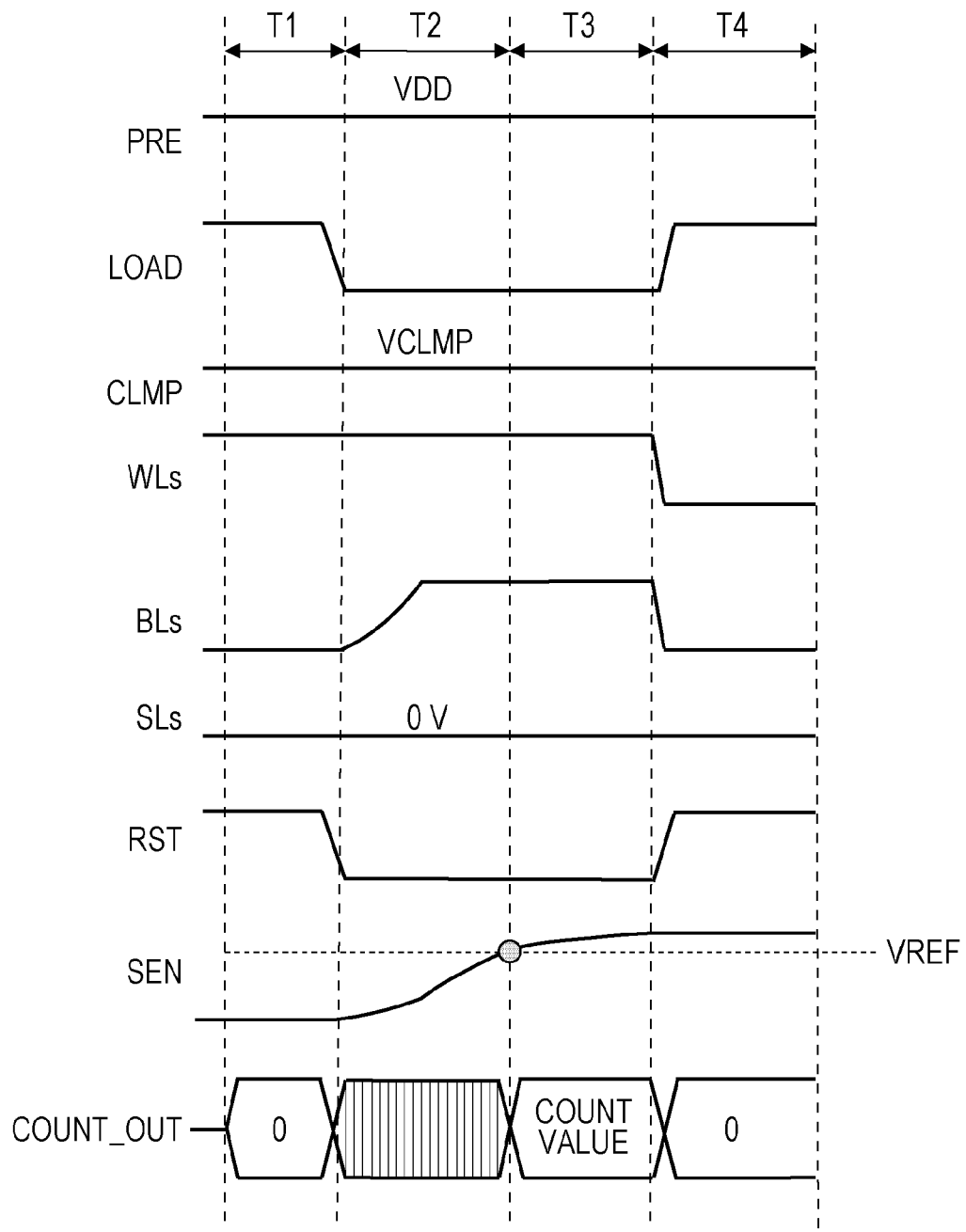
FIG. 20B is a timing chart for reading a selected memory cell by using a charge scheme.

FIG. 20B is a timing chart for reading the selected memory cell 21s by using a charge scheme.

In a discharge period T1, both the control signals PRE and LOAD are in the high level, and both the precharge PMOS transistor 33 and the load PMOS transistor 34 are in the off state. In addition, the potential of the selected word line WLs is in the high level, and the transistor 24 is also in the on state.

A voltage VCLMP is applied to the gate terminal of the clamp NMOS transistor 35 in the clamp circuit, and the potential of the selected word line WLs is set to the high level, thereby bringing the NMOS transistor 24 into the on state. Thus, the node SEN and the selected bit line BLs are connected to GND via the resistance variable element 23, and are discharged to the GNU level. Since the control signal RST of the resistance value counter 32 connected to the output of the comparator 31 is in the high level, a fixed value of 0 is output from the output terminal COUNT_OUT of the resistance value counter 32.

In a sensing period T2, the control signal LOAD is set to the low level, thereby bringing the load PMOS transistor 34 into the on state. Further, a current flow path through the bad PMOS transistor 34, the damp NMOS transistor 35, and the selected memory cell 21s is formed, and charging to the node SEN and the selected bit line BLs is started. The control signal RST of the resistance value counter 32 is set to the low level at the same time as the start of charging, and counting is started accordingly. Then, the comparator 31 compares the potential of the node SEN with a reference voltage VREF for each count, and the count value is continuously increased until the potential of the node SEN exceeds the reference voltage VREF. The lower the resistance value of the resistance variable element 23 in the read operation, the longer the charge time and the larger the count value.

Similarly to the discharge time in the discharge scheme, in the charge scheme, the capacitor 36 is also capable of adjusting the charge time. A detailed description is similar to that of the discharge scheme and is thus omitted. In the case of charge scheme, theoretically, the lower the resistance, the longer the charge time, resulting in the charging curve having a gentle slope. The resolution for resistance value information with respect to the counter value is improved. That is, the charge scheme is a scheme that enables high-accuracy resistance value information to be obtained on the low-resistance state.

In a latch period T3, after charging has been started, the count value of the resistance value counter 32 when the potential of the node SEN exceeds the reference voltage VREF is held. The held count value is output to the output terminal COUNT_OUT, and is handed as a count value indicating information on the resistance value of the resistance variable element 23.

In a reset period T4, when a data output is completed, the potential of the selected word line WLs is set to the low level, and the transistor 24 of the selected memory cell 21s is turned off. Then, the read operation ends.

In the configuration illustrated in FIG. 19, both the discharge scheme and the charge scheme can be adopted. Note that the example of the logic levels of the output terminals A and B of the comparator 135 illustrated in FIG. 19 is an example in a case where a read circuit based on the discharge scheme is used. In the charge scheme, the illustrated logic levels of digital data, which correspond to the high-resistance state and the low-resistance state, are inverted since the detection direction is opposite. Specifically, logic 1 is output from the output terminal A when a≥b, and logic 0 is output from the output terminal A when a<b. The logic levels of the output terminal B are identical for both the discharge scheme and the charge scheme.

In the manner described above, the resolution for resistance value information differs depending on the read scheme. In order to obtain resistance value information with high accuracy, the discharge scheme may be adopted when digital ID data is stored using a high resistance value range. Conversely, the charge scheme may be adopted when digital ID data is stored using a low resistance value range. It is to be noted that the counter width of the resistance value counter 32 illustrated in FIG. 19 is finite in terms of hardware constraints. That is, an excessively long discharge time or charge time would cause the count value to be beyond the counter range, leading to an issue of incorrect resistance value information being likely to be obtained. To address this issue, it is appropriate to cut down the required bit width of the resistance value counter 32 to reduce the circuit scale. In this case, the discharge scheme may be adopted when digital ID data is stored using a low resistance value range, whereas the charge scheme may be adopted when digital ID data is stored using a high resistance value range.

FIG. 21 illustrates an example configuration of the median value detection circuit 25 in the non-volatile memory device 10 according to this embodiment.

As illustrated in FIG. 21, the median value detection circuit 25 includes a selection circuit 200, an up/down counter 201, and a multiplier 202.

The selection circuit 200 selects any of the channels of the error signals input from the read circuit 11 in accordance with a control signal A input from the control circuit 15. The up/down counter 201 increases or decreases the counter value in accordance with the logic level ("1" or "−1", which is the value output from the output terminal B of the read circuit 11 illustrated in FIG. 19) of an error signal selected by the selection circuit 200. That is, the up/down counter 201 constitutes a cumulative addition circuit for the error signal.

The multiplier 202 multiplies the output of the up/down counter 201 by a coefficient α and outputs the resulting value. Setting the coefficient α for the multiplier 202 to a value smaller than 1, for example, ½, ¼, or ⅛, can change the sensitivity to addition of error signals. The term "sensitivity", as used herein, refers to the degree of change or the rate of change. The multiplier 202 may be regarded as a sensitivity adjustment circuit. If the value α is large, the sensitivity for detection of a resistance median value is high, resulting in increased non-linearity in change and deteriorated detection accuracy. If the value α is small, conversely, the sensitivity is low, resulting in increased detection accuracy of the resistance median values, whereas the time required for detection (the number of times the read operation is performed) increases. The value α is optimally selected by a system. Setting the initial value of the up/down counter 201 to a value obtained by multiplying the target resistance median value by α may reduce the detection time.

A brief description will now be given of the process described above. The up/down counter 201 cumulatively adds, as an error, a difference between resistance value information obtained from a selected memory cell and a median value obtained in the middle of computation (also referred to herein as a "tentative median value"). The multiplier 202 updates the current value with a new tentative median value which is a value obtained by multiplying the output of the up/down counter 201 by a predetermined coefficient. Accordingly, an appropriate median value can be obtained.

The median value output from the multiplier 202 is output to the input terminal A of the read circuit 11 as a resistance median value.

The up/down counter 201 constituting a cumulative addition circuit or the error signal and the multiplier 202 constituting a sensitivity adjustment circuit for adjusting the sensitivity to cumulative addition of error signals, both of which are illustrated in FIG. 21, are examples. In addition, the connection relationship between the cumulative addition circuit and the sensitivity adjustment circuit is not limited to that in which the sensitivity adjustment circuit is connected to the output of the cumulative addition circuit. For example, a configuration illustrated in FIG. 22 may also be adopted.

Figure 22:
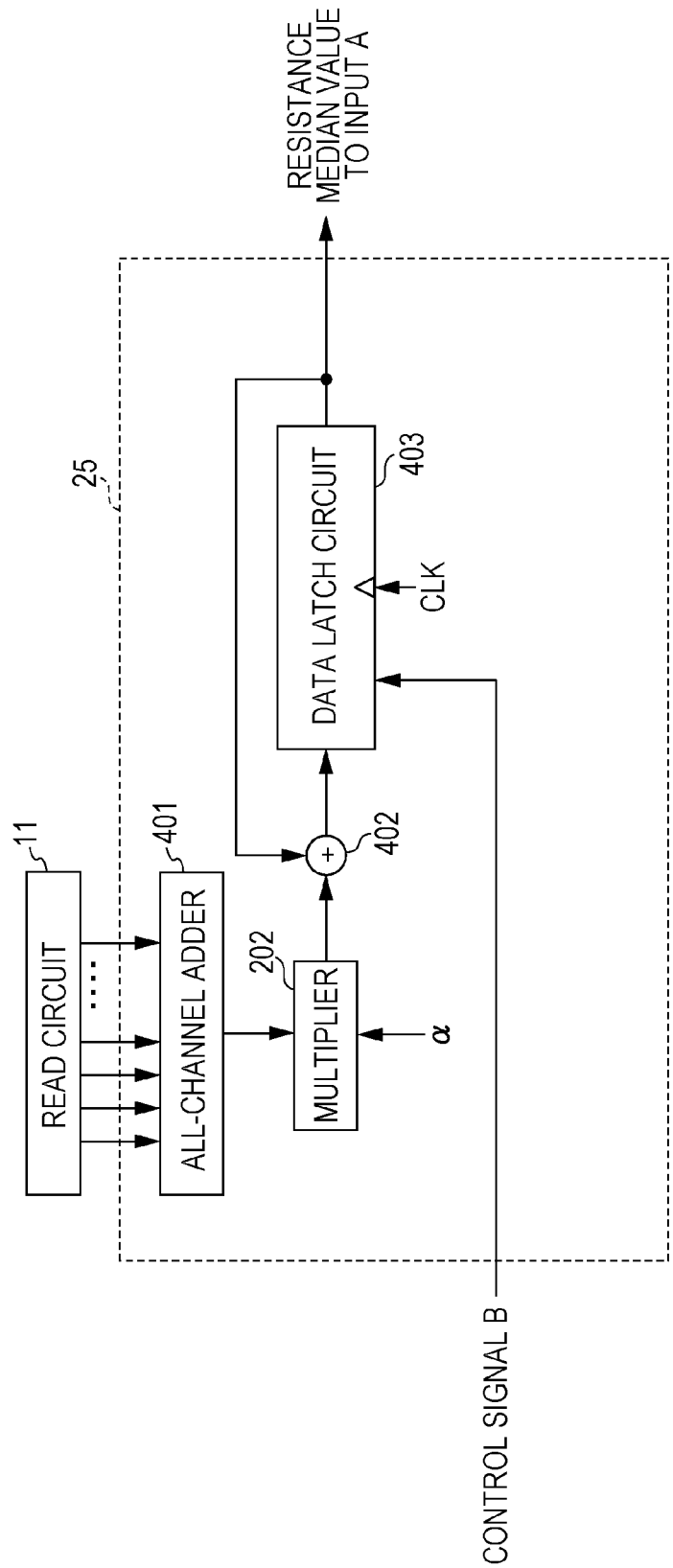
FIG. 22 is a diagram illustrating a modification of the median value detection circuit.

FIG. 22 illustrates a modification of the median value detection circuit 25.

The median value detection circuit 25 illustrated in FIG. 22 includes an all-channel adder 401 in place of the selection circuit 200, a multiplier 202, an adder 402, and a data latch circuit 403. The multiplier 202 is connected to the all-channel adder 401, and receives a signal output from the all-channel adder 401. The adder 402 is connected to the output of the multiplier 202 and the output and input of the data latch circuit 403. The adder 402 receives and adds together the output of the multiplier 202 and the output of the data latch circuit 403, and sends the result to the data latch circuit 403.

The data latch circuit 403 receives the output of the adder 402, and latches data received at the timing specified by a control signal B. The data latch circuit 403 is a circuit formed by combining a plurality of 1-bit latch circuits so as to be capable of storing information on a plurality of bits. The number of bits depends on the number of bits required per output. In the illustrated example, as described below, the output of the data latch circuit 403 is used as a resistance median value in the read circuit 11. It may be sufficient that the data latch circuit 403 has a number of 1-bit latch circuits corresponding to the number of bits required to represent at least a resistance median value.

The operation of the median value detection circuit 25 will now be described more specifically.

The all-channel adder 401 sums all the resistance value error signals in S channels, which are input from the read circuit 11, and outputs the resulting value as a total error signal. The multiplier 202 receives the total error signal, and multiplies the signal by the coefficient α. The multiplier 202 adjusts the sensitivity of the error signal by using the coefficient α to reduce the sensitivity by, for example, ½, ¼, or ⅛. The adder 402 adds together the output of the data latch circuit 403 and the sensitivity-adjusted error signal output from the multiplier 202, and outputs the result to the data latch circuit 403.

The data latch circuit 403 latches a signal (data) received from the adder 402 at the timing specified by the control signal B. The data latch circuit 403 sends the preceding latched data to the adder 402 and also to the input terminal A of the read circuit 11. This data is used as a resistance median value in the read circuit 11.

As is anticipated from the operation described above, the all-channel adder 401 and the multiplier 202 constitute a sensitivity adjustment circuit for adjusting the sensitivity for the cumulative addition of resistance value error signals. Further, the adder 402 and the data latch circuit 403 constitute a cumulative addition circuit for cumulatively adding the preceding resistance median value and a sensitivity-adjusted resistance value error signal in accordance with the timing specified by the control signal B.

As is anticipated from the example illustrated in FIG. 21 and FIG. 22, when a sensitivity adjustment circuit and a cumulative addition circuit for resistance value error signals are disposed, various scenarios are conceivable for the specific configuration of the sensitivity adjustment circuit and the cumulative addition circuit and the connection relationship between these circuits. A person skilled in the art may design such modifications on the basis of the disclosure described above. Based on the gist of the present disclosure, a single circuit or a combination of multiple circuits configured to obtain, as a resistance value error signal, a difference between the current resistance median value and a resistance value indicated by read resistance value information, adjust the sensitivity for the cumulative addition of the resistance value error signal, and update the current value with a new resistance median value obtained as a result of the cumulative addition of resistance value error signals falls within the scope of the present disclosure.

Figure 23:
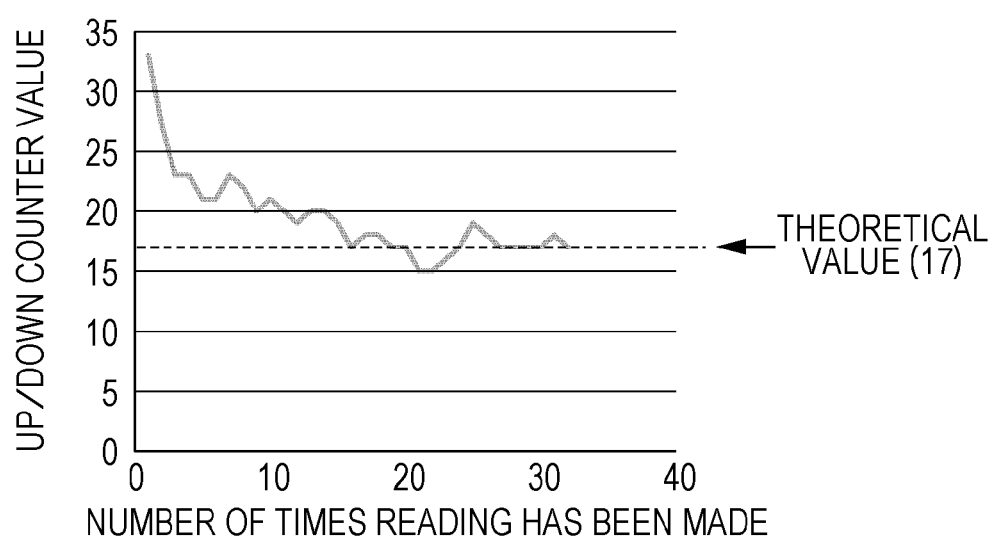
FIG. 23 is a diagram illustrating a result of actually calculating a resistance median value by using the median value detection circuit.

FIG. 23 illustrates the actual results of calculating a resistance median value by using the median value detection circuit 25. The horizontal axis represents the number of times the PUF data area 8 was read, and the vertical axis represents the value of the up/down counter 201. The theoretical value when pieces of the resistance value information in the PUF data area 8 were read in advance and the median value was calculated by using a calculator was 17. As reveled from FIG. 23, calculated results converge to substantially the theoretical value, or 17, when the PUF data area 8 was read almost 30 times. Accordingly, a scheme proposed in an embodiment of the present disclosure enables stable detection of a median value of resistance value variations and successful generation of digital ID data (PUF data) with the use of the median value.

A process in which the median value detection circuit 25 obtains a median value of variations in resistance value is represented by a first step. The first step corresponds to step S4 in FIG. 13 and step S9 in FIG. 14. After the completion of the computation of the median value, the read circuit 11 again reads resistance value information from each memory cell, and generates digital ID data from the relationship between the resistance value information and the median value. This process is represented by a second step. In this case, the second step corresponds to step S5 in FIG. 13 and step S10 in FIG. 14. The second step may include steps S11, S12, and S13 in FIG. 14.

The process described above may be implemented mainly by the control and operation of the control circuit 15. The control circuit 15 controls the respective constituent elements to perform the process described above to update the digital ID data. More specifically, the following operation is performed.

When the read circuit 11 is to generate entity identification information, the read circuit 11 obtains pieces of resistance value information from a predetermined number of memory cells which have been newly selected. The median value detection circuit 25 newly calculates a binary reference value by using the newly obtained pieces of resistance value information. Thereafter, the read circuit 11 obtains pieces of resistance value information from newly selected different memory cells, the number of which is equal to the predetermined number. The control circuit 15 obtains the respective pieces of resistance value information and information on the binary reference value, and generates entity identification information in accordance with the relationship between the pieces of resistance value information and the newly calculated binary reference value. A piece of resistance value information obtained by the read circuit 11 relatively changes in sequence due to the change in ambient temperature and the change in the power supply voltage of the non-volatile memory device 10 and also due to deterioration over time. As described previously, a median value is re-obtained each time a piece of resistance value information in the PUF data area 8 is read, enabling the current optimum value to be kept track of.

Modification of Method for Obtaining Plurality of Pieces of Digital Id Data by Using Offset of Median Value Next, a modification of the median value detection circuit 25 will be described.

Figure 24:
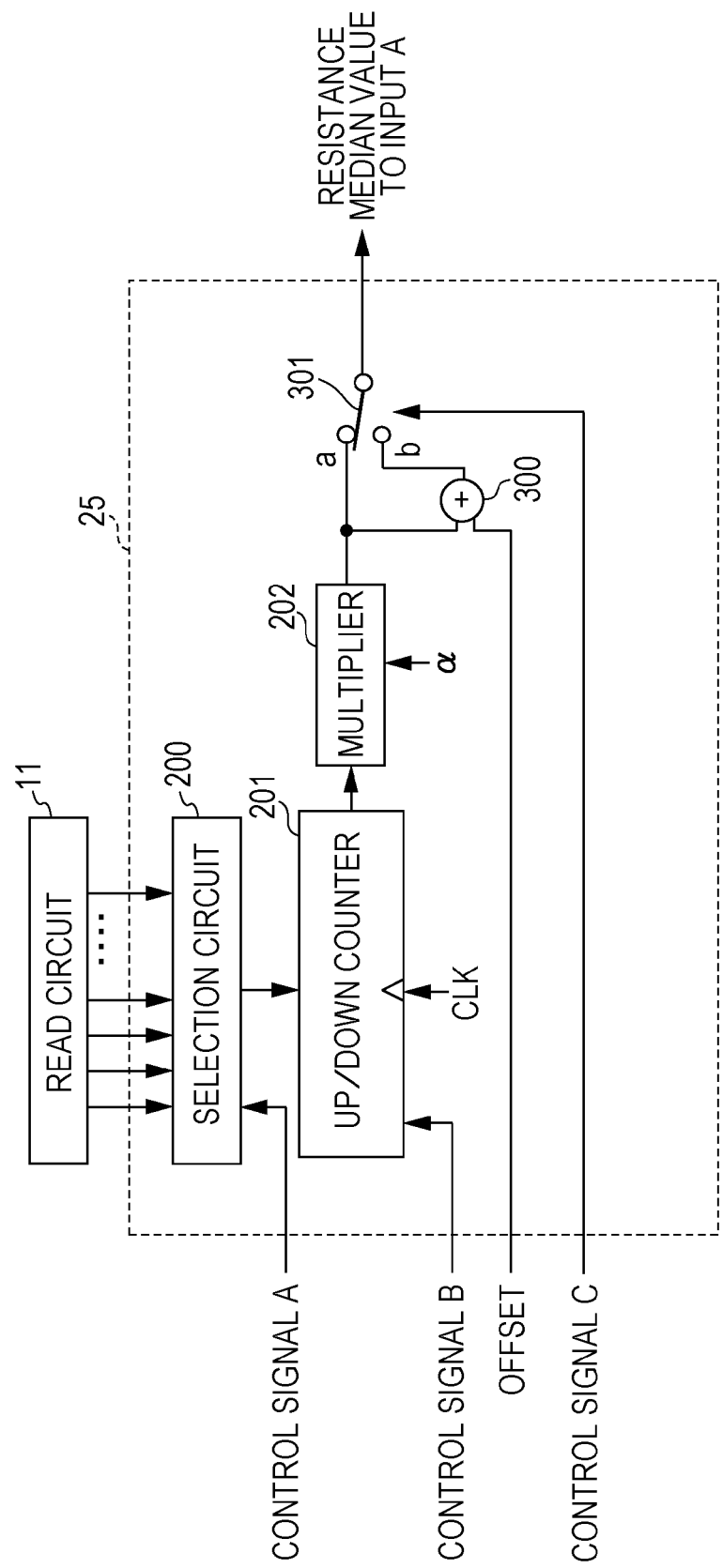
FIG. 24 is a block diagram illustrating an example of a modification of the median value detection circuit.

FIG. 24 is a block diagram illustrating an example of a modification of the median value detection circuit 25. Among the constituent elements illustrated in FIG. 24, components having the same or substantially the same structure and/or function as that of the constituent elements illustrated in FIG. 21 are denoted by the same reference numerals, and are not described herein. Compared to the configuration illustrated in FIG. 21, the median value detection circuit 25 illustrated in FIG. 24 further includes an adder 300 and a switch 301.

An offset is input to the adder 300 via the control circuit 15. The offset is input from outside the non-volatile memory device 10 or is generated in the non-volatile memory device 10. The adder 300 adds together the offset and the output of the multiplier 202, and outputs the result to a terminal b of the switch 301.

The output of the multiplier 202 is connected to a terminal a of the switch 301. The switch 301 selectively switches whether to output a signal from the terminal a or to output a signal from the terminal b in accordance with a control signal C input from the control circuit 15.

In FIG. 24, in the first step described above, the switch 301 is switched to the terminal a in accordance with the setting of the control signal C. That is, in the first step, an operation substantially equal to that illustrated in FIG. 21 is performed.

In the second step (step S5 in FIG. 13 and step S10 in FIG. 14), the switch 301 is switched to the terminal b in accordance with the setting of the control signal C. A signal indicating the result of adding the offset input from the control circuit 15 to the resistance median value computed in the first step is output from the terminal b.

The read circuit 11 receives the median resistance value, which is the output of a terminal selected by the switch 301, and generates digital ID data. There is a difference between the digital ID data generated using the median resistance value output from the terminal a and the digital ID data generated using the median resistance value output from the terminal b to which the offset has been added, and the difference is caused by the presence of the offset.

ID data to which no offset is added is referred to as first digital ID data, and ID data to which an offset has been added is referred to as second digital ID data. The first digital ID data and the second digital ID data have different data patterns, and are each available as device-specific data.

The offset can be input to the median value detection circuit 25 as a variable value. That is, only by changing the offset value to positive or negative, it is possible to generate a plurality of pieces of digital ID data having different data patterns.

If the offset value is input from outside the non-volatile memory device 10, it is possible to return different digital ID data to the input outside the non-volatile memory device 10. This corresponds to challenge-response authentication in PUF technology. A plurality of pieces of ID data are each a specific piece of data to the offset value, and the response is a PUF that is a physically unduplicatable function. A specific example of challenge-response authentication will be described below.

Modification of Randomness Test of Digital ID Data

Figure 25:
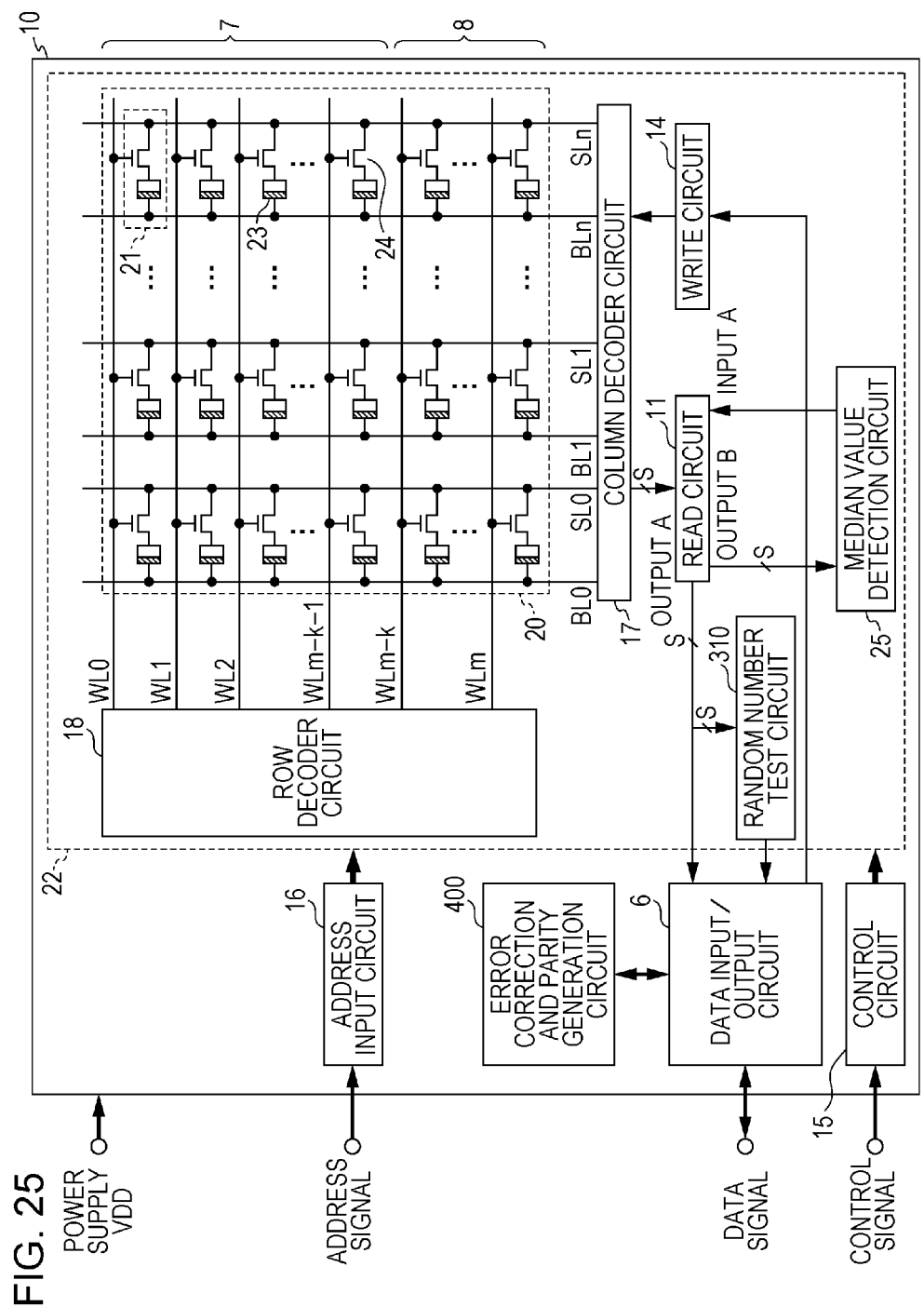
FIG. 25 is a block diagram illustrating a modification of the non-volatile memory device according to the embodiment of the present disclosure.

FIG. 25 illustrates a modification of the non-volatile memory device 10 according to the embodiment of the present disclosure. Among the constituent elements illustrated in FIG. 25, components having the same or substantially the same structure and/or function as that of the constituent elements illustrated in FIG. 18 are denoted by the same reference numerals, and are not described herein.

The non-volatile memory device 10 illustrated in FIG. 25 further includes a random number test circuit 310. The random number test circuit 310 serves to test the randomness of obtained digital ID data.

The reason for testing the randomness of digital ID data is the countermeasure against fault analysis attacks in hacking. Fault analysis attacks are attacks for applying strong electromagnetic radiation or laser light to a secure block on an IC to forcibly induce faults in the circuits to analyze the cipher algorithm and key data. For example, a fault analysis attack may cause digital ID data to be altered to data having all 1s or 0s, and the resulting data may be encrypted as key data, thereby making it easy to analyze encrypted data. Alternatively, in a case where a private or secret key has been encrypted using correct digital ID data as a device key, decryption of the private or secret key using digital ID data obtained by fault analysis attack might allow the attacker to infer the decryption process. As a result, the private or secret key might be stolen. To obviate such a risk, it is effective to use a random number test circuit for randomness tests.

Digital ID data is input to the random number test circuit 310 in units of s bits. A $\chi^2$ (chi-squared or chi-square) test is used to test random numbers. In a $\chi^2$ test, every 4 bits are extracted from digital data of s bits, and frequencies of occurrences of 16 digital data patterns represented by 4 bits are cumulatively summed. The number of occurrences of each of the digital values of 0 to 15 is counted. Then, differences between the numbers of occurrences of the digital values of 0 to 15 and the theoretical value are summed. The closer to zero the sum value is, the higher the randomness is regarded to be.

A description will now be given of generalized $\chi^2$ computation. Letting the number of times the data patterns have been obtained be A, D=A÷n (where n is the number of data patterns), where D is an ideal value of the number of times each of the data patterns has been obtained. In this case, the $\chi^2$ value is obtained by cumulatively summing the value given by $(X_n-D)^2 \div D$ (where $X_n$ is the number of times each data pattern has been obtained) a number of times equal to the number n of data patterns. Specifically, for example, in the computation of the $\chi^2$ value of data patterns represented by 4 bits, there are 16 types of data patterns of 0 to 15. Assuming that s is 32 bits, obtaining s bits 16 times yields data of 512 bits in total. Since 512÷4=128, the number of data patterns obtained is 128. If the 128 data patterns are evenly divided into patterns of 0 to 15, the ideal value D of the number of times each data pattern has been obtained is 8 in accordance with 128÷16=8. That is, if the number of times each data pattern has been obtained is denoted by $X_n$ (where n is an integer from 0 to 15), a value obtained by calculating $(X_n-8)^2 \div 8$ for each of the data patterns and totaling the respective values for all the data patterns is equal to the $\chi^2$ value for 512 bits.

The $\chi^2$ value computed in the way described above is sent to the data input/output circuit 6 illustrated in FIG. 25, and is further output to an external device outside the non-volatile memory device 10. The external device performs a test to verify that the $\chi x^2$ value is less than or equal to a predetermined value, and checks whether the obtained digital ID data has a sufficient level of randomness to be used for an encryption key or the like. If no problem is found, the digital ID data is used.

The non-volatile memory device 10 may inform an external device of whether or not the generated entity identification information is available by using, for example, the control circuit 15 or the like on the basis of the test result obtained from the random number test circuit 310.

As described above, the use of the random number test circuit 310 to test the randomness of data may obviate theft of a private or secret key even if a threat such as a fault analysis attack occurs.

Figure 26:
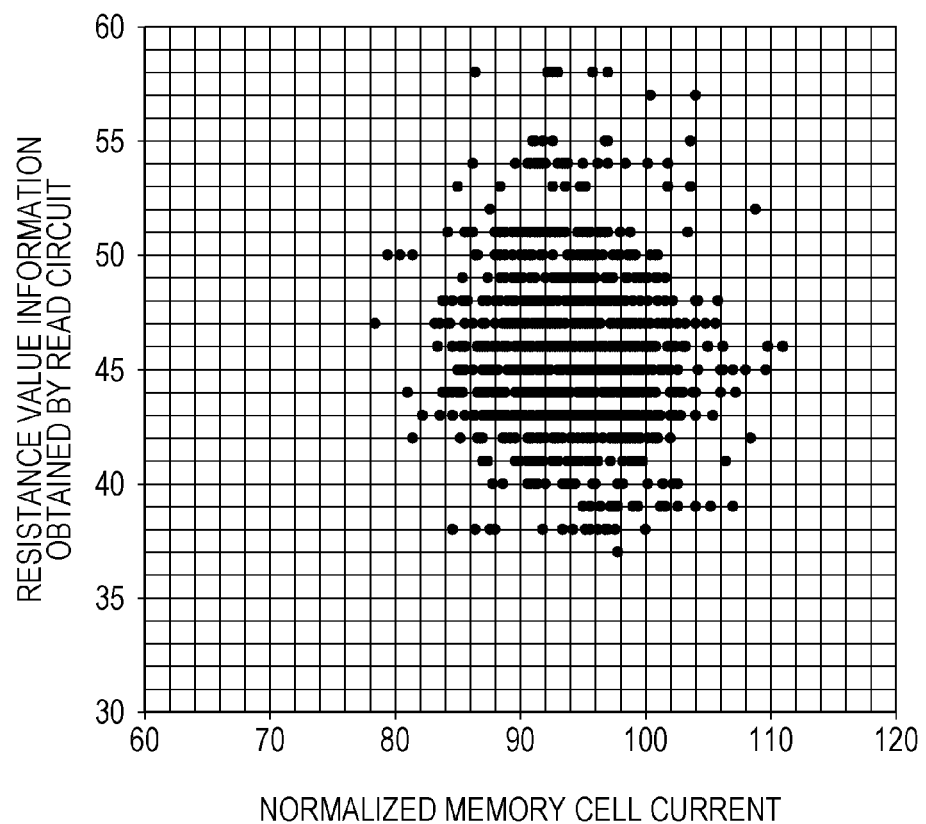
FIG. 26 is a diagram illustrating the relationship between a normalized memory cell current for memory cells and resistance value information read by the read circuit according to the embodiment of the present disclosure.

FIG. 26 illustrates the relationship between a normalized memory cell current for the memory cells 21 and resistance value information read by the read circuit 11 according to this embodiment. The memory cell current is obtained by measuring the direct-current (DC) current flowing when a predetermined read voltage is applied by using a typical tester. That is, the values of the current flowing through all the memory cells 21 are equal, which indicates that the resistance values of the memory cells 21 are equal In FIG.

26, dots represent collective plots of pieces of resistance value information obtained by 144 sense amplifiers on the same chip. As revealed from FIG. 26, there is no clear correlation between the memory cell current and resistance value information obtained by a circuit. That is, it is revealed that the characteristics of the sense amplifiers vary for each channel and further for each IC, and that the relationship between the absolute resistance value and the resistance value information measured by a circuit differs depending on each sense amplifier. The characteristics of each sense amplifier are generated due to variations in Vt or the like across a transistor constituting the sense amplifier. Normally, it is desirable to suppress such variations to provide uniform performance for the sense amplifiers. In applications to PUF technology, however, it is desirable to design the sense amplifiers so that circuit variations are enhanced. Examples of such design include using transistor sizes so as to increase random variations in the load PMOS transistor 34 illustrated in FIG. 19. There are a variety of conceivable techniques for increasing random variations, which are a matter of design choice and are not described herein. In this manner, large random variations of sense amplifiers result in there being no clear correlation between the absolute value of a resistance value and resistance value information obtained by a circuit. Accordingly, digital ID data is difficult to predict even if a memory cell is directly read using a probe or the like.

Next, a method for reducing the error rate of digital ID data will be described.

Figure 27:
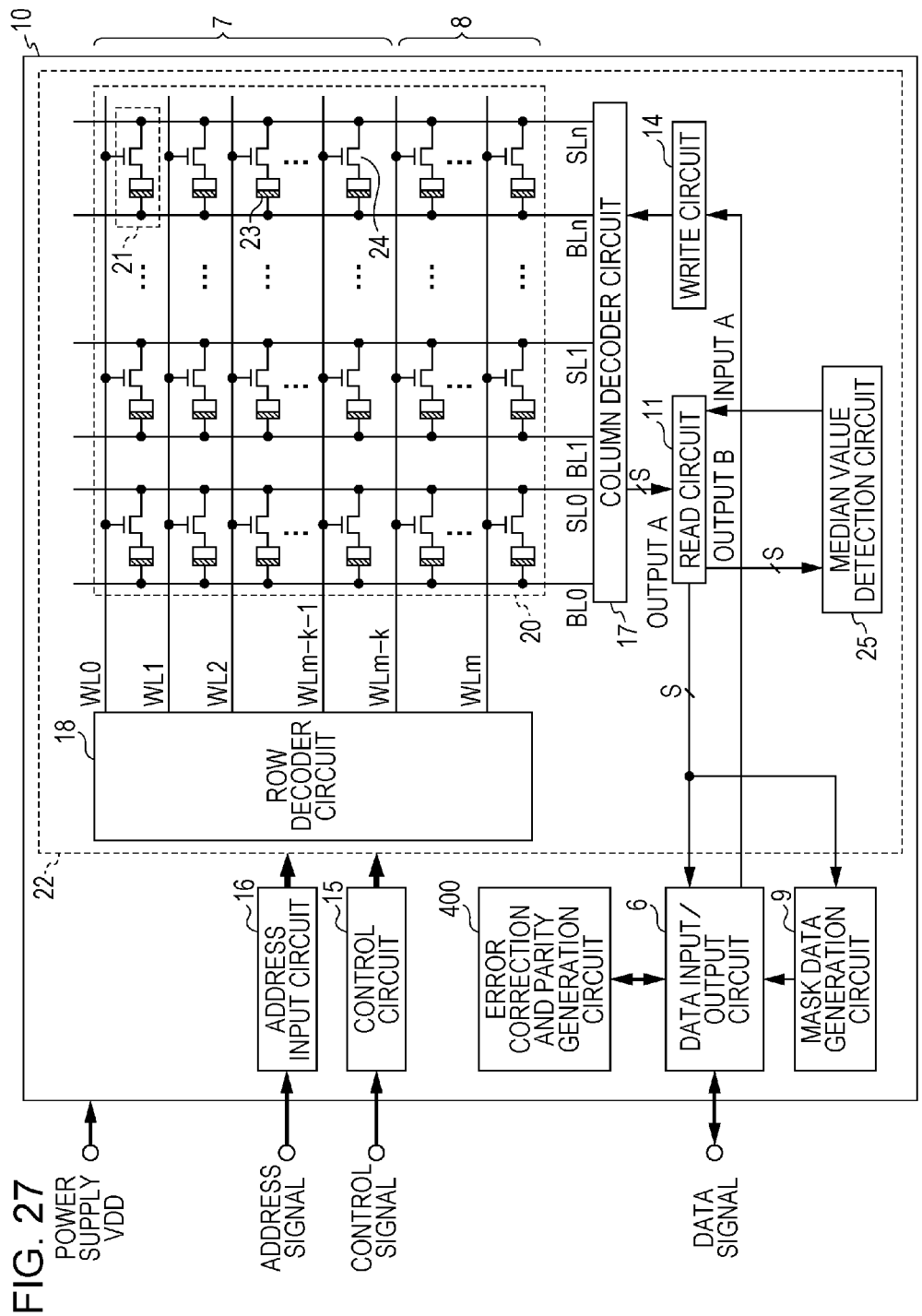
FIG. 27 is a block diagram illustrating a specific example configuration of a non-volatile memory device according to an embodiment of the present disclosure.

FIG. 27 is a block diagram illustrating a non-volatile memory device 10 according to an embodiment of the present disclosure. The non-volatile memory device 10 illustrated in FIG. 27 is merely an example, and a specific configuration of the non-volatile memory device 10 is not limited to the configuration illustrated in FIG. 27.

Compared to the non-volatile memory device 10 illustrated in Ag. 18, the non-volatile memory device 10 according to this embodiment further includes a mask data generation circuit 9. The mask data generation circuit 9 generates mask data to be used to distinguish a memory cell on which an additional write operation is performed from a memory cell on which no additional write operation is performed, on the basis of digital data generated by the read circuit 11. The write circuit 14 performs an additional write operation on a memory cell on which an additional write operation is performed, on the basis of the generated mask data. The mask data and the additional write operation will be described in detail below.

Figure 28:
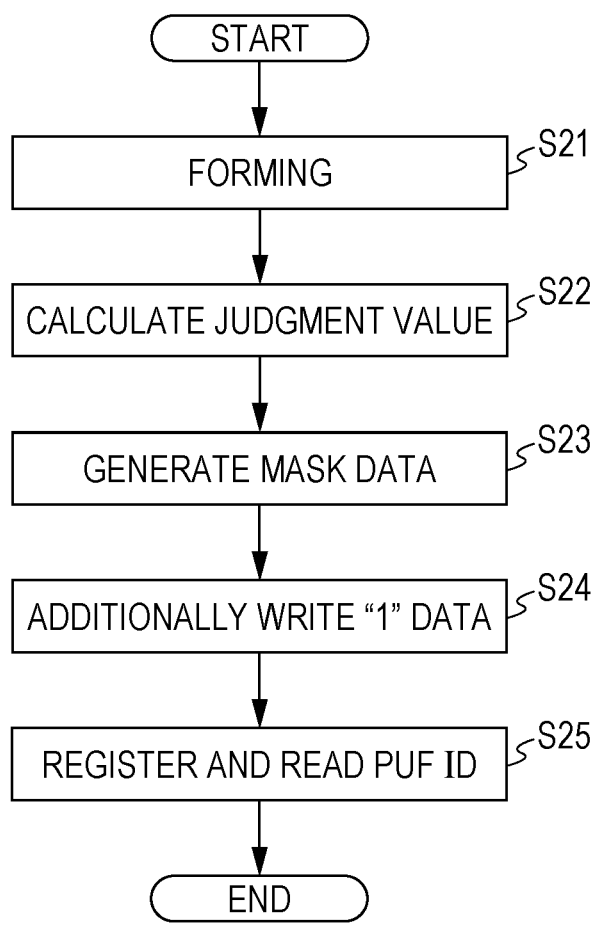
FIG. 28 is a flowchart illustrating an example of the operation of generating digital ID data.

FIG. 28 is a flowchart illustrating the operation of generating digital ID data as an example of the operation of the non-volatile memory device 10 according to this embodiment. The operation of the non-volatile memory device 10 will be described hereinafter with reference to FIG. 28.

Figure 29:
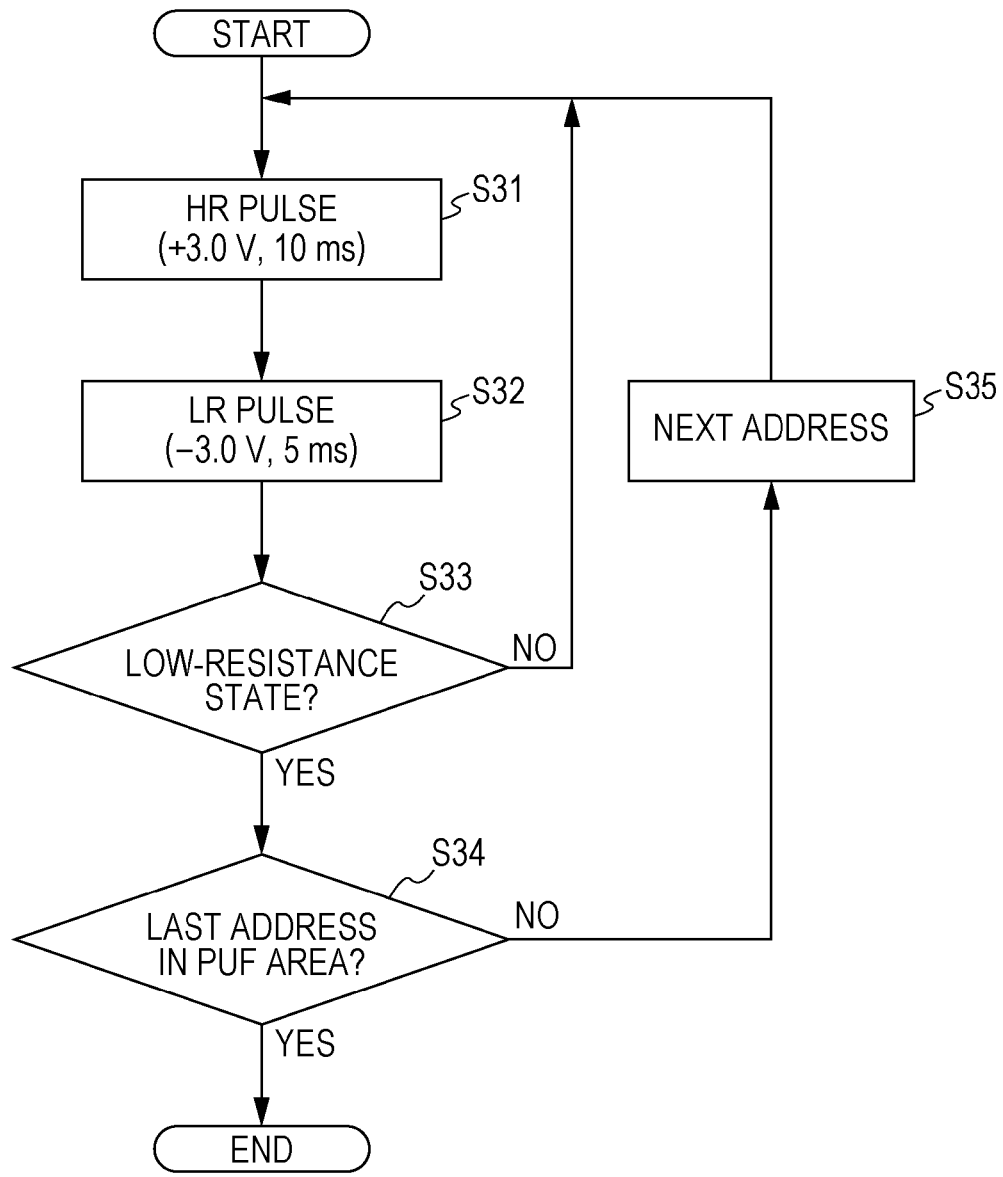
FIG. 29 is a flowchart illustrating an example of a forming process.

First, in step S21, the digital ID data area (PUF area) 8 is subjected to forming. FIG. 29 is a flowchart illustrating a forming process. In step S31, the write circuit 14 applies an HR pulse (for example, +3.0 V, 10 ms) to a memory cell 21. Then, in step S32, the write circuit 14 further applies an LR pulse (for example, −3.0 V, 5 ms) to the memory cell 21. The processes of steps S31 and S32 make a resistive memory cell 21 transition from the initial insulating state to the low-resistance value state. In step S33, the read circuit 11 reads the resistance value information from the memory cell 21 on which the write operation has been performed in steps S31 and S32, and determines whether or not the resistance value of the memory cell 21 is within a low resistance value range. If it is determined that the resistance value is not within the low resistance value range, the write circuit 14 further applies an HR pulse and an LR pulse to the memory cell 21 under the same conditions. The write circuit 14 and the read circuit 11 repeatedly perform the write operation and the operation of reading resistance value information until it is determined that the resistance value of the memory cell 21 on which the write operation has been performed in steps S31 and S32 is within the low resistance value range. The operations described above are repeatedly performed until it is determined that the resistance values of all the memory cells 21 (all the bits) in the digital ID data area 8 are within the low resistance value range (steps S34 and S35). If all the memory cells 21 have been successfully processed, the forming process ends.

Figure 30:
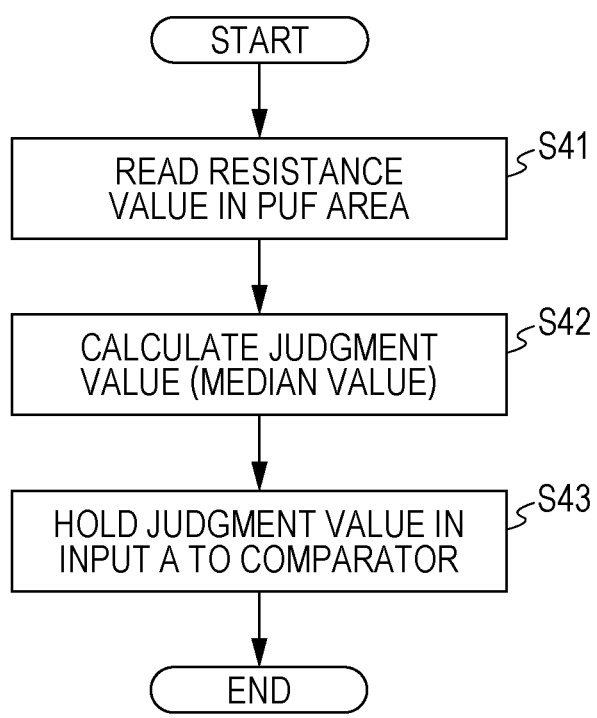
FIG. 30 is a flowchart illustrating an example of a judgment value calculation process.

Then, in step S22 (FIG. 28), a judgment value for extracting digital ID data for the digital ID data area 8 is calculated. FIG. 30 is a flowchart illustrating a judgment value calculation process. In step S41, the read circuit 11 reads a resistance count value for each bit in the digital ID data area 8, and holds the value in the output terminal COUNT_OUT.

The operation in which the read circuit 11 outputs a count value (an example of a resistance count value) in step S41 will now be described specifically with reference to FIG. 19, FIG. 20A, and FIG. 20B.

FIG. 20A is a timing chart for reading a selected memory cell 21s by using a discharge scheme.

In a precharge time T1, the control signal PRE is in the low level, and the precharge PMOS transistor 33 is in the on state. On the other hand, the control signal LOAD is in the high level, and the load PMOS transistor 34 is in the off state. The potential of a selected word line WLs is in the low level, and the transistor 24 is in the off state.

By applying a voltage VCLMP to the gate terminal of the clamp NMOS transistor 35 in the clamp circuit, the potential of a selected bit line BLs is precharged to a potential obtained by subtracting VT (a threshold of the clamp NMOS transistor 35) from VCLMP. A selected source line SLs is fixed to GND. The node SEN is precharged to VDD. Since a control signal RST of the resistance value counter 32 connected to the output of the comparator 31 is in the high level, a fixed value of 0 is output from the output terminal COUNT_OUT of the resistance value counter 32.

In a sensing period T2, the control signal PRE is set to the high level, thereby bringing the precharge PMOS transistor 33 into the off state, and the control signal LOAD is set to the low level, thereby bringing the load PMOS transistor 34 into the on state. Further, the potential of the selected word line WLs is set to the high level, thereby bringing the NMOS transistor 24 into the on state.

Then, a voltage is applied to the selected source line SLs from the selected bit line BLs via the selected memory cell 21s, and discharging is started accordingly. The control signal RST of the resistance value counter 32 is set to the low level at the same time as the start of discharging, and counting is started accordingly. Then, the comparator 31 compares the potential of the node SEN with a reference voltage VREF for each count, and the count value is continuously creased until the potential of the node SEN falls below the reference voltage VREF. The higher the resistance value of the resistance variable element 23 in the read operation, the longer the discharge time and the larger the count value.

It is also possible to adjust the discharge time by adjusting the capacitance of a capacitor 36. If the capacitance of the capacitor 36 is high, the discharge time of the node SEN is long, resulting in a large count value. If the capacitance of the capacitor 36 is low, the discharge time of the node SEN is short, resulting in a small count value. The use of the capacitor 36 is effective for improving detection accuracy at the low resistance level for a short discharge time, for example. Since the interval of counting is determined by the clock signal CLK, the operating frequency of the dock signal CLK represents the resolution for the resistance count value. For low resistance values, the discharge time may exceed the resolution for the count value, and such resistance values may be indistinguishable from one another. Accordingly, adding a capacity load to the node SEN for delay enables adjustment to discharge characteristics of a level that intentionally provides detection with the resolution.

In a latch period T3, after discharging has been started, the count value of the resistance value counter 32 when the potential of the node SEN falls below the reference voltage VREF is latched. The latched count value is output to the output terminal COUNT_OUT, and is stored in the mask data generation circuit 9 so as to be handled as the count value for the resistance variable element 23.

In a reset period T4, when a data output is completed, the potential of the selected word line WLs is set to the low level, and the transistor 24 of the selected memory cell 21s is turned off. Then, the read operation ends.

The count value of the resistance value counter 32 is input to the median value detection circuit 25, and the median value detection circuit 25 calculates a judgment value (median value) on the basis of the input resistance count value (step S42). In step S43, the calculated judgment value is held in the input terminal A of the read circuit 11 (an input of the comparator 135).

FIG. 20B is a timing chart for reading the selected memory cell 21s by using a charge scheme.

In a discharge period T1,both the control signals PRE and LOAD are in the high level, and both the precharge PMOS transistor 33 and the load PMOS transistor 34 are in the off state. In addition, the potential of the selected word line WLs is in the low level and the transistor 24 is also in the off state.

A voltage VCLMP is applied to the gate terminal of the clamp NMOS transistor 35 in the clamp circuit, and the potential of the selected word line WLs is set to the high level, thereby bringing the NMOS transistor 24 into the on state. Thus, the node SEN and the selected bit line BLs are connected to GND via the resistance variable element 23, and are discharged to the GND level. Since the control signal RST of the resistance value counter 32 connected to the output of the comparator 31 is in the high level, a fixed value of 0 is output from the output terminal COUNT_OUT of the resistance value counter 32.

In a sensing period T2, the control signal LOAD is set to the low level, thereby bringing the load PMOS transistor 34 into the on state. Further, a current flow path through the load PMOS transistor 34, the clamp NMOS transistor 35, and the selected memory cell 21s is formed, and charging to the node SEN and the selected bit line BLs is started. The control signal RST of the resistance value counter 32 is set to the low level at the same time as the start of charging, and counting is started accordingly. Then, the comparator 31 compares the potential of the node SEN with a reference voltage VREF for each count, and the count value is continuously increased until the potential of the node SEN exceeds the reference voltage VREF. The lower the resistance value of the resistance variable element 23 in the read operation, the longer the charge time and the larger the count value.

Similarly to the discharge time in the discharge scheme, also in the charge scheme, the capacitor 36 is capable of adjusting the charge time. A detailed description is omitted.

In a latch period T3, after charging has been started, the count value of the resistance value counter 32 when the potential of the node SEN exceeds the reference voltage VREF is latched. The latched count value is output to the output terminal COUNT_OUT, and is stored in a mask data correction circuit so as to be handled as the count value for the resistance variable element 23.

In a reset period T4, when a data output is completed, the potential of the selected word line WLs is set to the low level, and the transistor 24 of the selected memory cell 21s is turned off. Then, the read operation ends.

The count value of the resistance value counter 32 input to the median value detection circuit 25, and the median value detection circuit 25 calculates a judgment value (median value) on the basis of the input resistance count value (step S42). In step S43, the calculated judgment value is held in the input terminal A of the read circuit 11 (an input of the comparator 135).

In the configuration illustrated in FIG. 19, both the discharge scheme and the charge scheme can be adopted. It is to be noted that, in the discharge scheme, logic 1 is output for low resistance and logic 0 is output for high resistance from the comparator 135, whereas, in the charge scheme, logic 0 is output for low resistance and logic 1 is output for high resistance from the comparator 135. Accordingly, the logic levels are inverted.

The capacitor 36 may be any device having a capacitance. For example, a MOS capacitor or a metal-insulator-metal (MIM) capacitor may be used. Alternatively, a parasitic capacitance of wiring may be used.

In step S42, the n resistance count values read by the read circuit 11 are input to the median value detection circuit 25. After the median value detection circuit 25 receives the resistance count values, the pieces of resistance value information for the n resistance count values are transmitted sequentially one by one to the multiplier 202 in accordance with the control signal A, and the median value is adjusted at any time by the up/down counter 201. The value of the output obtained when the processing on the resistance value for the last address in the data in the digital ID data area 8 by the up/down counter 201 is completed is held in the input terminal A of the read circuit 11 (an input of the comparator 135) as a median value (judgment value).

Figure 31:
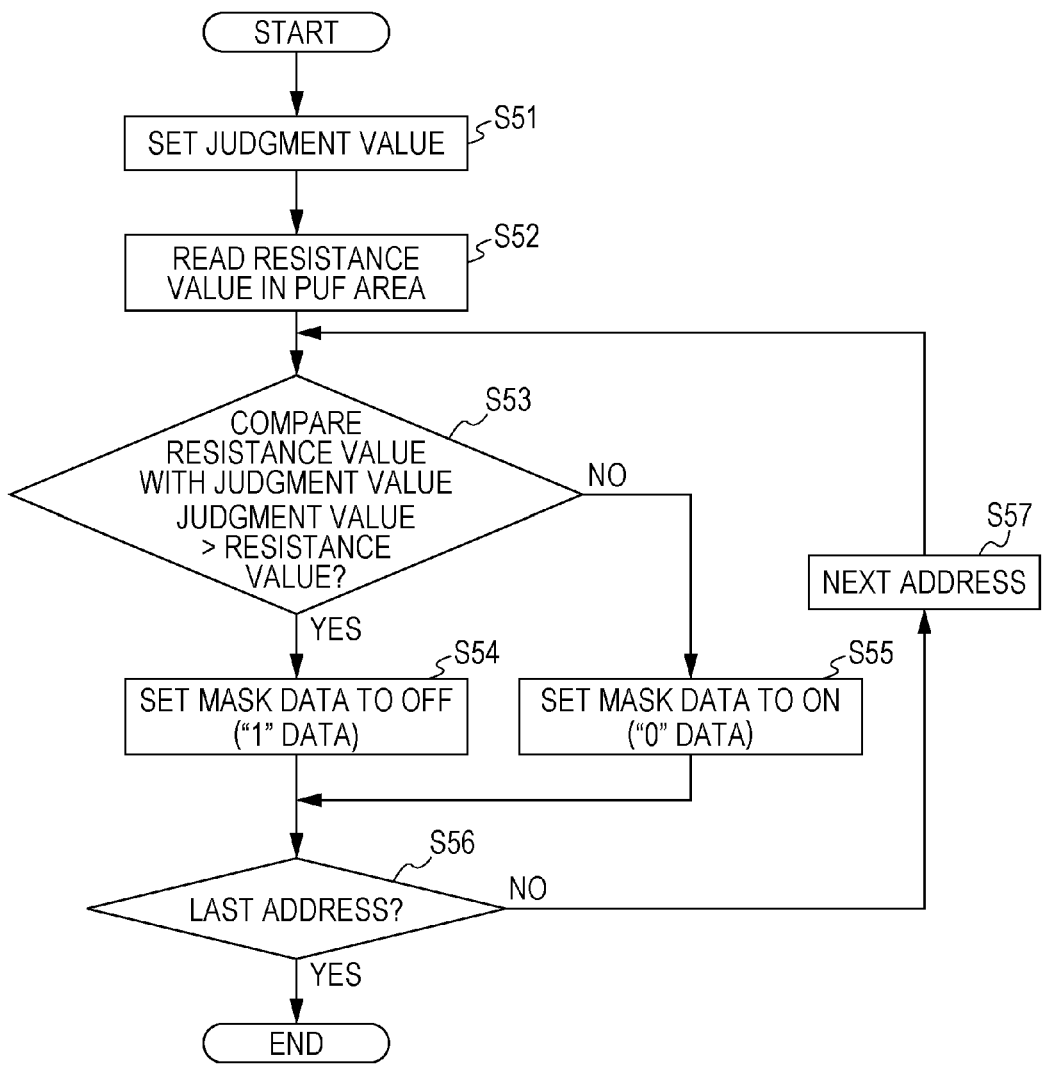
FIG. 31 is a flowchart illustrating an example of a process for generating mask data.

After the calculation of a judgment value, in step S23 (FIG. 28), the mask data generation circuit 9 generates mask data. FIG. 31 is a flowchart illustrating a process for generating mask data. In step S51, the mask data generation circuit 9 sets the median value calculated by the median value detection circuit 25 as a judgment value. In step S52, the read circuit 11 reads resistance value information in the digital ID data area 8, and reads a resistance count value. In step S53, the mask data generation circuit 9 compares in magnitude each of the resistance values in the digital ID data area 8 with the judgment value by using the comparator 135 of the read circuit 11. The mask data generation circuit 9 assigns "1" data to a memory cell whose resistance value is smaller than the judgment value, and sets the mask data to off (step S54). On the other hand, the mask data generation circuit 9 assigns "0" data to a memory cell whose resistance value is not smaller than the judgment value, and sets the mask data to on (step S55). Each pieces of mask data is held in the data input/output circuit 6. In step S56, it is determined whether or not mask data has been generated for all the bits in the digital ID data area 8. If mask data has not been generated for all the bits, the process is performed on the next address. If mask data has been generated for all the bits, the mask data generation process ends (steps S56 and S57).

Figure 32:
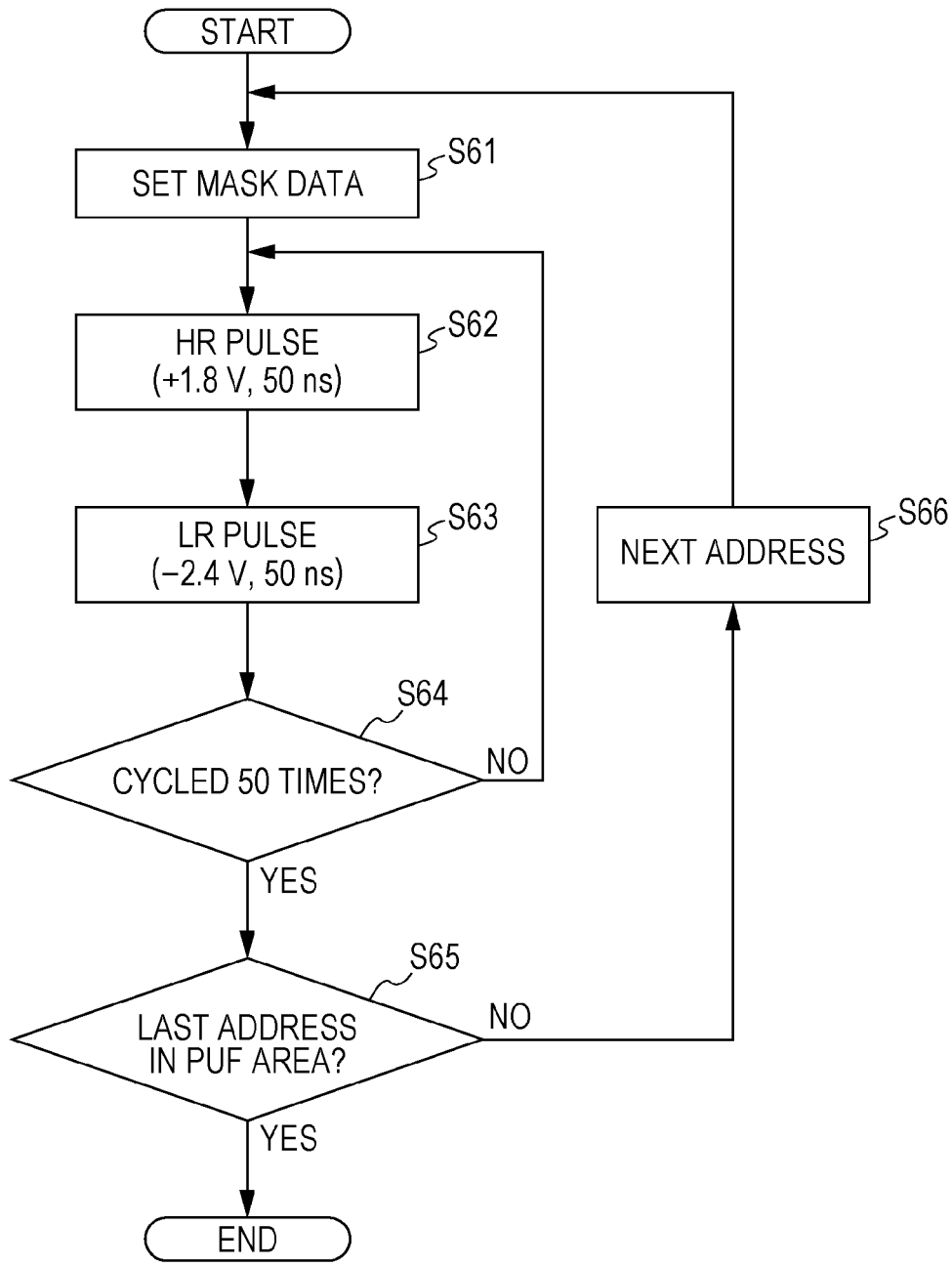
FIG. 32 is a flowchart illustrating an example of a process for applying additional pulses.

Then, in step S24 (FIG. 28), the write circuit 14 applies additional pulses only to the bits (memory cells) assigned the "1" data, by using the mask data generated in step S23. FIG. 32 is a flowchart illustrating a process for applying additional pulses. In step S61, the mask data held in the data input/output circuit 6 is set in the write circuit 14. In steps S62 and S63, alternating pulses including an HR pulse (+1.8 V, 50 ns) and an LR pulse (−2.4 V, 50 ns) are applied only to the bits assigned the "1" data. The application of the alternating pulses is repeatedly performed a predetermined number of times (for example, 50 times) (step S64). In step S65, it is determined whether the process has been completed for all the bits assigned the "1" data within the digital ID data area 8. If the process has not been completed, the next address is selected (step S66). The process is executed until additional pulses have been applied to all the bits assigned the "1" data within the digital ID data area 8 (steps S65 and S66).

Figure 33:
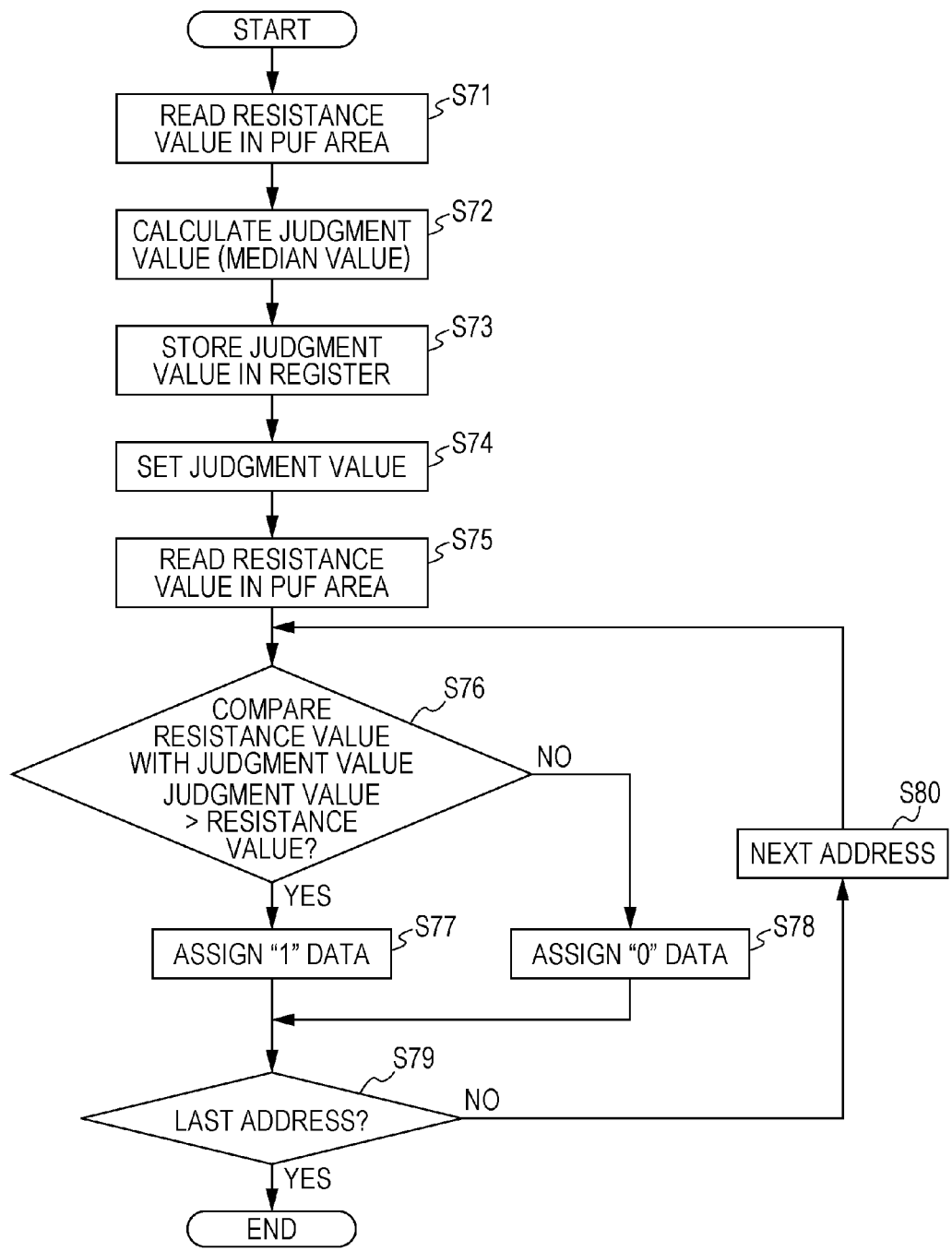
FIG. 33 is a flowchart illustrating an example of the operation of generating digital ID data.

Then, in S25 (FIG. 28), digital ID data is generated. FIG. 33 is a flowchart illustrating the operation of generating digital ID data. The processing operations of steps S71 to S73 are substantially the same as those of steps S41 to S43 in FIG. 30, respectively, and are not described in detail herein. In step S74, the read circuit 11 sets a judgment value calculated by the median value detection circuit 25. In step S75, the read circuit 11 reads a resistance count value in the digital ID data area 8. Then, as in steps S76 to S80, the comparator 135 is used to output "1" data from the output terminal A if the resistance value is smaller than the judgment value and to output "0" data from the output terminal A if the resistance value is not smaller than the judgment value. The data "0" and the data "1" are handled as digital ID data. During inspection, resistance count values are read using the scheme described above after the write process has been completed, and are registered as digital ID data. Through the registration of the digital ID data, parity data for error correction is generated. A similar operation is performed in the case of actual use and digital ID data is extracted.

Next, advantages achievable by the operation of the non-volatile memory device 10 according to this embodiment will be described with reference to FIG. 34 and FIG. 35.

Figure 34:
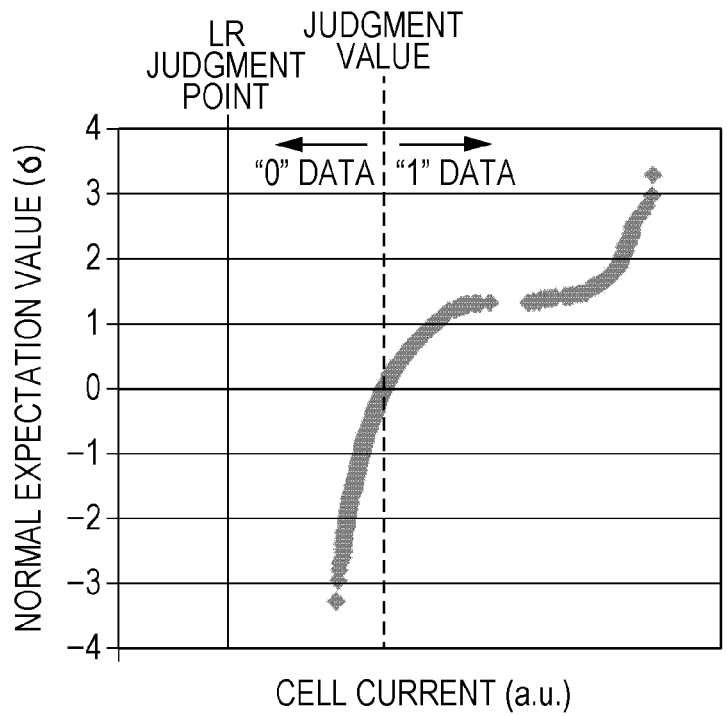
FIG. 34 is a diagram illustrating an example of the cumulative probability distribution of cell current values.
Figure 36:
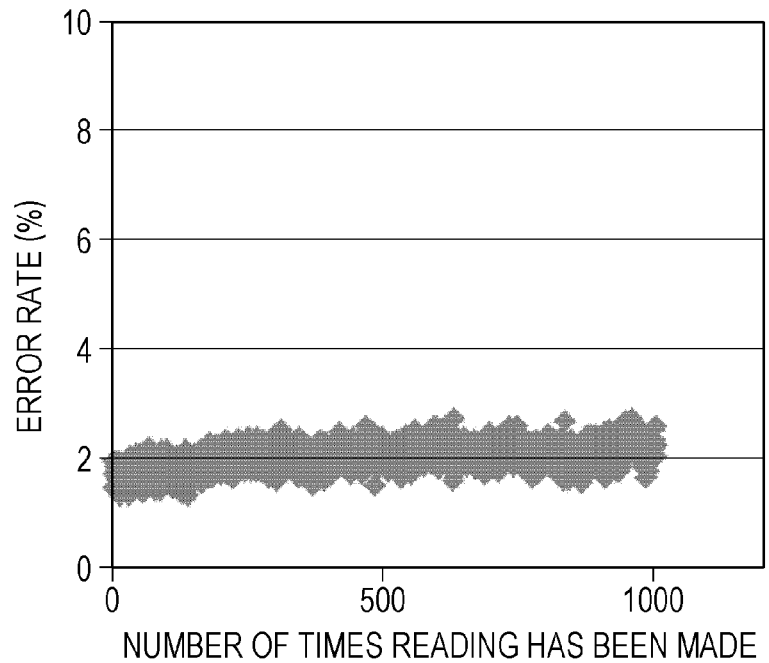
FIG. 36 is a diagram illustrating an example of the relationship between the error rate and the number of times reading has been made.

FIG. 34 is a graph depicting the cumulative probability distribution of cell current values of respective bits after the digital ID data area 8 has been subjected to the forming process in step S21 (FIG. 28). In order to generate high-uniqueness data as digital ID data, it is important that the median value of the distribution be set as a judgment value and that the differences between the number of pieces of data 0 and the number of pieces of data 1 be divided as evenly as possible. As in FIG. 34, if the median value is set as a judgment value, a large number of bits having cell current values close to each other are present around the median value. In this manner, if bits are densely distributed around the judgment value, a large number of pieces of data in which the replacement between 0 and 1 occurs due to the fluctuation of the resistance values of the resistance variable elements are present when digital ID data is read. As a result, the error rate for each read of digital ID data increases. FIG. 36 illustrates the relationship between the error rate with which digital ID data was continuously read when the cell current distribution illustrated in FIG. 34 was obtained and the number of times digital ID data was read. As described previously, due to the effect of fluctuation, an error rate of approximately 2% is observed.

Figure 35:
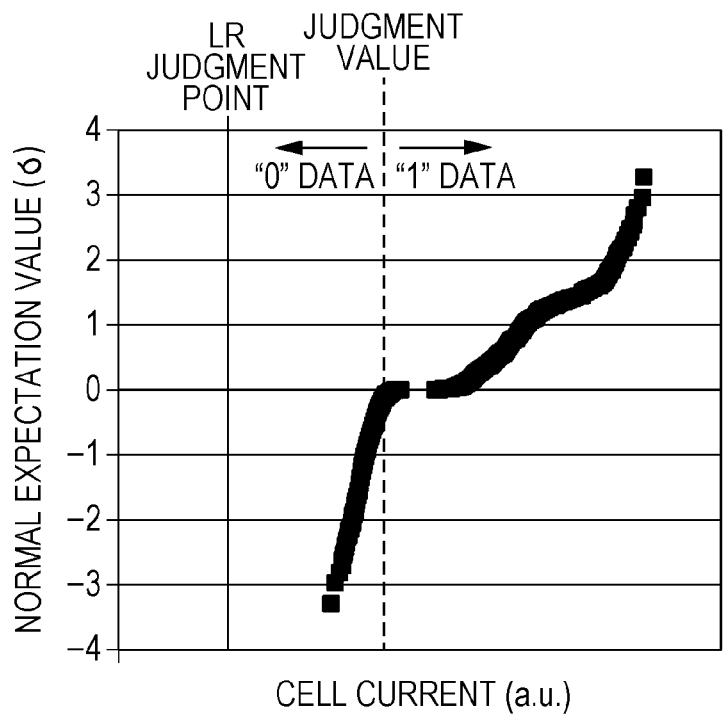
FIG. 35 is a diagram illustrating an example of the cumulative probability distribution of cell current values.
Figure 37:
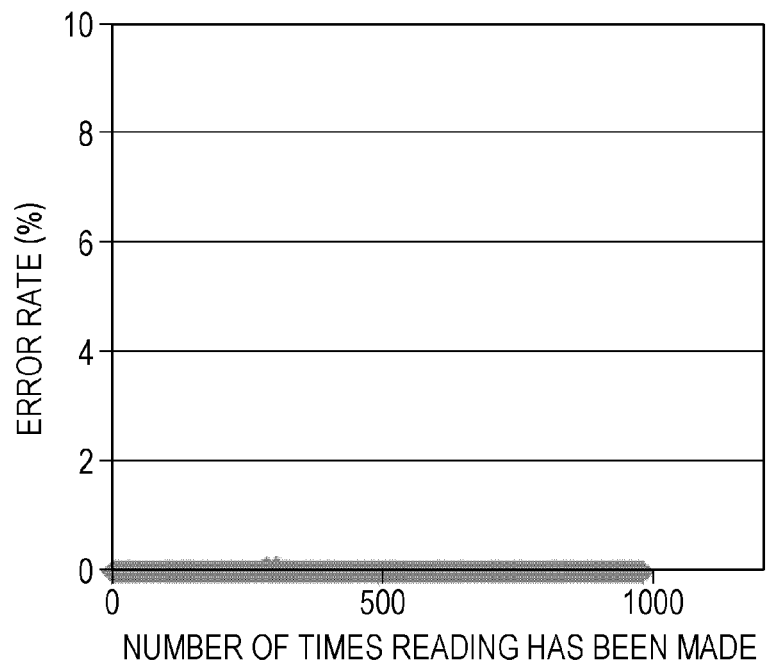
FIG. 37 is a diagram illustrating an example of the relationship between the error rate and the number of times reading has been made.

FIG. 35 illustrates a graph depicting the cumulative probability distribution of cell current values after the application of additional pulses in step S24 (FIG. 28). As illustrated in FIG. 35, the application of additional pulses only to the bits with the "1" data causes the bits with the "1" data to carry slightly higher current, resulting in the appearance of a subtle window around the median value. In the illustrated distribution, even if data is generated using the judgment value (median value), a small number of bits are present around the judgment value. This results in data replacement due to the fluctuation of a resistance value being less likely to occur. As a result, the error rate can be suppressed. FIG. 37 illustrates the relationship between the error rate with which digital ID data was continuously read when the cell current distribution illustrated in FIG. 35 was obtained and the number of times digital ID data was read. As described previously, the effect of data replacement due to the fluctuation in resistance is mitigated, and an improvement of the error rate to 0 to 0.1% is observed.

Figure 38A:
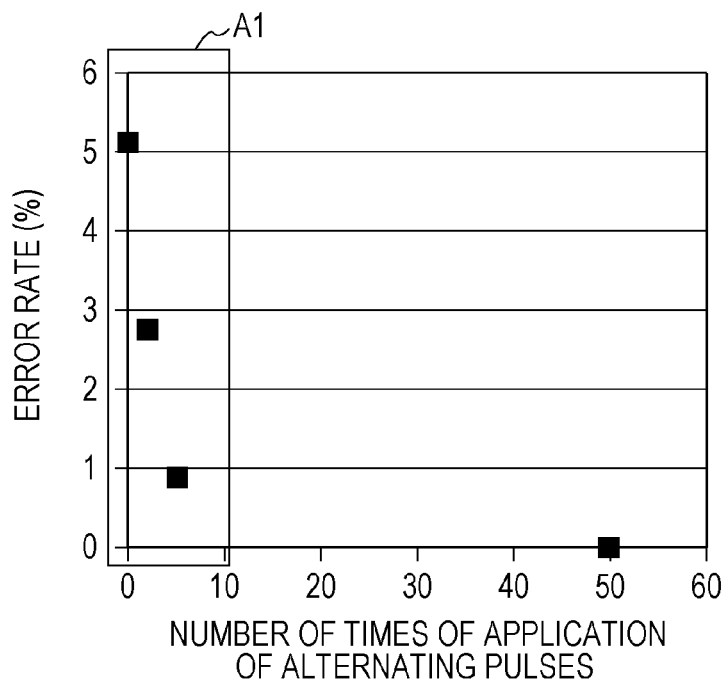
FIG. 38A is a diagram illustrating an example of the relationship between the number of times of application of alternating pulses and the error rate after the lapse of a certain period of time.
Figure 38B:
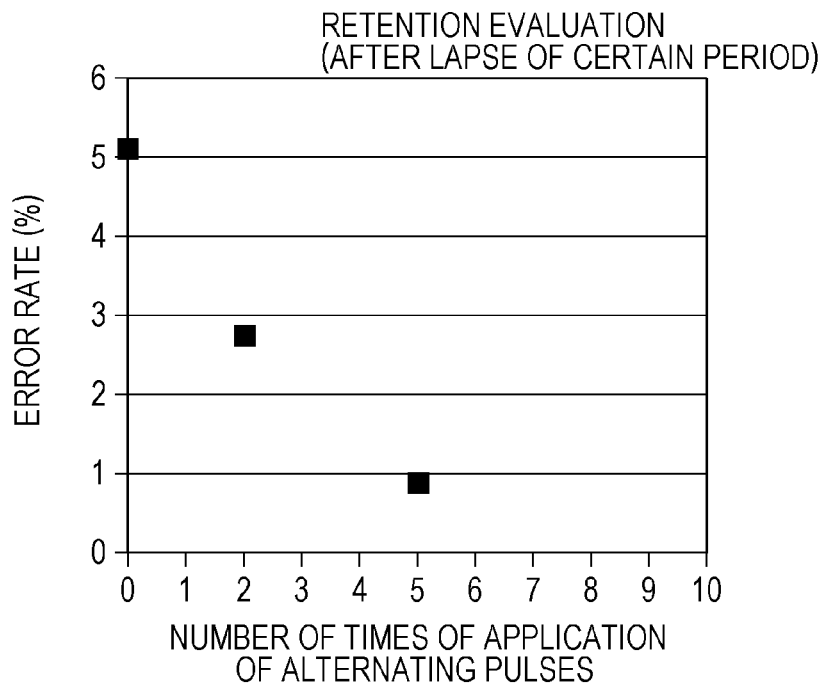
FIG. 38B is a diagram illustrating an enlarged view of an area A1 illustrated in FIG. 38A and illustrating an example of the relationship between the number of times of application of alternating pulses and the error rate after the lapse of the certain period of time.

The relationship illustrated in FIG. 37 is obtained as a result of, as illustrated in step S64 in FIG. 32, the application of alternating pulses being repeatedly performed 50 times. The number of times alternating pulses are applied is an important parameter to control the error rate. FIG. 38A is a graph illustrating the relationship between the number of times of application of alternating pulses and the error rate after the lapse of a certain period of time. In FIG. 38A, the horizontal axis represents the number of times of application of alternating pulses, and the vertical axis represents the error rate, FIG. 38B is an enlarged view of an area A1 in the graph illustrated in FIG. 38A. As illustrated in FIGS. 38A and 38B, it is found that as the number of times of application of alternating pulses increases, the error rate decreases. That is, by adjusting the number of times of application of alternating pulses, it is possible to generate digital ID data with a desired error rate within a predetermined acceptable range. For example, the control circuit 15 causes the write circuit 14 to perform a write operation in which at least one of the following factors is modified: the number of times an additional write operation in step S24 (FIG. 28) is repeatedly performed, voltage, and pulse width. Accordingly, the error rate of digital ID data can be adjusted as desired.

In addition, the memory cells 21 in the digital ID data area 8 may be divided into a plurality of groups, and the conditions of the additional write operation may be made to differ from group to group so that the plurality of groups have different error rates. Accordingly, the digital ID data area 8 can have a plurality of sub-areas having different error rates.

As described above, the configuration of the present disclosure may be able to satisfy the following features of PUF technology.

Feature (1): In a non-volatile resistive memory device according to an embodiment the present disclosure, variations in the resistance value of a memory cell whose resistance value is within the same resistance value range are not able to be artificially written with a willful pattern of data. Accordingly, specific digital ID data (entity identification information) can be obtained from such an unduplicatable physical phenomenon.

Feature (2): In a non-volatile resistive memory device according to an embodiment of the present disclosure, resistance value variations used for digital ID data (entity identification information) are read by sense amplifiers.

Transistors constituting the sense amplifiers have random variations specific to fine process technology, and pieces of resistance value information on memory cells which are read by the respective sense amplifiers in parallel have different absolute values. Thus, even if a resistance value is physically read, the read resistance value is different from the resistance value indicated by resistance value information obtained by using a sense amplifier and correct digital ID data is not physically predictable. That is, the physical phenomenon of resistance value variations can be obtained only by dynamic circuit control of internal sense amplifiers.

Feature (3): A resistive memory cell serving as a memory element has fluctuations in resistance value based on a percolation model. Obtained ID data contains an error, and the true ID data can be obtained only by using an error correction circuit.

In addition, digital ID data based on a scheme based on PUF technology according to an embodiment the present disclosure has the following desired performance advantages.

Performance (1): In the configuration of the present disclosure, the phenomenon related to data errors in Feature (3) noted above has high robustness to machine learning attacks since the cumulative error rate increases to 14% or more in accordance with the number of times the digital ID data is read although the error rate per read is as low as 2 to 3%.

Performance (2): Since the distribution of variations in resistance value varies in accordance with a standard deviation of normal distribution, digital ID data obtained from the distribution of variations exhibits good randomness.

Performance (3): A majority of the circuits of a non-volatile memory device according to an embodiment of the present disclosure mountable on an IC and SoC is shared with typical circuits, preventing the increase in the number of circuits from being large. In addition, circuit overhead is low and the read current is low.

Performance (4): A non-volatile memory device according to an embodiment of the present disclosure is mountable on an IC and SoC, and provides a large number of parallel reads. In a working example, data is obtained using a 32-bit parallel-control memory array, in which a single read operation takes approximately 500 ns and the generation speed is as high as 64 Mbps. Since the number of parallel eads is high, each bit state is difficult to identify in electromagnetic analysis of side-channel attack and the like, and the resistance to hacking is high.

Performance (5): Compared to SRAM-PUF and Glitch PUF with a data error rate of 15% in which no dedicated memory cell is included, the configuration according to an embodiment of the present disclosure provides an error rate as low as 2 to 3%. Accordingly, the circuit scale of the error correction circuit can be reduced.

Performance (6): Unlike SRAM-PUF in which no dedicated memory cell is included, the generation timing is not limited only to the power-on time, and, as described previously, although it depends on the number of parallel processing tasks, generation with a speed as high as 64 Mbps is feasible even with the typical number of parallel processing tasks.

As described above, unlike previous schemes based on PUF technology having their pros and cons, a scheme based on PUF technology according to an embodiment of the present disclosure enables digital ID data having all the desired features and satisfying all the performance requirements to be obtained. The use of digital ID data according to an embodiment of the present disclosure makes feasible secure storage of a private or secret key and improved security for authentication, described above, and ensures that users are protected against threats such as unauthorized duplication of an IC.

Example Application to IC Card

An example application provides methods for encryption of a private or secret key using digital ID data generated according to an embodiment of the present disclosure, concealment of data using writing based on forming of the encrypted private or secret key, and authentication.

FIG. 39 is a block diagram illustrating an example configuration of a communication system 500 according to an example application of the present disclosure. In FIG. 39, the communication system 500 includes a reader/writer and data server (hereinafter referred to as the reader/writer for short) 501 and an IC card 502. The reader/writer 501 and the IC card 502 wirelessly communicate with each other via, for example, their respective antennas or the like.

Reader/Writer

The reader/writer 501 includes a RAM 503, an input/output interface (I/F) unit 504, a central processing unit (CPU) 505, a cryptographic processing circuit 506, and a non-volatile memory device 515.

The input/output I/F unit 504 of the reader/writer 501 is an interface for performing wireless communication with an external device to transmit and receive data, and is implementable as, for example, a wireless communication circuit. The input/output I/F unit 504 has a radio frequency (RF) antenna. The input/output IF unit 504 radiates certain electromagnetic waves, and detects whether or not the IC card 502 has been placed close to the reader/writer 501 by utilizing a change in load. Further, the input/output I/F unit 504 modulates carrier waves having a predetermined frequency, which are supplied from, for example, an oscillation circuit (not illustrated), on the basis of data supplied from the CPU 505. The input/output I/F unit 504 outputs the modulated waves, which have been generated, from the antenna (not illustrated) as electromagnetic waves, thereby transmitting various kinds of data to the IC card 502 placed close to the reader/writer 501. Further, the input/output I/F unit 504 receives modulated waves transmitted from the IC card 502 via the antenna. The input/output 1/F unit 504 then demodulates the received modulated waves to obtain data, and supplies the data to the CPU 505. The non-volatile memory device 515 corresponds to the non-volatile memory device 10 described above. The non-volatile memory device 515 includes a private or secret key storage unit 508, a data storage unit 509, a ROM unit 510, a specific ID storage unit 511, and an all IC-card-specific ID storage unit 540.

The ROM unit 510 corresponds to a predetermined address area within a memory cell group for storing the second type data, which is included in the non-volatile memory device 515 according to the example application of the present disclosure. The CPU 505 of the reader/writer 501 loads a program stored in the ROM unit 510 onto the RAM 503, and executes various processes by using the program. The RAM 503 temporarily stores data and the like necessary for the CPU 505 to execute various processes. The RAM 503 may be a volatile storage device such as a static random access memory (SRAM) or a dynamic random access memory (DRAM). Alternatively, the RAM 503 may be constituted by part of a memory cell group for storing the second type data in a non-volatile memory device according to an embodiment of the present disclosure.

The specific ID storage unit 511 is a memory cell group used to generate digital ID data disclosed herein, and ID data specific to the reader/writer 501 can be generated using a scheme according to an embodiment of the present disclosure. The all IC-card-specific ID storage unit 540 is constituted by a memory cell group storing the first type data or the second type data, and stores all the pieces of digital ID data which are different for a plurality of IC cards 502 to be used. The pieces of digital ID data for all the IC cards 502 may be stored as data encrypted using digital ID data specific to the reader/writer 501 as an encryption key.

The CPU 505 controls the cryptographic processing circuit 506 to encrypt and decrypt data in accordance with a predetermined cryptographic algorithm. Examples of the cryptographic algorithm include Triple Data Encryption Standard (3DES) and Advanced Encryption Standard (AES). Such cryptographic algorithms are base on a common key cryptosystem in which encryption and decryption are performed using a single private or secret key. Alternatively, a public key cryptosystem, such as the Rivest-Shamir-Adleman (RSA) cryptosystem, in which two different keys, namely, a private or secret key and a public key, are used so that cryptographic communication is performed using different keys for encryption and decryption may be used. In this case, the private or secret key storage unit 508 described below may store both a public key of the communication partner and a private or secret key of the communicating party. Such important key data may be encrypted using the digital ID data disclosed herein generated from the specific ID storage unit 511 as an encryption key, and stored as an encrypted private or secret key or an encrypted public key. As described previously, digital ID data generated using PUF technology is specific to a reader/writer and is difficult to duplicate and hack. Thus, even if an encrypted private or secret key or an encrypted public key which has been encrypted using the digital ID data is copied, the digital ID data is uncopiable IC-specific data and is thus safe.

In a case where data is to be encrypted or decrypted in the reader/writer 501, for example, the CPU 505 decrypts the encrypted private or secret key stored in the private or secret key storage unit 508, which is a predetermined address area in the non-volatile memory device 515, by using the digital ID data disclosed herein as a key to obtain the original private or secret key, and supplies the private or secret key to the cryptographic processing circuit 506 together with the data to be encrypted or decrypted. The cryptographic processing circuit 506 encrypts or decrypts data by using the supplied private or secret key.

The data storage unit 509 stores data necessary for the CPU 505 to execute a program. The data storage unit 509 may store predetermined data which has been encrypted using the digital ID data disclosed herein as a key. The predetermined data may be stored using a memory cell in the initial state or may be stored using a memory cell in the variable state.

The private or secret key storage unit 508 may be implemented using the memory cell group for storing the first type data described above or may be implemented using a memory cell group for storing the second type data. In a case where the memory cell group for storing the second type data is used, there is no large difference from when any other typical non-volatile memory is used. In a case where the memory cell group for storing the first type data is used, data is stored by utilizing a difference between the initial state and the variable state of a resistance variable dement and thus it is difficult to read data using a normal read threshold command. Accordingly, concealment of key information can be achieved. As described in the first embodiment, in order to read digital data "0" and digital data "1" from a memory cell in the variable state, the judgement of data "0" and data "1" is performed by using the second threshold. If the memory cell group for storing the first type data is read using the second threshold, almost all the memory cells are decrypted to "0", resulting in authentic data not being read. The private or secret key storage unit 508 may store a private or secret key as the encrypted private or secret key described above.

In addition, the memory cell group for storing the first type data and the memory cell group for storing the second type data may be placed at desired addresses within a memory cell array. Thus, even though analysis is to be performed to physically read a resistance value directly by using a probe, it is difficult to identify which of the memory cell group for storing the first type data and the memory cell group for storing the second type data the corresponding memory cell belongs to. It is also difficult to distinguish data encrypted using digital ID data from unencrypted data, making the analysis further complicated.

As described above, the communication system 500 illustrated in FIG. 39 can be regarded as having high tamper resistance to the leakage of a private or secret key. In addition, the memory cell group for storing the first type data and the digital ID data disclosed herein also have excellent data reliability in a high-temperature environment, and are optimum for the storage and encryption of a private or secret key for which no data error can be tolerated.

The private or secret key stored in the private or secret key storage unit 508 may be the same as the private or secret key stored in a private or secret key storage unit 526 of the IC card 502. A private or secret key may be stored in advance only in the reader/writer 501 which is associated with the IC card 502 and which is allowed to read a card ID serving as digital ID data specific to the IC card 502.

The specific digital ID data is stored in a specific ID storage unit 525 as data containing a data error in accordance with a scheme based on PUF technology described in an embodiment of the present disclosure.

As described previously, the specific digital ID data may be a random number specific to each IC card. For this reason, the specific digital ID data is available for various types of encryption specific to each IC card.

IC Card

The IC card 502 includes an input/output interface (I/F) unit 520, a CPU 521, a cryptographic processing circuit 522, a RAM 523, and a non-volatile memory device 530.

The input/output I/F unit 520 of the IC card 502 is an interface for performing wireless communication with an external device to transmit and receive data, and is implementable as, for example, a wireless communication circuit. The input/output I/F unit 520 is typically implemented using an LC circuit constituted by, for example, a coil-shaped antenna and a capacitor. As the antenna of the IC card 502 is placed dose to the reader/writer 501, the LC circuit resonates with electromagnetic waves having a predetermined frequency which are radiated from the reader/writer 501. The input/output I/F unit 520 rectifies and stabilizes a current excited by the antenna through an alternating-current magnetic field, and supplies the resulting current to the individual components of the IC card 502 as a direct-current power supply.

The input/output I/F unit 520 detects and demodulates the modulated waves received via the antenna to obtain data. The input/output I/F unit 520 decodes the obtained data into digital data, and supplies the digital data to the CPU 521. Further, the decoded digital data is subjected to clock reproduction technology called phase-locked loop (PLL) so that the frequency and phase of the digital data are locked (a PLL device includes a voltage-variable oscillator which detects and integrates a phase error in accordance with the input digital data to generate a voltage for control, and the generated voltage is input as a control voltage of the oscillator to obtain a clock signal having a frequency matched to the sampling frequency of the input digital data and also having a fixed phase) to generate a clock signal for reception (not illustrated). The generated clock signal is supplied as a clock signal for latching digital data.

Further, when transmitting certain information to the reader/writer 501, the input/output I/F unit 520 changes a load on the antenna in accordance with the encoded data input from the CPU 521 to perform modulation. Accordingly, the input/output I/F unit 520 transmits the information to the reader/writer 501 via the antenna.

The IC card 502 includes the non-volatile memory device 530. The non-volatile memory device 530 corresponds to the non-volatile memory device 515 described above according to this embodiment. In the following description, common elements are given the same numerals and names and are referred to as necessary. In this example application, the non-volatile memory device 530 also functions as a non-volatile storage device.

The non-volatile memory device 530 includes a specific ID storage unit 525 that stores digital ID data specific to each IC card, a private or secret key storage unit 526 that stores a private or secret key data, a data storage unit 527 that stores data necessary for the CPU 521 to execute a program, and a ROM unit 528 that stores a program executed by the CPU 521. All the components described above are included in a single memory cell array (the memory cell array 90 illustrated in FIG. 1 or the memory cell array 20 illustrated in FIG. 18 and FIG. 25). The CPU 521 loads a program stored in the ROM unit 528 onto the RAM 523, and executes the program to perform various processes. The program data stored in the ROM unit 528 may be encrypted using, as a key, the digital ID data disclosed herein generated based on a memory cell group in the specific ID storage unit 525, and may be stored.

The CPU 521 controls the cryptographic processing circuit 522 to encrypt and decrypt data in accordance with a predetermined cryptographic algorithm. As described above, examples of the typical cryptosystem include a common key cryptosystem in which encryption and decryption are performed on the transmitter side and the receiver side by using the same private or secret key, and a public key cryptosystem in which encryption and decryption are performed on the transmitter side and the receiver side by using different keys, that is, a public key and a private or secret key. In the following description, a common key cryptosystem is adopted.

In a public key cryptosystem, in a case where the IC card 502 is to transmit ciphertext data encrypted in the IC card 502 to the reader/writer 501, the IC card 502 encrypts the ciphertext by using a public key obtained in advance from the reader/writer 501. Conversely, ciphertext data send from the reader/writer 501 is decrypted using a private or secret key stored in advance in the IC card 502. Public key cryptosystems and common key cryptosystems are the same, except for the feature described above. In a public key cryptosystem, a public key and a private or secret key are only one pair of keys for each other. Both parties decrypt encrypted data to mutually authenticate each other at the same time.

As in the description of the reader/writer 501, also in the IC card 502, key data to be stored in the private or secret key storage unit 526 is stored as an encrypted private or secret key or an encrypted public key encrypted using the digital ID data stored in the specific ID storage unit 525 in accordance with a scheme based on PUF technology according to an embodiment of the present disclosure. The key data may be stored in the memory cell group for storing the first type data. When the IC card 502 is to encrypt or decrypt data, the CPU 521 reads the encrypted private or secret key data stored in the private or secret key storage unit 526, which is part of the memory cell group for storing the first type data in the non-volatile memory device 530, by using a special read command for performing reading by using the first threshold illustrated in FIG. 3. The read encrypted private or secret key data is decrypted using the digital ID data disclosed herein into the original private or secret key data. The CPU 521 supplies the private or secret key data to the cryptographic processing circuit 522 together with the data to be encrypted or decrypted. The cryptographic processing circuit 522 encrypts or decrypts the supplied data by using the supplied private or secret key.

The data storage unit 527 stores data necessary for the CPU 521 to execute a program. In the data storage unit 527, predetermined data may be stored in plaintext or in encrypted form encrypted using a private or secret key or using digital ID data as a key. The predetermined data may be stored using a memory cell in the initial state or may be stored using a memory cell in the variable state.

A first step of communication between the IC card 502 and the reader/writer 501 in the communication system 500 having the encryption and decryption functions described above will be described hereinafter.

In the IC card 502, digital ID data specific to each IC card is stored in the specific ID storage unit 525 as data containing a data error in accordance with a scheme based on PUF technology described in an embodiment of the present disclosure.

The CPU 521 reads digital ID data specific to each IC card from the specific ID storage unit 525. The CPU 521 supplies the read encrypted private or secret key data and the digital ID data to the cryptographic processing circuit 522 as keys. The cryptographic processing circuit 522 decrypts the encrypted private or secret key into the original private or secret key by using the supplied digital ID data as a key. Then, the cryptographic processing circuit 522 encrypts the digital ID data by using the original private or secret key. The encrypted digital ID data is supplied to the CPU 505 of the reader/writer 501 via the input/output I/F units 520 and 504.

The CPU 505 reads private or secret key data from the private or secret key storage unit 508 of the non-volatile memory device 515 in the reader/writer 501. The CPU 505 supplies the private or secret key data and the received encrypted digital ID data to the cryptographic processing circuit 506. The cryptographic processing circuit 506 decrypts the encrypted digital ID data by using the supplied private or secret key data. The decrypted digital ID data is matched against each piece of ID data stored in the specific ID storage unit 511. If the decrypted ID data matches any of the pieces of ID data stored in the specific ID storage unit 511, the IC card 502 in communication is authenticated as an IC card 502 authorized to perform data communication. Then, the subsequent data communication is continuously performed.

There is provided another modification of mutual authentication between the reader/writer 501 and the IC card 502.

The all IC-card-specific ID storage unit 540 of the reader/writer 501 holds a plurality of pieces of digital ID data for each IC card. The plurality of pieces of digital ID data are obtained by changing the offset value of the median value described above. The reader/writer 501 encrypts the offset value and address information on the desired digital ID data to be received, and transmits the encrypted data to the IC card 502 as challenge data. The IC card 502 decrypts the received challenge data to obtain an offset value and address information. Then, the IC card 502 encrypts digital ID data corresponding to the obtained offset value and address information, and returns the encrypted digital ID data to the reader/writer 501 as response data.

The reader/writer 501 receives the response data and decrypts the response data. Then, the reader/writer 501 searches through the pieces of ID data registered in advance in the all IC-card-specific ID storage unit 540, and matches digital ID data specific to each IC card 502 against each of the pieces of ID data registered in advance in the all IC-card-specific ID storage unit 540, and confirms that a predetermined number of bits or more are matched to authenticate the IC card 502.

The digital ID data, which is response data, is sent as data containing an error as described above, and thus has high resistance to hacking. The digital ID data is a random number which differs for each IC card. If there is a sufficient Hamming distance between pieces of data, even when the digital ID data contains an error of a predetermined number of bits, to which IC card the digital ID data is related can be identified. Accordingly, repeating the transmission of challenge data and the reception of response data allows an IC card to be identified as an authorized IC card. In addition, data used for authentication is data specific to each IC card and is erroneous data. Thus, such data is difficult to analyze, and therefore authentication with high security guaranteed is feasible.

As described above, the communication system 500 enables the functions of generating specific digital ID data, storing a private or secret key, storing data, and storing program data to be implemented by a single non-volatile memory device. It may be possible to provide a mobile application like an IC card, in which no additional ID generation circuit based on PUF technology is included and the increase in circuit scale is suppressed as much as possible.

The functions of the RAM 503 may be implemented by a memory cell array included in the non-volatile memory device 515. The functions of the RAM 523 may be implemented by a memory cell array included in the non-volatile memory device 530.

Various kinds of data can be stored in, as an information storage, both the memory cell group for storing the first type data and the memory cell group for storing the second type data. Accordingly, in which area of memory cells and how information is stored can be concealed from a third party. In addition, it may be possible to provide a highly tamper-resistant application that enables digital ID data to be protected against hacking attacks which directly read data in a memory by using a physical probe.

It is not required that data (encrypted data) encrypted using digital ID data as an encryption key be stored in the IC card 502. For example, the reader/writer 501 may read encrypted data, and the data storage unit 509 of the reader/writer 501 may store the encrypted data. In addition, the reader/writer 501 may transmit the encrypted data to a server (not illustrated) located outside the reader/writer 501, and a storage device of the server may store the encrypted data. If no encrypted data is stored in the IC card 502, the following decryption procedure is available. The CPU 521 of the IC card 502 receives encrypted data stored in an external device via the input/output I/F unit 520. Further, the CPU 521 generates digital ID data specific to each IC card from the specific ID storage unit 525. Thereafter, the cryptographic processing circuit 522 decrypts the encrypted data by using the digital ID data as a decryption key.

Numerous modifications and alternative embodiments of the present disclosure will be apparent to those skilled in the art in view of the foregoing description. Accordingly, the foregoing description is to be construed as illustrative only and is presented for the purpose of teaching those skilled in the art to teach the best mode of carrying out the embodiments of the present disclosure. The details of the structure and/or function may be varied substantially without departing from the spirit of the present disclosure.

What is claimed is:

1. A non-volatile memory device comprising:
   a memory cell array including memory cells arranged in an array, each of the memory cells having a resistance value and having a property that the resistance value reversibly transitions among resistance value ranges in a non-volatile manner in a variable state in accordance with application of different electrical signals;
   a read circuit that, in operation, obtains pieces of resistance value information each relating to the resistance value of one of the memory cells;
   an arithmetic circuit that, in operation, calculates a binary reference value based on at least a part of the pieces of resistance value information; and
   a write circuit, wherein, in operation,
   the read circuit selectively assigns, based on the binary reference value, one of two values to each of the pieces of resistance value information, thereby generating pieces of digital data, and
   the write circuit performs a first write operation on a memory cell corresponding to one of the two values among the memory cells.

2. The non-volatile memory device according to claim 1, wherein
   the resistance value ranges include a first resistance value range and a second resistance value range lower than the first resistance value range,
   in an initial state, the resistance value of each of the memory cells is within an initial resistance value range different from the first resistance value range and the second resistance value range,
   each of the memory cells changes from the initial state to the variable state by application of an electrical stress to each of the memory cells,
   in the variable state, the resistance value of each of the memory cells transitions from the second resistance value range to the first resistance value range by application of a voltage pulse having a first polarity to each of the memory cells, and the resistance value of each of the memory cells transitions from the first resistance value range to the second resistance value range by application of a voltage pulse having a second polarity to each of the memory cells, and
   in the first write operation, the write circuit alternately applies a first voltage pulse having the first polarity and a second voltage pulse having the second polarity to a memory cell corresponding to one of the two values among the memory cells.

3. The non-volatile memory device according to claim 2, wherein the resistance values of one half or more of a number of memory cells corresponding to the pieces of digital data are within the second resistance value range.

4. The non-volatile memory device according to claim 1, wherein, in operation, the arithmetic circuit calculates a median value of the pieces of resistance value information, which is obtained by the read circuit, as the binary reference value.

5. The non-volatile memory device according to claim 4, wherein, in operation, the write circuit performs the first write operation on a memory cell whose resistance value is lower than the median value among the memory cells.

6. The non-volatile memory device according to claim 2, wherein, in operation,
the write circuit performs a second write operation on each of the memory cells that are in the initial state, the second write operation including alternately applying a third voltage pulse having the first polarity and a fourth voltage pulse having the second polarity,
the read circuit reads resistance value information on each of the memory cells on which the second write operation has been performed, and determines, based on the resistance value information, whether or not the resistance value of each of the memory cells on which the second write operation has been performed is within the second resistance value range, and
the write circuit and the read circuit repeatedly perform the second write operation and the reading of the resistance value information until it is determined that the resistance value of each of the memory cells on which the second write operation has been performed is within the second resistance value range.

7. The non-volatile memory device according to claim 1, wherein the read circuit includes a comparison circuit that, in operation, compares the resistance value indicated by each of the pieces of resistance value information obtained by the read circuit with the binary reference value and that outputs binary data of 0 or 1 in accordance with a result of comparison.

8. The non-volatile memory device according to claim 1, further comprising a generation circuit that, in operation, generates mask data used to distinguish a memory cell on which the first write operation is performed among the memory cells from a memory cell on which the first write operation is not performed among the memory cells, in accordance with the pieces of digital data generated by the read circuit.

9. The non-volatile memory device according to claim 8, wherein, in operation, the write circuit performs, based on the mask data, the first write operation on a memory cell on which the first write operation is performed.

10. The non-volatile memory device according to claim 1, further comprising a control circuit, wherein
the first write operation is an operation for applying a voltage pulse to a memory cell corresponding to one of the two values among the memory cells, and
the control circuit, in operation, modifies at least one selected from the group consisting of the number of times the voltage pulse is applied, a voltage of the voltage pulse, and a pulse width of the voltage pulse in the first write operation.

11. The non-volatile memory device according to claim 10, wherein
the memory cells is divided into a first group and a second group, and
the at least one selected from the group consisting of the number of times the voltage pulse is applied, the voltage of the voltage pulse, and the pulse width of the voltage pulse in the first write operation is different between a memory cell belonging to the first group and a memory cell belonging to the second group among the memory cells.

12. The non-volatile memory device according to claim 1, further comprising a control circuit, wherein, in operation,
the control circuit accepts an input of a control signal, and
the read circuit obtains the pieces of resistance value information in accordance with the control signal input to the control circuit.

13. An integrated circuit card comprising:
a non-volatile memory device including
a memory cell array including memory cells arranged in an array, each of the memory cells having a resistance value and having a property that the resistance value reversibly transitions among resistance value ranges in a non-volatile manner in a variable state in accordance with application of different electrical signals,
a read circuit that, in operation, obtains pieces of resistance value information each relating to the resistance value of one of the memory cells,
an arithmetic circuit that, in operation, calculates a binary reference value based on at least a part of the pieces of resistance value information, and
a write circuit, wherein, in operation,
the read circuit selectively assigns, based on the binary reference value, one of two values to each of the pieces of resistance value information, thereby generating pieces of digital data, and
the write circuit performs a first write operation on a memory cell corresponding to one of the two values among the memory cells; and
an input/output interface unit to which a signal that controls an operation of the non-volatile memory device is input and from which information related to the pieces of digital data is output.

* * * * *